United States Patent [19]

Firooz et al.

[11] Patent Number: 5,032,789
[45] Date of Patent: Jul. 16, 1991

[54] MODULAR/CONCURRENT BOARD TESTER

[75] Inventors: Kamran Firooz; Vance Harwood; Sharon LaTourrette, all of Loveland, Colo.; Jay Stepleton, Vitthoorn, Netherlands; Matt Snook, Loveland, Colo.

[73] Assignee: Hewlett-Packard Company, Palo Alto, Calif.

[21] Appl. No.: 367,839

[22] Filed: Jun. 19, 1989

[51] Int. Cl.⁵ .......................... G01R 1/00; G01R 1/02
[52] U.S. Cl. .............................. 324/158 R; 324/73.1; 324/158 F; 371/22.1
[58] Field of Search .............. 324/158 R, 158 F, 73.1; 371/22.1, 15.1

[56] References Cited

U.S. PATENT DOCUMENTS

| | | | |
|---|---|---|---|
| 4,012,625 | 3/1977 | Bowen et al. | 235/153 |
| 4,168,796 | 9/1979 | Fulks et al. | 235/302 |
| 4,194,113 | 3/1980 | Fulks et al. | 371/20 |
| 4,342,957 | 8/1982 | Russell | 324/158 F |
| 4,500,993 | 2/1985 | Jacobson | 371/22.6 |
| 4,502,116 | 2/1985 | Fowler et al. | 364/200 |
| 4,517,512 | 5/1985 | Petrich et al. | 371/22.1 |
| 4,584,683 | 4/1986 | Shimizu | 371/27 |
| 4,588,945 | 5/1986 | Groves et al. | 324/158 |
| 4,605,894 | 8/1986 | Cox et al. | 371/24 |
| 4,635,256 | 1/1987 | Herlein | 371/27 |
| 4,637,020 | 1/1987 | Schinabeck | 371/22.1 |
| 4,799,009 | 1/1989 | Taka et al. | 324/72.5 |
| 4,817,093 | 3/1989 | Jacobs et al. | 371/22.3 |

OTHER PUBLICATIONS

Vol. 35, No. 10, *Hewlitt-Packard Journal*, (1984).
L. Joselyn, *Product Highlight*, vol. 9, No. 6, Test 26, (1987).
J. Gallant, *Parallel Processing Ushers in a Revolution in Computing*, EDN, Sep. 1, 1988, at 86–100.

Primary Examiner—Kenneth Wieder
Assistant Examiner—William J. Burns

[57] ABSTRACT

The present invention provides a circuit board tester for performing functional and in-circuit tests on one or more circuit boards. The circuit board tester includes a testhead for interfacing with one or more circuit boards and supplying the resources for the testing thereof. The testhead includes a plurality of modules with each module having a defined amount of resources and a processor for use in executing a test plan to test the circuit board. The circuit board tester further includes a high-speed link for coordinating the execution of a test plan by two or more modules when the resources of one module are insufficient to test a particular circuit board. Each module in the testhead can be selectively connected or disconnected from the high-speed link. Consequently, two or more modules can be connected to the high-speed link to test a first circuit board while another module, that is disconnected from the high-speed link, can concurrently test a second circuit board. The circuit board tester also, preferably, includes a controller that determines whether the resources of more than one module are required to test a particular circuit board and generates a test plan accordingly.

76 Claims, 25 Drawing Sheets

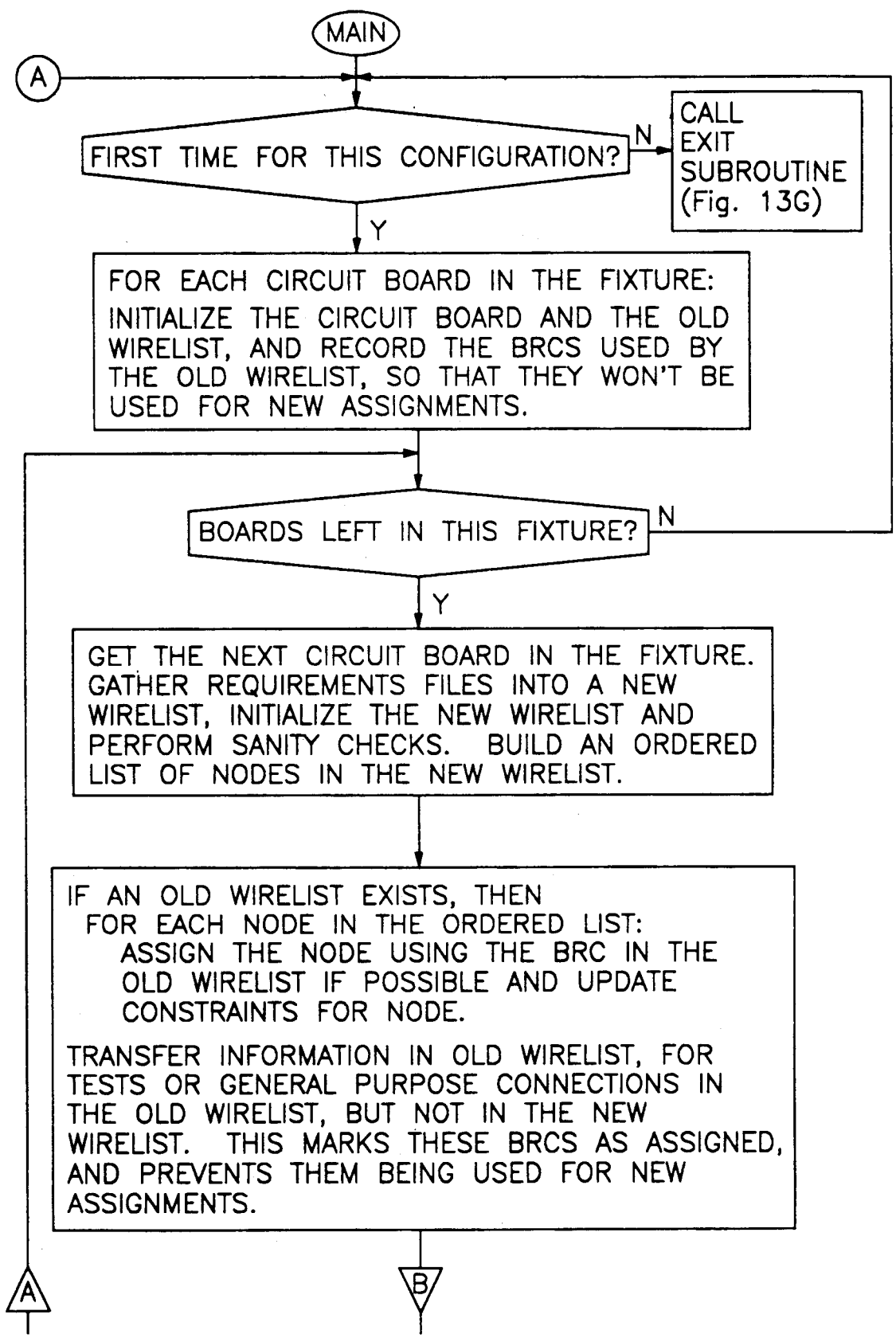
Fig. 13A(1)

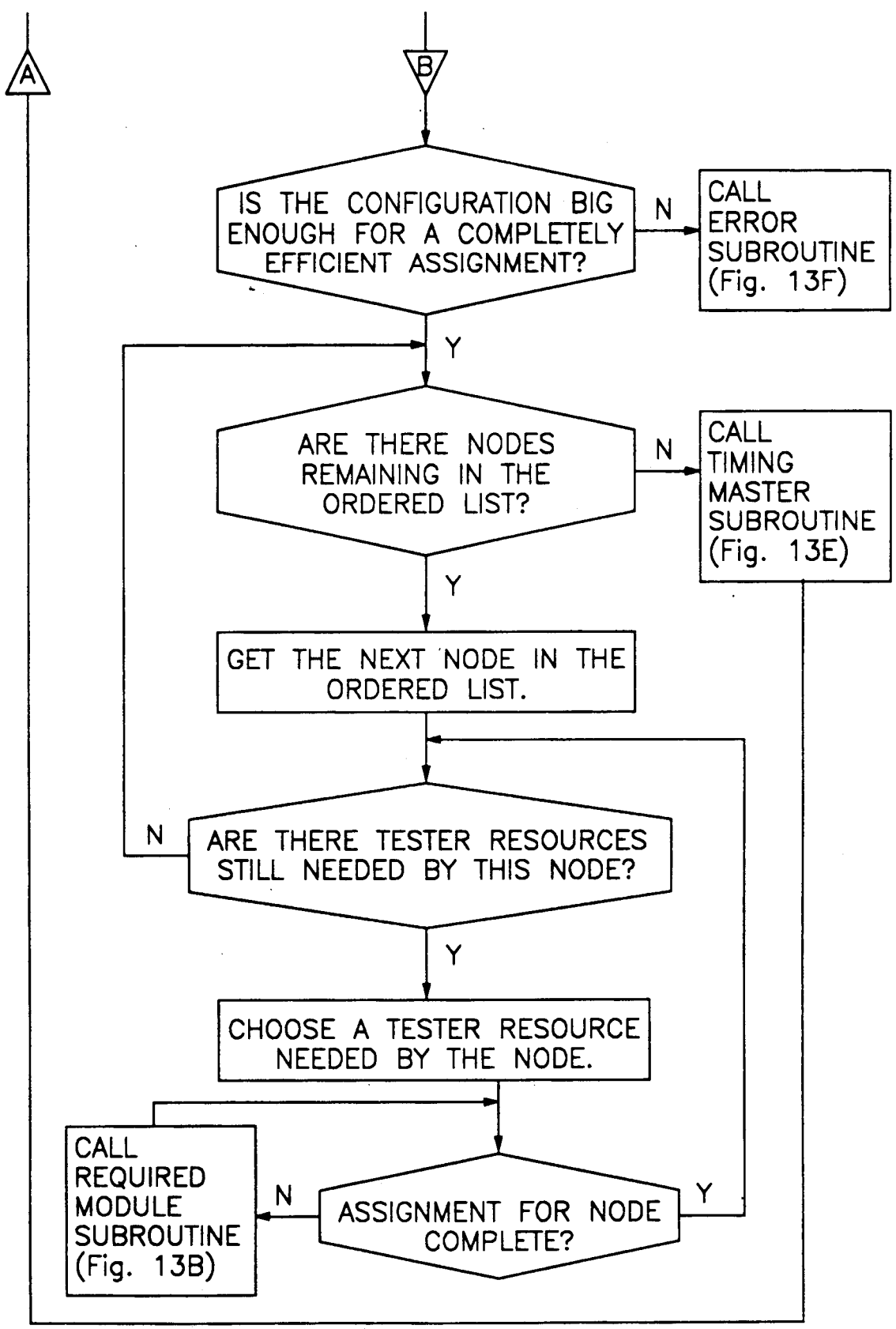
Fig. 13A(2)

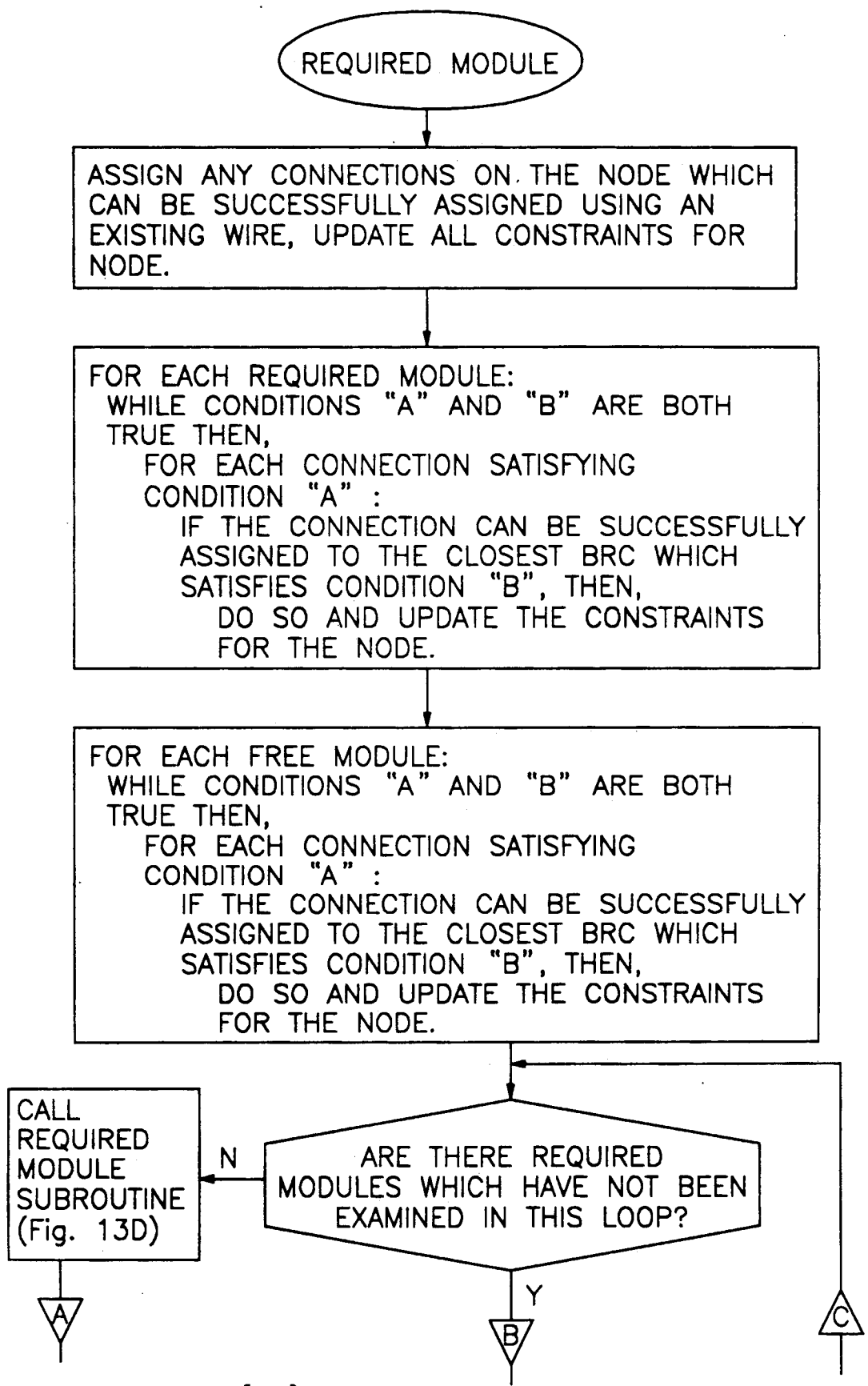
Fig. 13B(1)

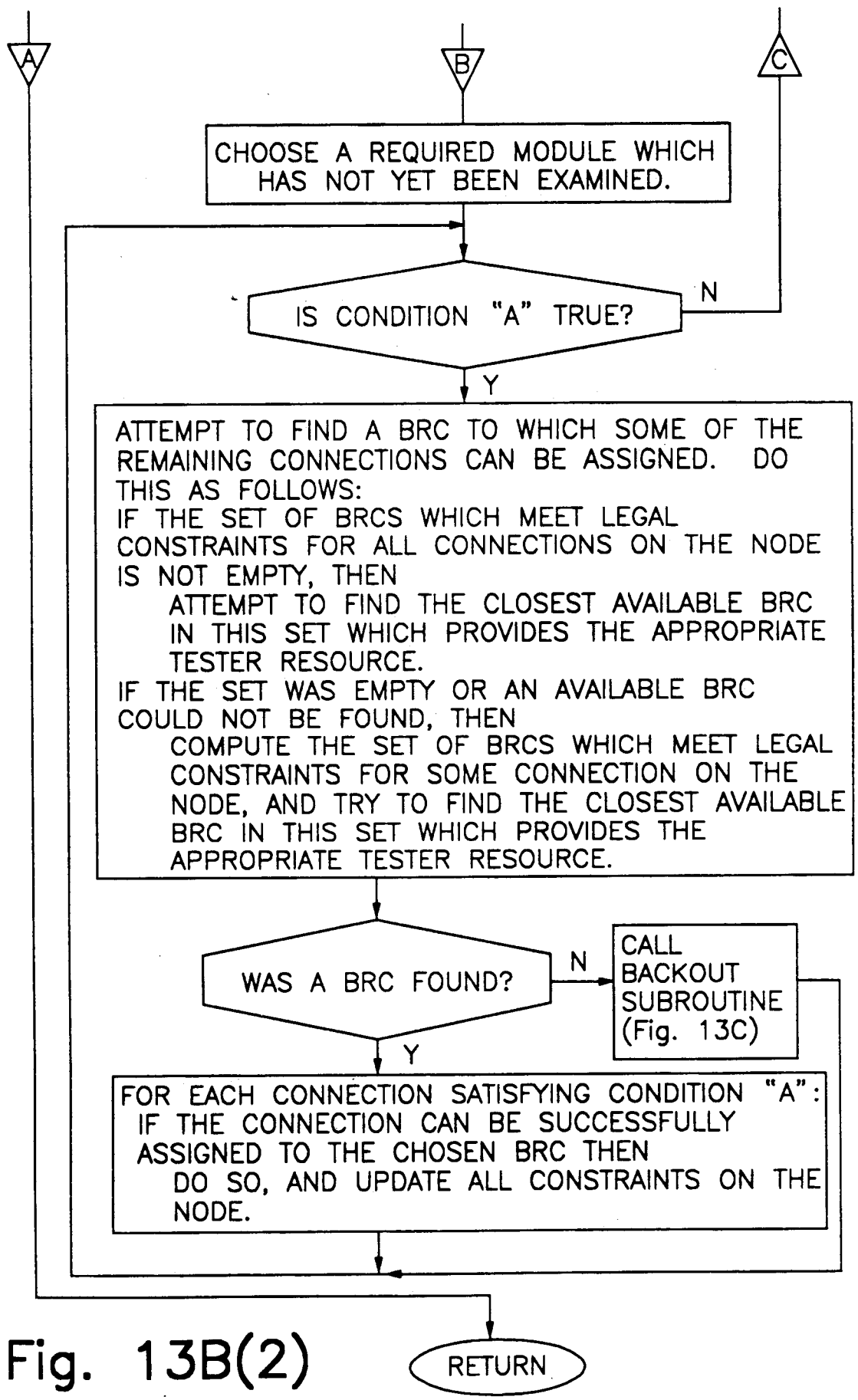
Fig. 13B(2)

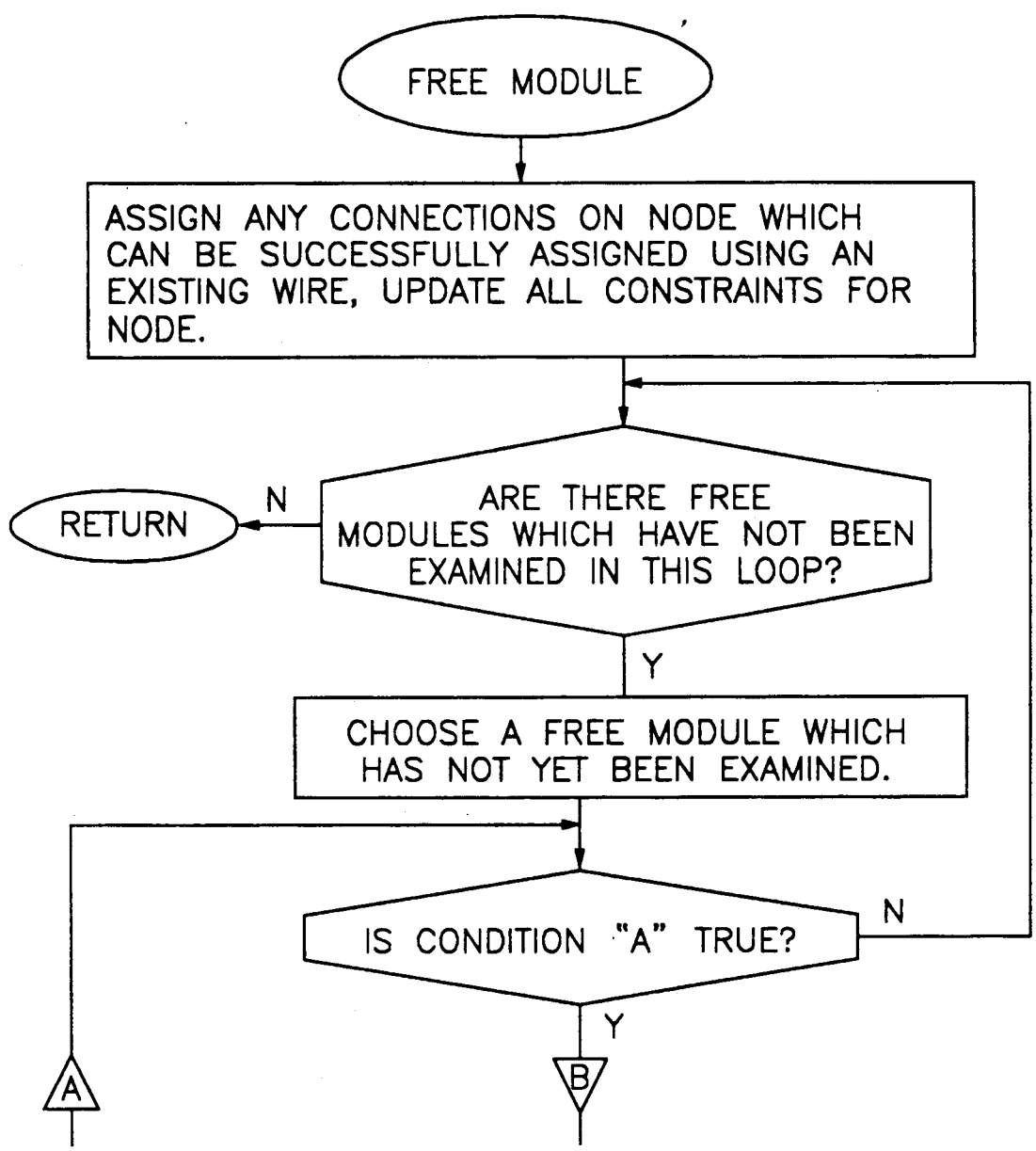
Fig. 13D(1)

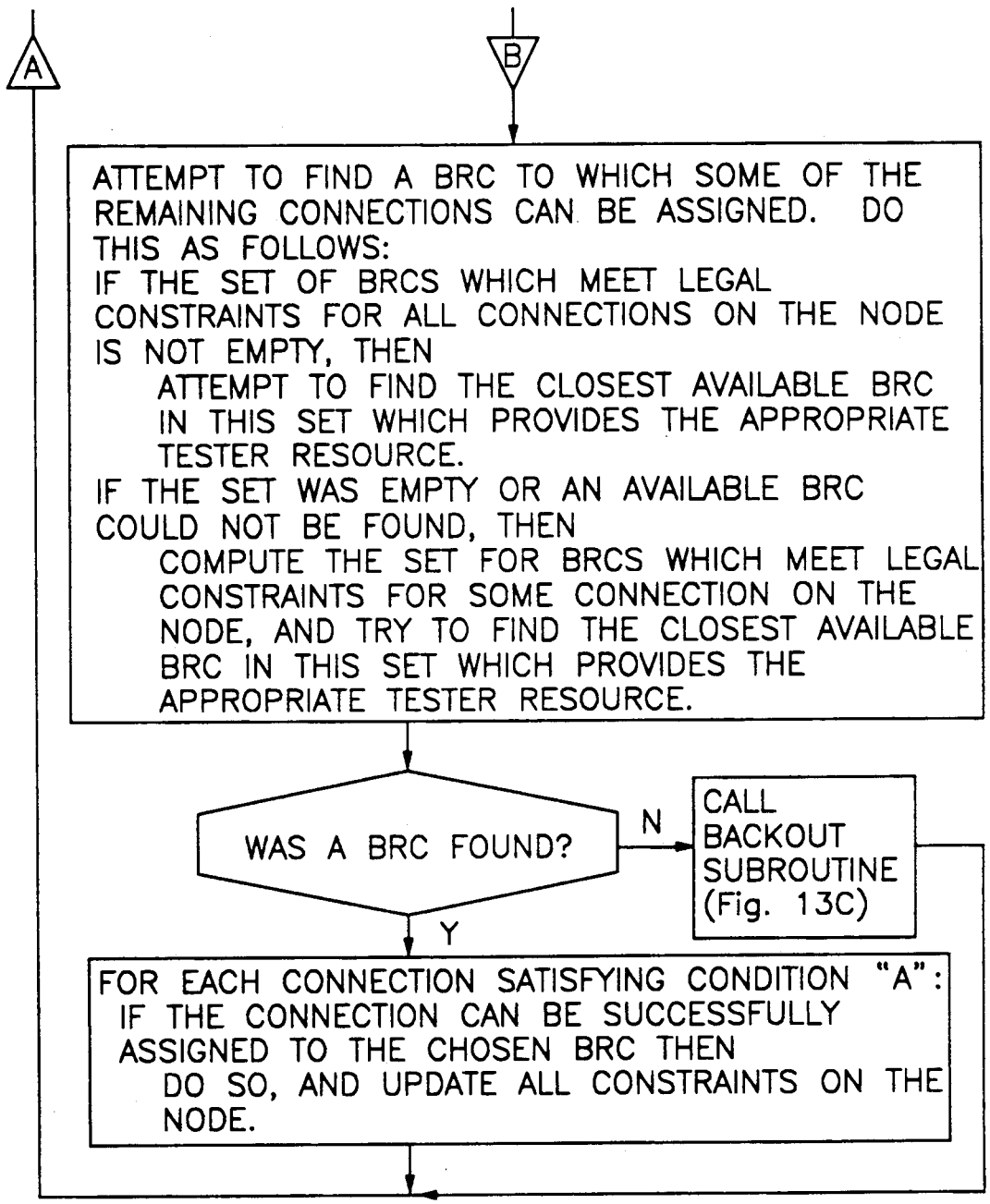
Fig. 13D(2)

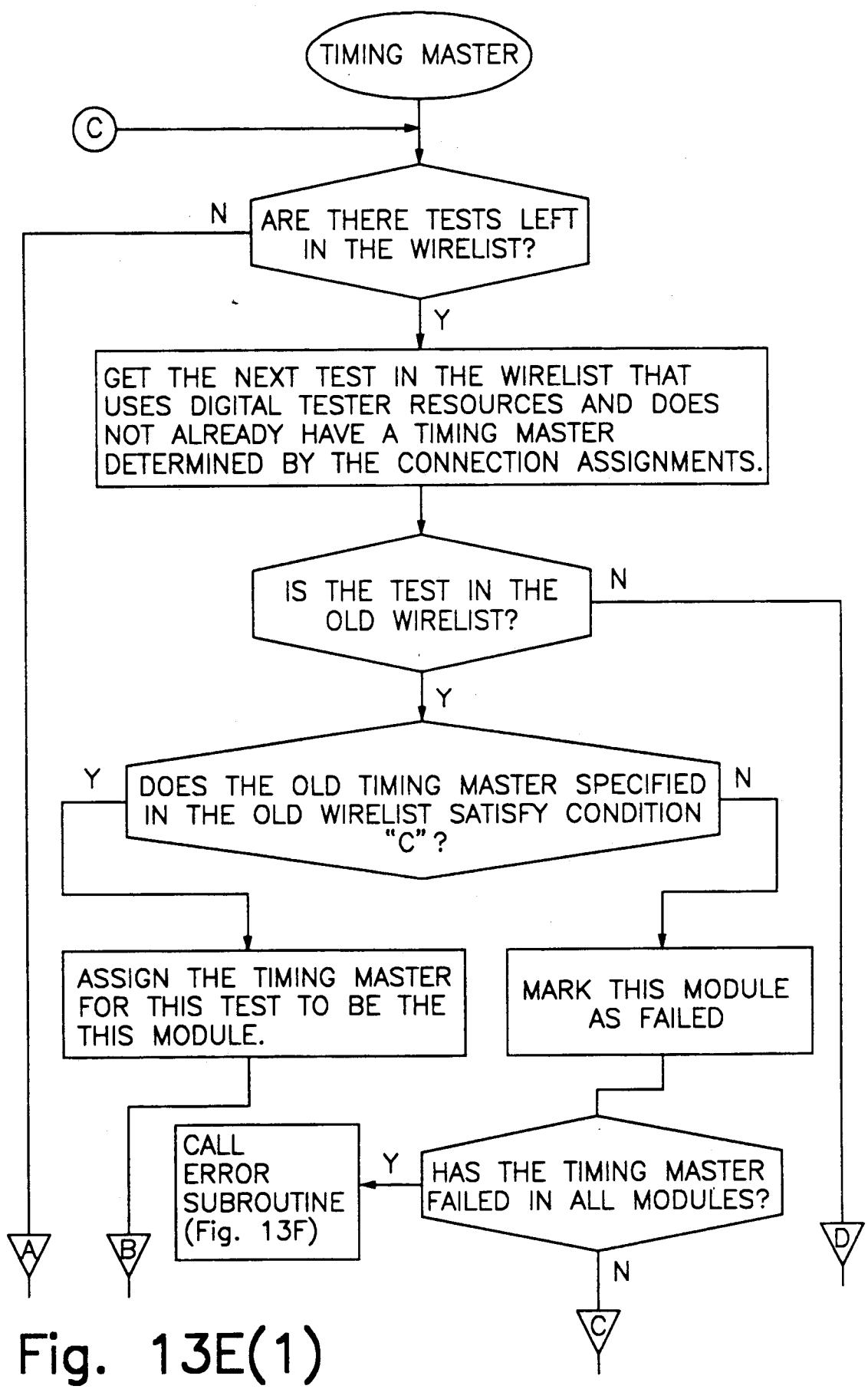
Fig. 13E(1)

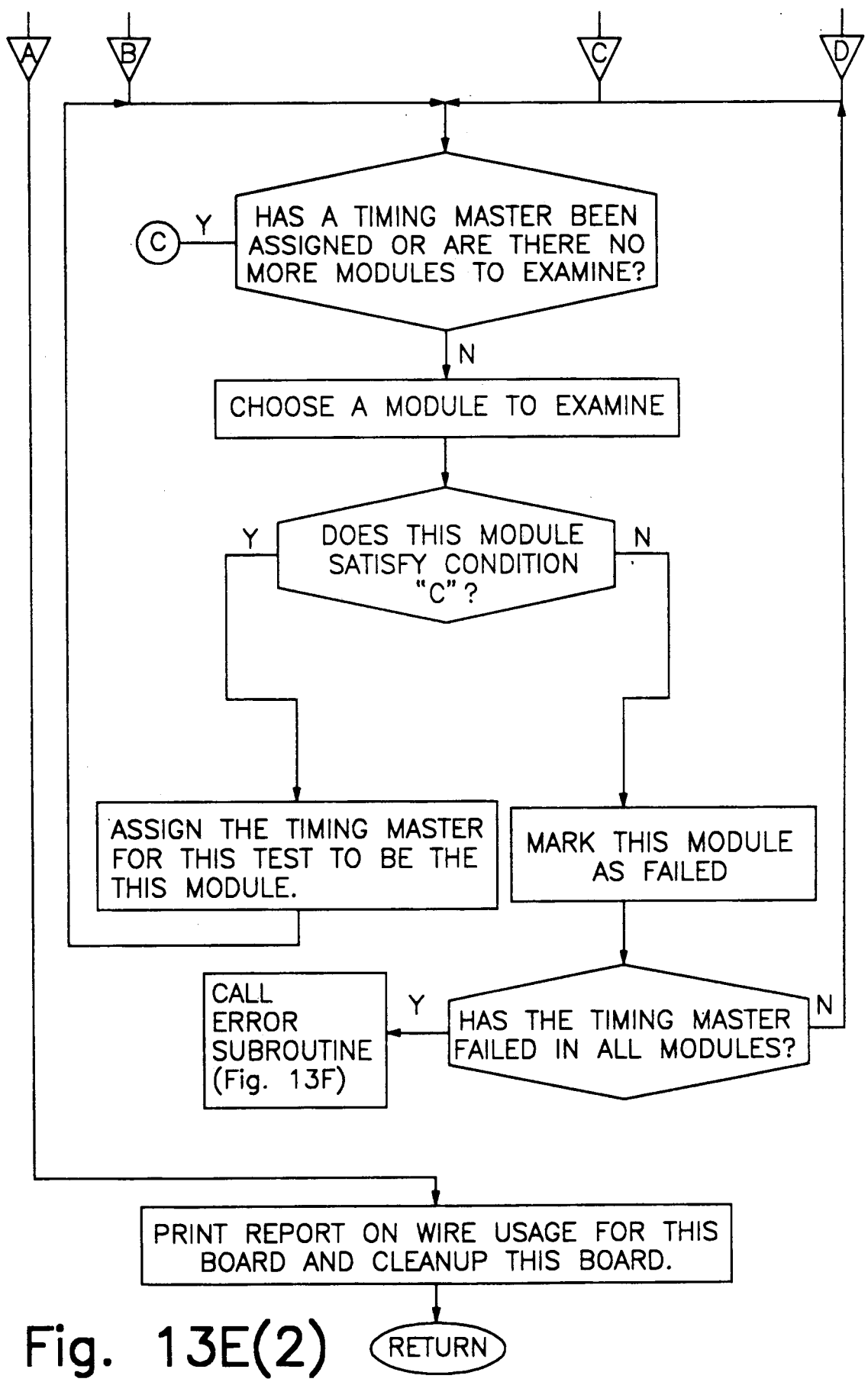
Fig. 13E(2)

MODULAR/CONCURRENT BOARD TESTER

FIELD OF THE INVENTION

The present invention relates to circuit board testers and in particular to circuit board testers that are capable of performing in-circuit testing of individual components or circuits on a circuit board.

BACKGROUND OF THE INVENTION

Circuit board testers typically perform functional testing and/or in-circuit testing.

Functional testing typically involves the application of all of the possible meaningful combinations of signals to the inputs of a circuit board. For each combination of signals input to the circuit board the outputs are monitored to determine if the circuit board is operating properly. Functional testing has several drawbacks. Namely, it is difficult to develop combinations of input signals to test particular components or circuits on the circuit board. In addition, it is difficult once a fault is detected to isolate the component or circuit on the circuit board that is defective.

In-circuit testing, in contrast, tests specific components or circuits on the circuit board. Thus, the need to develop tests that test a specific component or circuit on the circuit board by applying combinations of signals to the inputs of the circuit board is eliminated. Further, by independently testing each component or circuit on the circuit board faults can be isolated to the specific component or circuit being tested.

Current in-circuit testers include a controller, one or more independent testheads and a test fixture associated with each testhead. The controller is responsible for, among other things, development of a test plan for testing the components or circuits residing on a particular circuit board. Development of the test plan by the controller is dependent upon the topology of the circuit board and the resources provided by the testhead.

Circuit board topology is generally concerned with the identification of the types of components or circuits residing on the circuit board and the location of the nodes associated with each of the identified components or circuits. A node is a point on the circuit board that is accessible for the purpose of testing a particular component or circuit on the circuit board. The type of component or circuit associated with a particular set of nodes determines the appropriate test for that particular component or circuit. For example, an "AND" gate would be tested according to an "AND" gate test program. The location of nodes on a circuit board requires the defining of a reference point on the circuit board relative to which the location of the nodes associated with each component or circuit on the circuit board can be specified. The nodes associated with each component or circuit residing on the circuit board may also need to be characterized. For example, a typical "AND" gate may include three nodes, two of which can be characterized as input nodes while the remaining node can be characterized as an output node.

Also, accessible by the controller during development of the test plan is a library or libraries of the performance characteristics associated with each type of component or circuit on the circuit board. Consequently, based upon the circuit topology and the library entries associated with the components or circuits on the circuit board the controller can develop a preliminary test plan that defines the resources necessary to test the circuit board.

Also available to the controller during development of the test plan is a definition of the test resources provided by the testhead. The resources of the testhead are accessed by an array of interface pins. For example, a particular interface pin in the array may provide a digital driver for use in testing a digital component on the circuit board.

The location of the test resource and the location of the component or circuit on the circuit board that requires the particular test resource generally do not correspond. Consequently, a test fixture is employed to provide an electrical connection between a particular interface pin and a node on the circuit board. The test fixture includes an array of probe pins that contact the nodes on the circuit board. The probe pins, in turn, are connected by wires to the interface pins thereby providing an electrical pathway for applying the resources of the testhead to the nodes of the circuit board. The controller allocates the resources of the testhead according to the requirements specified in the preliminary test plan. In so doing the controller generates a wire list for the test fixture and a final test plan. The final test plan defines, among other things, the way in which the resources of the testhead are applied to the nodes associated with the various components or circuits on the circuit board.

Once the test plan has been developed it can then be downloaded to the testhead and executed by a processor residing therein. If, a component or circuit is found to be defective during the execution of the test plan then the information is communicated to the controller for appropriate remedial action.

The consumer or purchaser of a circuit board tester is concerned with several factors. These factors, in turn, affect the design of the circuit board tester.

An important factor is the ability of the tester to accommodate future production requirements that require a greater amount of test resources than are available in the tester that the consumer purchases.

Another factor is the ability of the circuit board tester to test high performance components or circuits.

Relatedly, the tester should be resistant to increases in the performance of electronic components or circuits that would render it obsolete and, hence, reduce its useful lifetime and return on investment.

Yet another factor is the costs imposed upon the consumer for test resources that exceed the requirements of the purchaser's present production requirements and, hence, reduce the consumer's return on investment.

A further factor that affects the design of the tester is the tester's ability to satisfy the purchaser's present, as well as future, throughput requirements. Throughput is defined as the number of circuit boards tested per unit of time.

Yet another factor is the ability of the tester to test several different types of components and perform several different types of tests on any given circuit board. For example, the tester should be able to perform in-circuit tests on analog components, digital components, and components like analog-to-digital converters that require both analog and digital signals to test. The types of tests that a tester should be able to perform include functional tests as well as tests to detect simple manufacturing defects like solder defects which may, for example, produce a short circuit.

Yet another factor is the ability of the tester to be adapted to test new components introduced on the market. In essence, a circuit board tester should be flexible enough to meet both present and future production requirements at a minimum of cost.

Presently known circuit board testers that perform in-circuit testing are of two types. The first type of circuit board tester can be characterized as an expandable, circuit board tester that allows the user to incrementally add test resources if future circuit boards require additional test resources. There are two known sub-types of expandable, circuit board testers. The first sub-type includes a dedicated controller or pattern sequencer and a testhead in the form of a card cage having slots for accommodating printed circuit (PC) test pin boards. The user can increase the resources of the testhead by adding PC boards to the card cage. The second sub-type includes a dedicated controller and one or more card cages. Each card cage provides a limited amount of test resources and an interface for communicating with another card cage. Consequently, if a card cage or group of card cages does not provide enough resources to test a particular circuit board then an additional card cage can be attached to provide the necessary resources.

The presently known expandable, circuit board testers have numerous disadvantages. Namely, problems associated with certain physical factors, such as propagation delay, power distribution and capacitive load, have effectively limited the ability of the known, expandable circuit board testers to expand or provide resources beyond a certain threshold. More specifically, as the quantities of resources incorporated into known, expandable circuit board tester have increased the problems presented by the aforementioned physical factors have increased in both number and complexity. Solutions to these problems have become increasingly complex, expensive and unreliable. Consequently, the number and complexity of the problems together with the complexity, expense and reduction in reliability associated with their solutions have effectively limited the test resources that known, expandable circuit board testers can provide. Based on the foregoing there exists a need for a circuit board tester that overcomes the limitations on expansion, and the associated consequences thereof, that are imposed by the aforementioned physical factors.

Another drawback associated with known, expandable, circuit board testers is that they are also extremely sensitive to certain physical factors that inhibit the effective testing of high performance or high speed components where the timing of signals is critical to the testing of the component. For example, as the size of the card cage associated with a first sub-type of expandable circuit board tester increases to accommodate more test resources, the propagation delay between the processor and the resource increases. As the propagation delay increases the testing of components that require time critical signals becomes increasingly difficult. Hence, there is a need for a circuit board tester that is less sensitive to the physical factors that affect its ability to exercise high performance components.

Yet another drawback associated with known, expandable circuit board testers is that the consumer must purchase certain components that are necessarily designed to accommodate the maximum configuration of the tester. Hence, a consumer that requires only a portion of the circuit board tester's capabilities in order to test a particular circuit board must, nevertheless, purchase certain components which are designed to work with the maximum configuration of the tester. For example, suppose a consumer purchases a first sub-type circuit board tester that includes a card cage with a cooling system capable of servicing a fully populated card cage. Further, suppose that in order to test the circuit board the consumer only requires the resources provided by a partially populated card cage. The consumer, in this instance, realizes a cost savings with respect to the number of PC boards that must be purchased since a fully populated card cage is not required to test the circuit board. However, the consumer also experiences a cost penalty since the cooling system, which is designed for a fully populated card cage, must also be purchased. Consequently, there exists a need for a circuit board tester that does not require the consumer to purchase components that are designed for the maximum configuration of the tester.

Another drawback associated with known, expandable circuit board testers is that they can only test one circuit board at a time. Consequently, such circuit board tester have a limited throughput. Hence, there is also a need for a circuit board tester that overcomes the limited throughput of the known, expandable circuit board testers.

Another drawback associated with known, expandable circuit board testers is that only one component can be tested at a time.

A further drawback with known, expandable circuit board testers is the use of several dedicated processors within a testhead. For instance, the Hewlett-Packard 3065 circuit board tester includes a testhead having a processor dedicated to analog testing and another digital testing. The use of several such processors is unnecessarily complex.

The second type of circuit board tester that provides in-circuit testing is exemplified by the Hewlett-Packard (HP) 3065 circuit board tester. The HP 3065 includes a controller and up to three independent testheads that are serviced by the controller in a multiplexed fashion that allows several circuit boards to be tested concurrently. For example, suppose two test programs are developed for two different types of circuit boards with each program having a different execution time. Further, suppose the first and second programs are downloaded to a first and second testhead. The test programs can then be executed simultaneously by the testhead processors. If the first test program finishes before the second test program, then the status of the test can be communicated to the controller and a new circuit board can be placed on the first testhead without interrupting the testing taking place on the second testhead. Consequently, the concurrent testing ability provided by the HP3065 allows the testheads to be used in a highly efficient manner that provides improved throughput. The independent testheads of the 3065 are, however, subject to all of the limitations previously discussed with respect to the expandable circuit board testers, i.e. propagation delay, power distribution, capacitive load and the like.

Based on the foregoing it can be generally stated that there exists a need for a circuit board tester that exhibits improved flexibility in several respects. Namely, there is a need for a circuit board tester that is better capable of meeting the present and future production requirements of the consumer with regard to the amount of resources provided for testing circuit boards, throughput, and combinations thereof. There is also a need for a circuit board tester that is less sensitive to increases in the performance levels of electronic components and circuitry. There is also a need for a circuit board tester that reduces the number of necessary test resources that are designed for the maximum configuration when the consumer only requires a portion of the tester's maximum capability. Moreover, there is a need for a circuit board tester that can test several different types of components and perform several different types of tests.

SUMMARY OF THE INVENTION

The present invention provides a modular/concurrent circuit board tester for performing in-circuit tests on components or circuits, hereinafter referred to as devices, residing on a circuit board.

The apparatus of the present invention includes a testhead for interfacing with at least one circuit board and supplying the resources for the testing thereof. The testhead includes a plurality of modules with each module having defined quantities of resources and an independent processor. By using defined or limited quantities of resources, problems with propagation delay and the like within each module are maintained at an acceptable level. The processor in one module is substantially homogeneous or identical in functional abilities, and specifically the ability to execute a number of different types of tests, like analog and digital test, to the processor in any other module. The independent processor includes an independent CPU for use in executing a test plan. Preferably, the independent processor also includes an independent vector processing unit for generating vectors that, as part of a test plan, are used to test digital devices.

The present invention further includes a first apparatus for coordinating the execution of a test plan if the resources of more than one module are required. If it is determined that the resources of more than one module are required to test a particular circuit board, then the test plan is sub-divided into portions for execution by the processors in each of the modules. The execution of the various portions of the test plan by the individual processors within each module is synchronized by using the first apparatus for coordinating. The first apparatus for coordinating is also used to coordinate the operation of the vector processing units when the resources of more than one module are required to test a device. The first apparatus for coordinating the operation of two or more modules employs a readily characterized structure. Preferably, the first apparatus for coordinating employs a ring structure where any one module communicates directly with, at most, two other modules. By employing a readily characterized structure any problems with propagation delay and the like between the modules can be dealt with in a reliable and cost effective manner.

The architecture of the present invention, i.e. the use of a plurality of modules with each module having a defined quantities of resources and a processor together with an apparatus for coordinating the execution of a test plan by the processors when the resources of more than one module are required to test a circuit board, has several advantages with respect to known circuit board testers. Among the advantages of the present invention is the ability to test circuit boards which require more resources than known circuit board testers can provide. The present invention is also less sensitive to increases in the performance of devices. In addition, the present invention exhibits a greater useful lifetime relative to known circuit board testers and reduces the consumer's initial investment by only requiring the purchase of enough modules to meet current production requirements. Moreover, the present invention allows consumers to distribute their investment over time since the present invention can be incrementally upgraded as production requirements increase over time. Additionally, the architecture of the present invention allows a first module to test a first component on a circuit board simultaneously with the testing of a second component on the same circuit board by a second module. Further, the homogeneous nature of the modules, and the processor in particular, is highly efficient.

The present invention also, preferably, includes a switching apparatus which allows each module to selectively connect or disconnect from the first apparatus for coordinating thereby allowing one or more modules to operate independently. Consequently, the present invention provides the consumer with the flexibility of combining the resources of one or more modules to test a circuit board while also allowing any modules not being used to test the circuit board to function independently and, hence, be used to concurrently test other circuit boards. As a consequence thereof, the present invention provides improved throughput, allows maximum utilization of the resources in the testhead and further enhances many of the previously mentioned advantages.

In addition, the present invention preferably includes a second apparatus for coordinating that allows modules that are not coupled by the first apparatus for coordinating to be coupled for the testing of a circuit board that requires more resources than one module can provide. Preferably, the switching apparatus is used to create the second apparatus for coordinating from the first apparatus for coordinating. The switching apparatus can be extended to create further apparatuses for coordinating. Hence, the present invention provides the consumer with the flexibility of being able to concurrently test more than one circuit board where each circuit board requires the resources of more than one module. Thus, the present invention can provide improved throughput as well as enhance many of the previously discussed advantages.

The present invention also, preferably, includes an apparatus for generating a wire list and test plan based upon the topology of the circuit board, a definition of the tests required to be performed on at least one component residing on the circuit board and the resources of the testhead. The wire list defines the electrical connection, established in a test fixture, necessary to apply the resources of the testhead to the nodes of the circuit board. In essence, the production of a wire list determines how the resources of the testhead are allocated to the testing of the circuit. The test plan defines how the particular resources allocated during the generation of the wire list are used to test specific devices on the circuit board. The apparatus for generating a test plan includes an apparatus for determining if the resources of more than one module are required to test a particular circuit board. If the resources of more than one module are required to test a particular circuit board, then the apparatus for generating a test plan sub-divides the test plan into portions for execution by the individual processors in each module. Further, in the preferred embodiments of the invention that provide concurrent testing by including a switching apparatus and/or a second apparatus for coordinating, the apparatus for generating a test plan also produces a configuration plan which appropriately configures the coordination path or paths between the modules.

The present invention also, preferably, includes an apparatus for communicating that extends between the apparatus for generating a test plan and each of the modules in the testhead thereby providing a path or paths for communicating, for example, a test plan or a portion thereof to each of the modules.

Also, preferably, included in the present invention is an apparatus for monitoring the results of the test or tests performed by the modules residing in the testhead. The apparatus for monitoring is, preferably, integrated with the apparatus for generating a test plan thereby allowing it to use the apparatus for communicating to receive the results of the test or tests from the module or modules.

Furthermore, each module of the present invention, preferably, includes an independent power supply, an independent cooling system and an independent device-under-test DC power supply thereby reducing any cost imposed upon the consumer for unused capability.

The operation of the present invention includes generating a wire list and test plan based upon a definition of the topology of a circuit board, the test or tests to be performed on at least one device residing on the circuit board and the resources of the testhead as provided by each of the modules residing in the testhead. If the resources of a single module are insufficient to test the circuit board, then the test plan is sub-divided into test plan portions for parallel execution by two or more of the processors.

Once the test plan is generated it can then be communicated to the appropriate module or modules and executed by the processor or processors residing therein. If the test plan has been sub-divided into test plan portions, then the first apparatus for coordinating is used to coordinate the execution of the test plan portions by the various processors and vector processing units.

When the modules in the testhead include a switching apparatus which allows the individual modules to be disconnected from the first apparatus for coordinating and all of the modules in the testhead are not dedicated to the testing of one circuit board, then each of the available module or modules can be used to test an additional circuit board. Generation of a test plan or plans in this situation, however, requires, in addition to the aforementioned information, a definition of which modules are dedicated to the testing of a particular circuit board and which modules are available. The apparatus for generating a test plan, in addition to generating a test plan or plans for the available modules, also generates a configuration plan which, when executed, results in the available modules being disconnected from the first apparatus for coordinating.

When the testhead includes a first apparatus for coordinating, a switching apparatus that allows the individual modules to be disconnected from the first apparatus for coordinating, a second apparatus for coordinating and four or more modules, then the modules can be configured to test two or more circuit boards that each require the resources of two or more modules. Generation of the test plans to utilize in such a configuration requires a definition of which modules are dedicated to the testing of which circuit boards. The apparatus for generating a test plan in this situation also generates a configuration plan that, when executed, results in certain modules being disconnected from the first apparatus for coordinating and connected to the second apparatus for coordinating.

BRIEF DESCRIPTION OF THE DRAWINGS

FIG. 13A-13G is a more detailed flow chart of the module PIN assignment program illustrated in FIG. 12;

DETAILED DESCRIPTION OF THE PREFERRED EMBODIMENT

Figure 1:
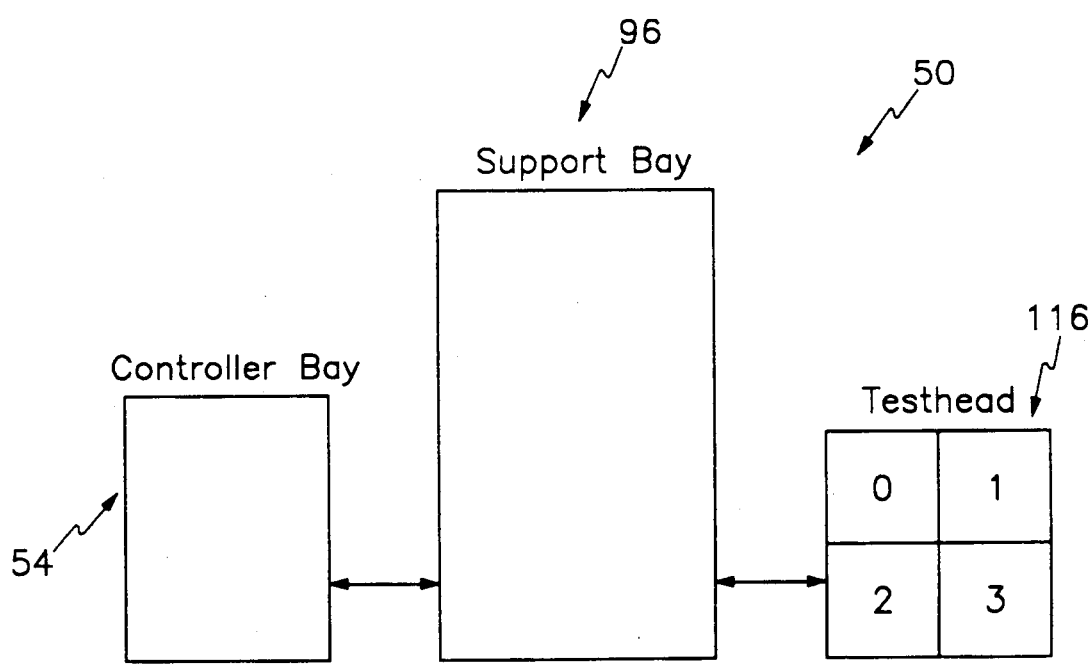
FIG. 1 is a block diagram of the preferred embodiment of the modular/concurrent circuit board tester.
Figure 2:
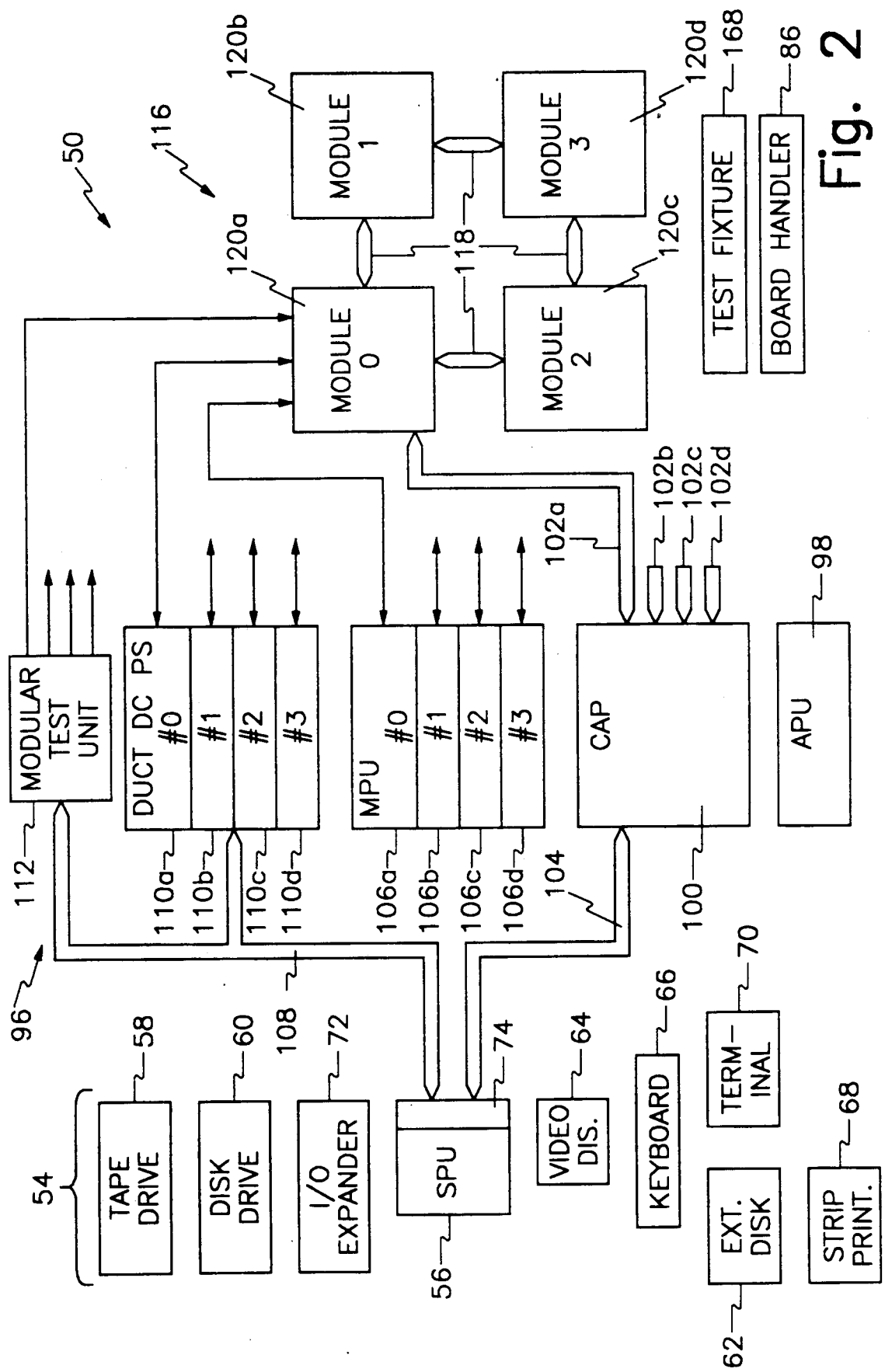
FIG. 2 is a more detailed block diagram of the preferred embodiment of the modular/concurrent circuit board tester.
Figure 3:
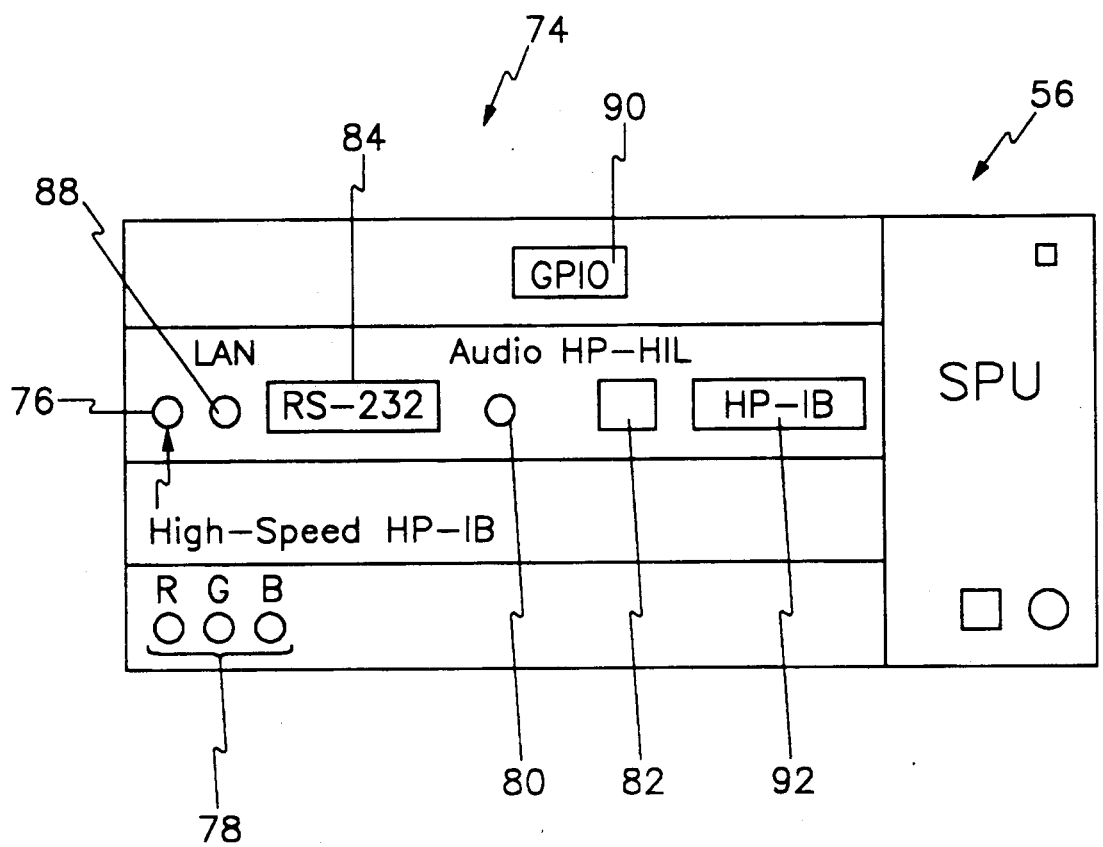
FIG. 3 illustrates the communication interface between the system processing unit (SPU) and other components in the preferred embodiment of the modular/concurrent circuit board tester.

With reference to FIGS. 1-3, an embodiment of a modular/concurrent circuit board tester 50, hereinafter referred to as tester 50, is illustrated. The tester 50 is shown, and hereinafter described, as including a testhead having four testhead modules. It is to be expressly understood, however, that the present invention is not limited to a testhead with four testhead modules. Rather, the testhead associated with the tester 50 can include one or more testhead modules.

The tester 50 includes a controller bay 54 that houses a system processing unit (SPU) 56 that is primarily used for test development and/or test execution management. Preferably, the SPU 56 is a general purpose computer that primarily executes test development programs and/or test execution management programs. The SPU 56 is also, preferably, a Hewlett-Packard 98562A computer that runs under a multi-tasking operating system such as UNIX. The multi-tasking operating system employed by the SPU 56 allows several programs, for instance a test development program and a test execution management program, to be executed in a multiplexed fashion. (To simplify FIG. 2, the actual communication paths established between the SPU 56 and several of the components in the tester 50 are not explicitly illustrated).

The controller bay 54 also preferably houses a tape drive 58, an internal disk drive 60, and an external disk drive 62 which can be utilized by the SPU 56 to permanently store information, receive information or transfer information. For instance, the tape drive 58 and the external disk drive 62 can be used to input the topology of a circuit board to the SPU 56. The SPU 56 can then use the topology to develop a test plan for the circuit board. The tape drive 58 and the external disk 62 can also be used by the SPU 56 to transfer test plans or other information to another circuit board tester. For example, the SPU 56 could develop a test plan and write the test plan on a tape using the tape drive 58. The tape can then be used to input the test plan to another SPU. The internal disk drive 60 is typically used to store the UNIX operating system, the test development programs and the test execution management programs used by the SPU 56 to accomplish the aforementioned tasks.

The controller bay 54 also, preferably, houses a video display 64, a keyboard 66, a strip printer 68 and a terminal 70 that, collectively or separately, allow an operator to interact with the SPU 56.

Also, preferably housed within the controller bay 54 is an I/O expander 72 that provides the SPU 56 with additional input/output ports that can be used to interface other peripherals, such as a bar code reader, to the SPU 56.

With reference to FIG. 3, the SPU 56 is provided with an interface 74 for use in establishing communication paths between the SPU 56 and other components of the tester 50. (To simplify FIG. 2, the actual communication paths established between the SPU 56 and several of the components in the tester 50 via the interface 74 are not explicitly illustrated.) The interface 74 includes a high-speed HP-IB bus port 76, i.e., a high-speed IEEE-488 bus port, for use in establishing a communication path or paths between the SPU 56 and the tape drive 58, the internal disk drive 60 and the external disk 62. The interface 74 further includes a red-green-blue (RGB) port 78, an audio port 80, and a HIL port 82 for use in interfacing the SPU 56 with the video display 64 and the keyboard 66. An RS-232 232 serial interface port 84 is included in the interface 74 for use in establishing a communication path between the SPU 56 and the strip printer 68. The RS-232 serial interface port 84 is also used to interface the SPU 56 to an optional, automatic board handler 86 that operates under the control of the SPU 56 to mount and dismount circuit boards from a test fixture in an assembly line fashion. Communication between SPU 56 and the SPU associated with another tester is facilitated by a local area network (LAN) port 88 associated with the interface 74. A general-purpose I/O bus port 90 is included in the interface 74 for use in establishing a communication path between the SPU 56 and one or more testhead modules, as described more fully hereinafter. Also, as described more fully hereinafter, the interface 74 includes a standard HP-IB bus port 92, i.e., a standard IEEE-488 bus port, for use in effecting a communication path between the SPU 56 and one or more DC-power supplies that provide the testhead modules with a range of DC voltages that can be used for testing particular devices or circuits. The standard HP-IB bus port 92 also provides an interface for establishing communications between the SPU 56 and a modular test unit that provides the testhead modules with access to various measurement and/or signal producing instruments that are not normally incorporated into the testhead module or modules.

Also included in the tester 50 is a support bay 96 that contains an AC power unit (APU) 98 for distributing AC and DC power to various components located throughout the tester 50. (To simplify FIG. 2, the actual connections between the APU 98 and the various components of the tester 50 which receive power from the APU 98 are not explicitly illustrated.)

The support bay 96 also houses a control and power (CAP) card 100 that primarily serves to multiplex communications from the testhead modules to the SPU 56 and, conversely, demultiplex communications from the SPU 56 to the testhead modules. In the embodiment of the tester 50 illustrated in FIG. 2, four testhead modules communicate with the CAP card 100 using parallel buses 102a, 102b, 102c and 102d. Communications between the CAP card 100 and the SPU 56 are achieved using a general purpose I/O bus 104 that interfaces with the SPU 56 by the general purpose I/O port 90 located on the interface 74. In operation, the CAP card 100 multiplexes communications from the four testhead modules that are received on the parallel buses 102a, 102b, 102c and 102d onto the general purpose I/O bus 104. Conversely, the CAP card 100 also operates to demultiplex communications received from the SPU 56 via the general purpose I/O bus 104 onto the parallel buses 102a, 102b, 102c and 102d. The CAP card 100 is also a conduit for a twenty-four volt DC signal produced by the APU 98 and used by a vacuum pull-down apparatus, a part of a test fixture, that is used to establish electrical contact between the nodes of the circuit board and the resources of the testhead. Additionally, the CAP card 100 acts as a conduit for an emergency shut down signal from the testhead to the APU 98. The CAP card 100 also serves to enable module power units that provide DC operating voltages to the testhead modules. Power is provided to the CAP card 100 by a five volt DC signal generated by the APU 98.

The support bay 96 also houses one or more module power units. Each module power unit operates to convert an AC signal provided by the APU 98 into the necessary DC operating voltages for an individual testhead module. Since a separate module power unit is associated with each testhead module, the consumer of the tester need only purchase enough module power units to accommodate the testhead modules actually incorporated into the consumer's tester. Consequently, the consumer is not forced to purchase components designed for the maximum configuration of the tester 50. In the embodiment of the tester 50 illustrated in FIG. 2, module power units 106a, 106b, 106c and 106d provide the four testhead modules with the necessary DC operating voltages.

The support bay 96 also optionally contains one or more device-under-test (DUT) DC power supplies. Each DUT DC power supply operates to convert an AC signal supplied by the APU 98 into one or more test voltages according to information provided by the SPU 56. The test voltage or voltages provided by the DUT DC power supply are then used by a testhead module in the testing of a circuit board. The SPU 56 communicates and controls the DUT DC power supply or supplies using an HP-IB bus 108 that is connected to the HP-IB bus port 92 of the interface 74. Since each DUT DC power supply is associated with an individual testhead module, the consumer of the tester need only purchase enough DUT DC power supplies to accommodate the number of testhead modules incorporated into the consumer's tester. The support bay 96 illustrated in FIG. 2 also contains DUT DC power supplies 110a, 110b, 110c, 110d, each of which is associated with one of the four testhead modules.

The support bay 96 also, optionally, includes a modular test unit 112 for providing a testhead module or modules with various, optional plug-in instruments, such as multi-meters and function generators, that are not normally incorporated into the testhead module or modules. The selection of which plug-in instrument to provide to a testhead module or modules is defined by the SPU 56 and communicated to the modular test unit 112 using the HP-IB bus 108.

The tester 50 further includes a testhead 116 that provides the resources for testing one or more circuit boards. The testhead 116 includes one or more testhead modules, each of which includes one or more processors and a defined amount of test resources. The testhead 116 also includes a high-speed link 118 for coordinating the operation of two or more testhead modules when the test resources of more than one module are necessary to test a circuit board. The modular nature of the testhead 116 provides the consumer of the tester with the flexibility of only having to purchase a sufficient number of testhead modules to satisfy current production requirements. If future production requirements dictate a greater amount of test resources, then testhead modules can be added to the testhead 116. The testhead 116 illustrated in FIG. 2 includes testhead modules 120a, 120b, 120c and 120d.

Figure 4:
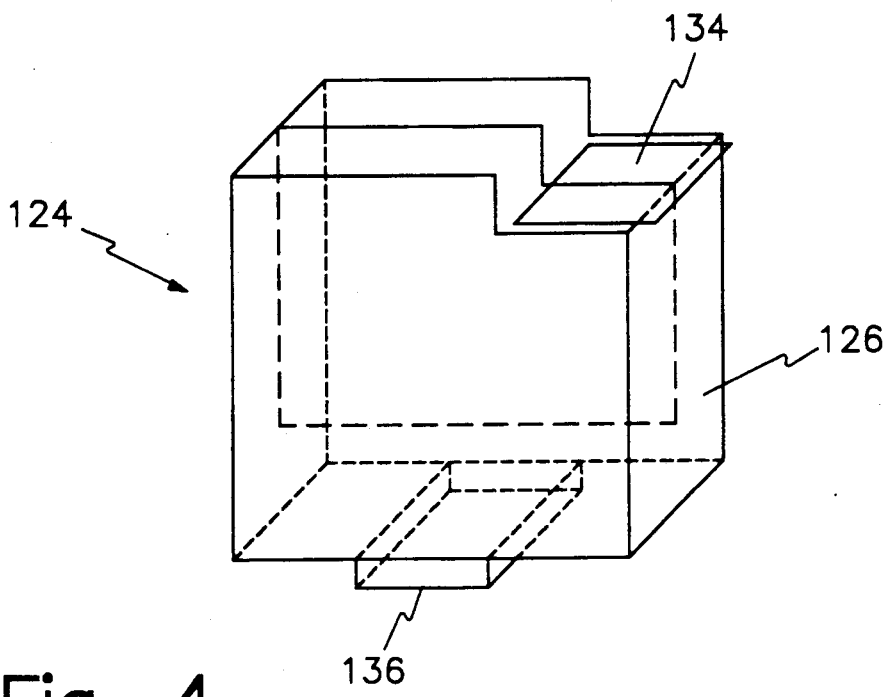
FIG. 4 illustrates the card cage associated with a testhead module.
Figure 5:
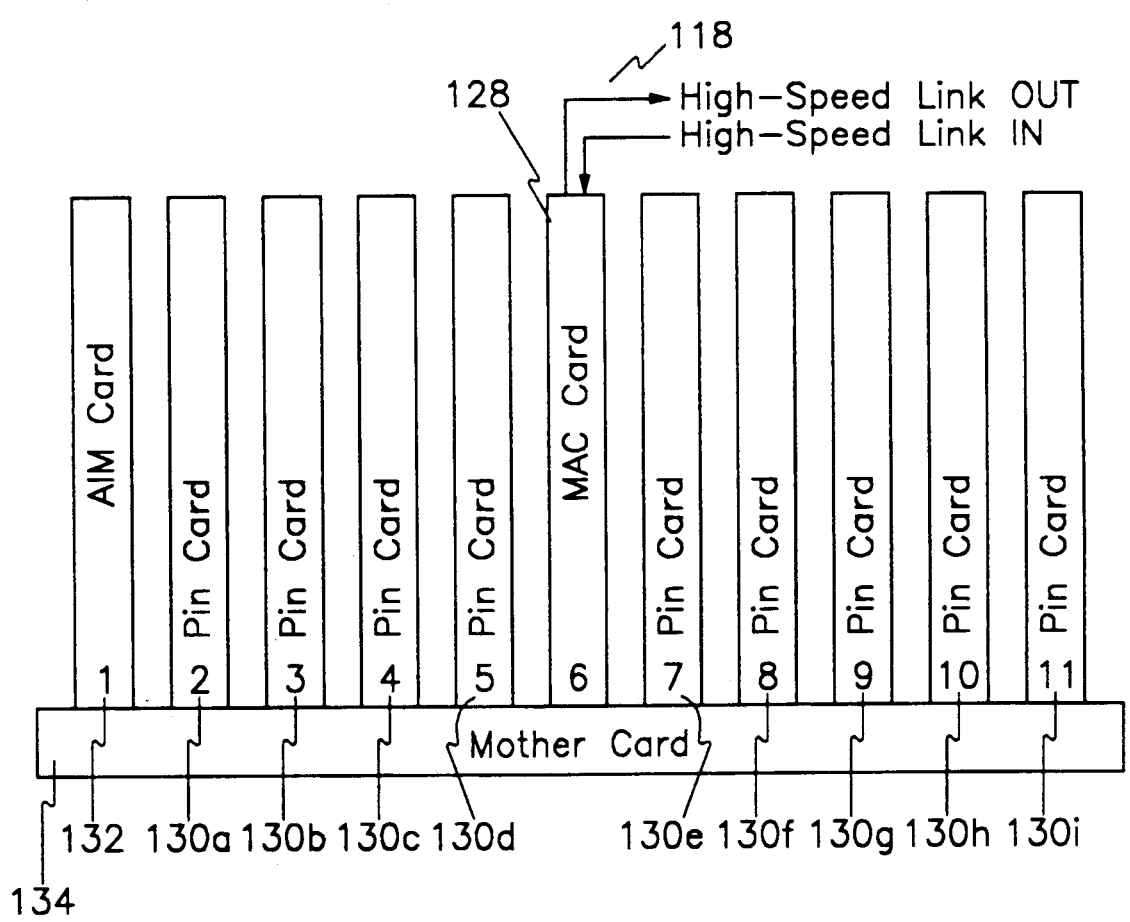
FIG. 5 illustrates the layout of the circuit boards within a testhead module.

With reference to FIGS. 4 and 5, an individual testhead module 124, representative of modules 120a-120d, is described. The testhead module 124 includes a card cage 126 for housing a module access and control (MAC) card 128, PIN cards 130a-i and an analog in-circuit measurement (AIM) card 132. A mother card 134 distributes the DC power provided by a modular power unit to the MAC card 128, the PIN cards 130a-i and the AIM card 132 within the card cage 126. The mother card 134 also provides intra-module communication paths between the MAC card 128, the PIN cards 130a-i and the AIM card 132. Also included in the testhead module 124 is a fan 136, powered by the APU 98, for cooling the parts residing in the card cage 126. Since a separate fan is associated with each testhead module the consumer of the tester 50 is only required to purchase a cooling system for each testhead module incorporated into the consumer's tester.

The PIN cards 130a-i and AIM card 132 provide resources for use in testing a circuit board. Specifically, the PIN cards 130a-i provide digital test resources, drivers and receivers. Associated with each pair of drivers and receivers is a module interface pin that extends from the an edge of the PIN card to a point outside of the card cage 126. The module interface pins make the digital test resources associated with the PIN card available for interfacing with the node of a device or circuit residing on a circuit board. The AIM card 132 includes analog test resources, such as sources, detectors, and measuring operational amplifiers, that are used to conduct analog measurements on a device or circuit. The AIM card 132 includes drivers, receivers and module interface pins for making the analog test resources available for use with a node associated with a device or circuit on a circuit board. Alternatively, the communication paths provided by the mother card 134 can be utilized to route the analog test resources of the AIM card 132 to the drivers, receivers and module interface pins associated with the PIN cards 130a-i or the MAC card 128.

The MAC card 128 conducts or processes any communications between the testhead module 124 and the SPU 56. Consequently, the MAC card 128 is capable of receiving a test plan, or a portion thereof, from the SPU 56 and communicating the results of a test to the SPU 56. The MAC card 128 also executes a test plan, or portion thereof, provided by the SPU 56. In executing the test plan, or portion thereof, the MAC card 128 controls the PIN cards 130a-i and AIM card 132 using the intra-module communication paths provided by the mother card 134. Additionally, the MAC card 128 processes or conducts all inter-module communications using the high-speed link 118. Hence, when a circuit board requires the test resources of two or more modules the MAC cards located in each module coordinate the execution of the test plan using the high-speed link 118. The MAC card 128 also includes drivers, receivers and module interface pins for providing the analog test resources associated with the AIM card 132 and/or the digital test resources associated with the MAC card 128 itself to a node.

Figure 6:
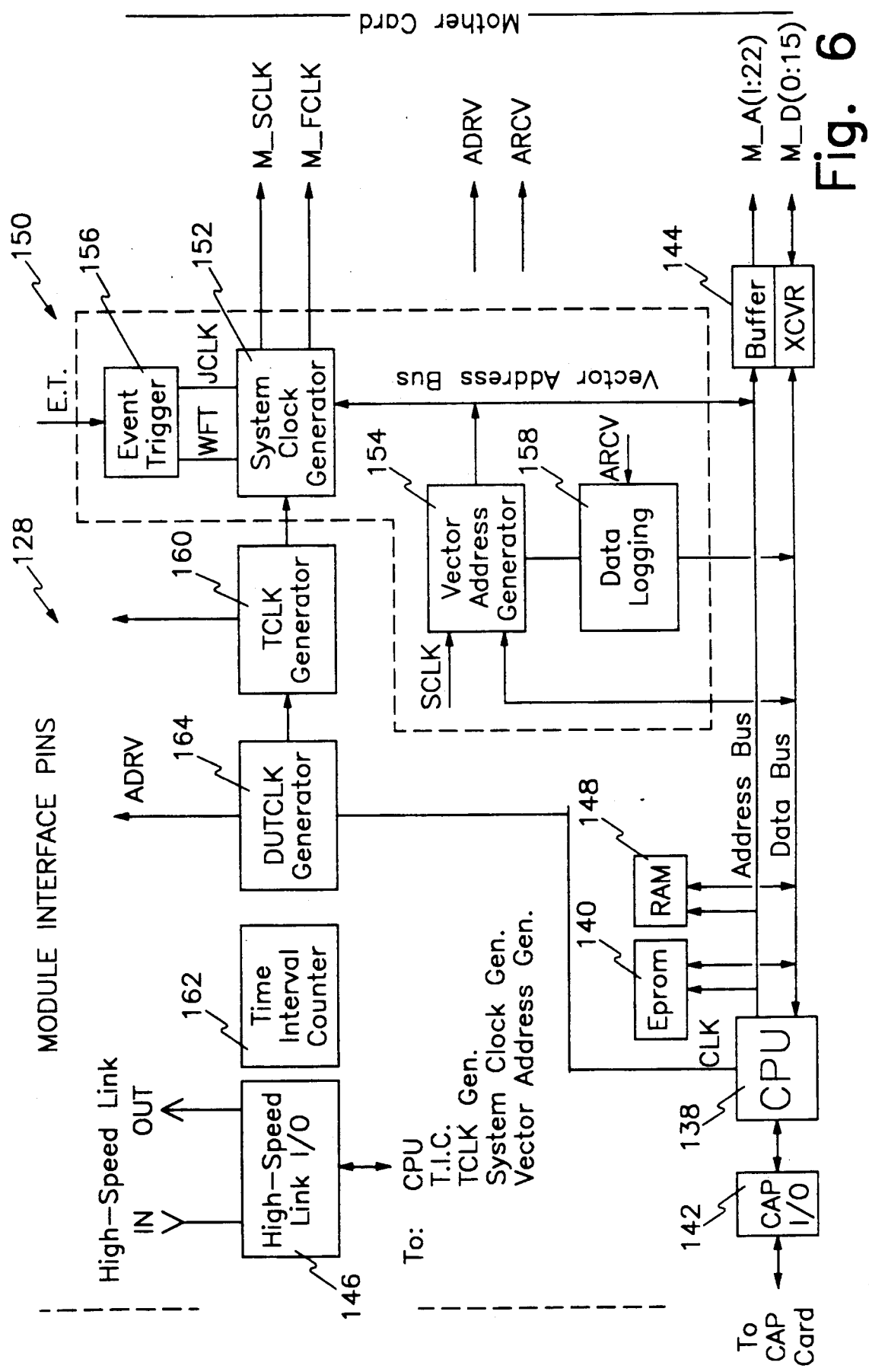
FIG. 6 is a block diagram of the components comprising the module access and control card (MAC) located in the testhead module.

A detailed block diagram of the MAC card 128 is shown in FIG. 6. The MAC card 128 includes a central processing unit (CPU) 138, preferably a Motorola 68000 microprocessor running on a 10-MHz clock, for executing a test plan or test plan portion. The CPU 138 also conducts communications with the SPU 56, other testhead modules, the PIN cards 130a-i and the AIM card 132. The MAC card 128 further includes an erasable, programmable read only memory (EPROM) 140 that provides the CPU 138 with a boot program that allows the CPU 138 to conduct simple communications with other components of the tester 50 when the tester 50 is initially powered up. Also included in the MAC card 128 is a CAP card I/O device 142 which, under the direction of the CPU 138, conducts communications between the testhead module 124 and the SPU 56 via the CAP card 100. The MAC card 128 also includes a mother card interface device 144 that is used by the CPU 138, and other components on the MAC card 128, to conduct communications with the PIN cards 130a-i and the AIM card 132 by way of the communication paths provided by the mother card 134. Also included on the MAC card 128 is a high-speed link I/O device 146 that interfaces the CPU 138 and the high-speed link 118. The high-speed link I/O device 146 is employed by the CPU 138 to synchronize or coordinate the execution of a test plan with one or more other module CPUs when a test plan is distributed among more than one module. The MAC card 128 further includes a random access memory (RAM) 148 for storing, preferably, 512 kwords of information. The RAM 148 is typically employed to store test information.

The MAC card 128 further includes a vector processing unit (VPU) 150 that provides digital data and timing information to the PIN cards 130a–i during the execution of a test or a portion thereof by the CPU 138 that requires digital test resources. The VPU 150 employs the mother card 134 and the mother card interface device 144 to communicate digital data to, and receive digital test data from, the PIN cards 130a–i. The mother card 134 also provides communication paths for providing the digital timing information produced by the VPU 150 to the PIN cards 130a–i. The VPU 150 includes a system clock generator 152 for producing the digital timing information necessary to conduct a digital test within the module. The system clock generator produces clock signals that are distributed to the PIN cards 130a–i by way of the mother card 134. The timing signals are used by the PIN cards 130a–i to output a digital vector at the appropriate time during a test that requires digital test resources. The vector defines which digital resources associated with a PIN card or cards are to be applied during the test. The VPU 150 employs the high-speed link I/O device 146 to coordinate the operation of the system clock generators associated with two or more testhead modules when the digital resources of two or more modules are required. Also included in the VPU 150 is a vector address generator 154 which provides the PIN cards 130a–i with the address of a digital vector located in a random access memory location on each of the PIN cards 130a–i. The vector address is provided to the PIN cards 130a–i . using the mother card interface device 144. Further included in the VPU 150 is an event trigger 156 that provides the VPU 150 with the ability to act in accordance with the occurrence of a defined event on the circuit board. The VPU 150 also includes a data logging circuit 158 that allows the VPU 150 to track data associated with a test that requires digital resources.

The MAC card 128 further includes a tester clock (TCLK) generator 160 for producing clock signals, based upon a reference clock signal, that are utilized by the system clock generator 152 to generate the digital timing signals that are distributed to the PIN cards 130a–i. The reference clock signal can be provided, as dictated by the CPU 138, by one of several sources on the MAC card 128. Most notably, the high-speed link I/O device 146 is used to provide a reference clock signal to the TCLK generator 160. The reference signal provided by the high-speed link I/O device 146 is a clock signal that is propagated over the high-speed link 118 in order to synchronize the VPU's of two or more modules such that a vector generated by the involved modules during a test that requires digital resources appears to be from a single module.

Further included on the MAC card 128 is a time interval counter (TIC) 162 for measuring frequency and time. With respect to the use of clock signal propagated over the high-speed link 118 to coordinate the operation of the VPU's in two or more modules, the TIC 162 is used to calibrate the clock signal produced by the TCLK generator 160 such that the clock signals produced by the TCLK generators in each of the affected modules is substantially in phase with the other TCLK generators.

Also included on the MAC card 128 is a device-under-test clock (DUTCLK) generator 164 for providing a programmable clock signal as a reference signal to the TCLK generator 160 which, in turn, outputs a clock signal that is used by the system clock generator 152 to generate digital timing signals that are distributed to the PIN cards 130a–i. The DUTCLK generator 164 is programmed by the CPU 138 and can output a clock signal having a frequency in the range of 625-kHz to 40-MHz. Notably, the DUTCLK generator 168 can be programmed by the CPU 138 to output either of two clock signals that are frequently used in the testing of telecommunications devices, 2.050 megahertz and 1.55 megahertz.

Figure 7B:
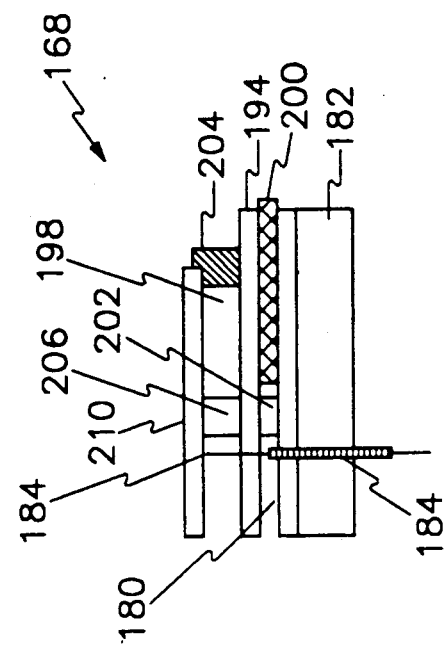
FIG. 7B illustrates the portion of the test fixture shown in FIG. 7A in a vacuum "on" state.
Figure 7A:
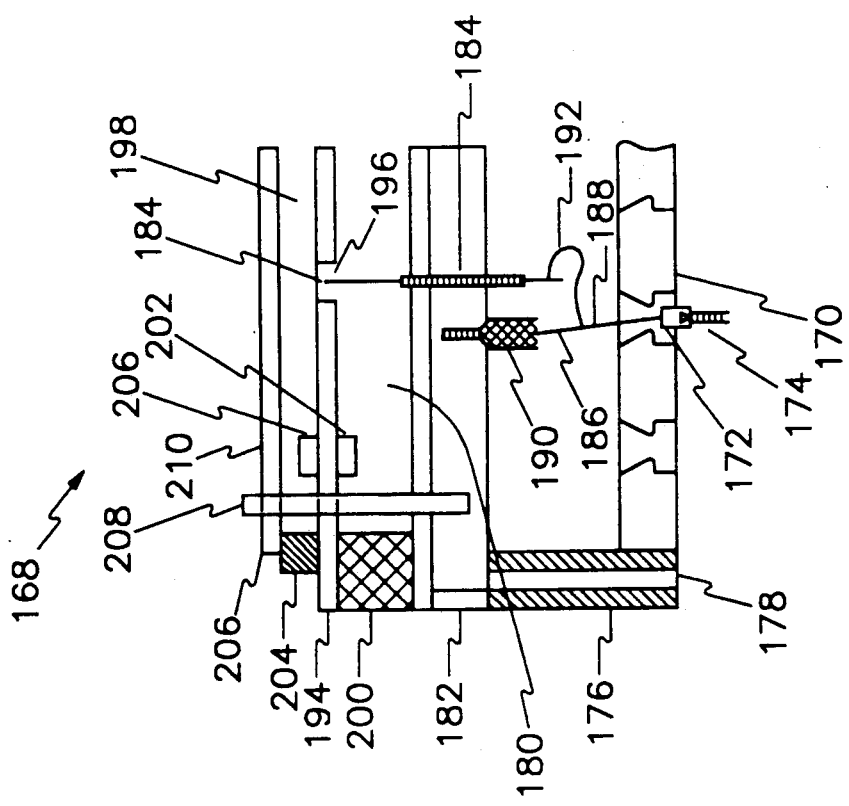
FIG. 7A illustrates a portion of a test fixture for interfacing a module interface pin with a node on a circuit board that is in a vacuum "off" state.

With reference to FIGS. 7A–7B, a cross-section of a portion of a test fixture 168 is illustrated. The test fixture 168 is used to establish an electrical connection between a module interface pin and a node on the circuit board. The test fixture 168 includes an alignment plate 170 having a hole 172 located therein for interfacing with a module interface pin 174 protruding from the edge of one of the cards, i.e., the MAC card 128, PIN cards 130a–i or AIM card 132, contained in the testhead module 124. The test fixture 168 includes a wall 176 having a first vacuum port 178 located therein that communicates with a first vacuum area 180. Located atop the wall 176 is a probe plate 182 which contains a probe pin 184 for physically contacting a node on a circuit board. Located intermediate the alignment plate 170 and the probe plate 182 is a personality pin 186 having a first end 188 that is in electrical contact with the module interface pin 174 and a second end 190 that is in mechanical contact with the probe plate 182. A wire wrap 192 extends between the personality pin 186 and the probe pin 184 to establish an electrical path between the module interface pin 174 and a node on the circuit board. A support plate 194 having a hole 196 located therein for receiving the probe pin 184 is spaced from the probe plate 182 by a spring seal 200. The hole 196 in the support plate 194 also establishes fluid communication between the first vacuum area 180 and a second vacuum area 198. Also located intermediate the probe plate 182 and the support plate 194 is a support plate spacer 202. Located atop the support plate 194 is a gasket 204 and a printed circuit board support 206. A tooling pin 208 that extends through the probe plate 182 and the support plate 194 serves to align the circuit board 210 being tested with the test fixture 168 such that the nodes of the circuit board 210 interface with the proper probe pin.

Operation of the test fixture 168 involves the installation of the circuit board 210 on the test fixture 168 with the vacuum "off" and using the tooling pin 208 as a guide. Installation can be accomplished either by hand or by using the automatic board handler 86. With the vacuum "off", the probe pin 184 is located within the support plate 194 and contact with the circuit board 210 is prevented. Once the printed circuit board 210 is installed the SPU 56 enables a vacuum device (not shown) which, via the vacuum port 178, creates a vacuum in the first vacuum area 180 and the second vacuum area 198. The vacuum causes both the circuit board 210 and the support plate 194 to be pulled toward the probe plate 182. As a consequence thereof the probe pin 184 eventually comes into contact with the node on the circuit board 210 and, hence, establishes an electrical connection between the node and the module interface pin 174. During application of the vacuum the spring seal 200 resists the movement of both the support plate 194 and the circuit board 210 toward the probe plate 182. The support plate spacer 202 insures that the support plate 202 does not come into contact with the probe plate 182. Similarly, the gasket 204 resists the displacement of the circuit board 210 during application of the vacuum and the printed circuit board support 206 prevents the circuit board 210 from coming into contact with the support plate 194. Once the vacuum is applied and electrical contact is established between the probe pin 184 and a node on the circuit board 210 testing can commence. After the test is complete, the SPU 56 then directs the vacuum device to release the vacuum established in the first vacuum area 180 and the second vacuum area 198. The circuit board 210 can then be removed from the test fixture 168 by hand or by using the automatic board handler 86.

Figure 8A:
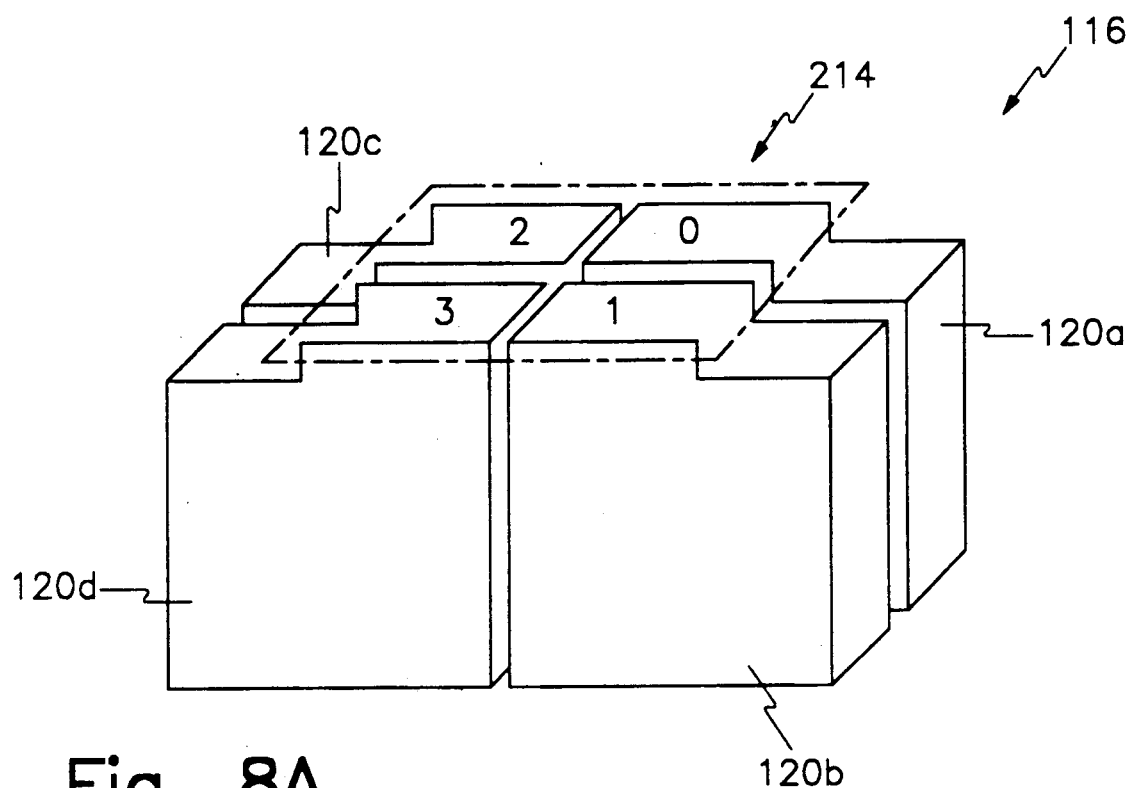
FIG. 8A illustrates the physical orientation of four testhead modules, as shown in FIG. 4, in the preferred embodiment of the modular/concurrent circuit board tested.
Figure 8B:
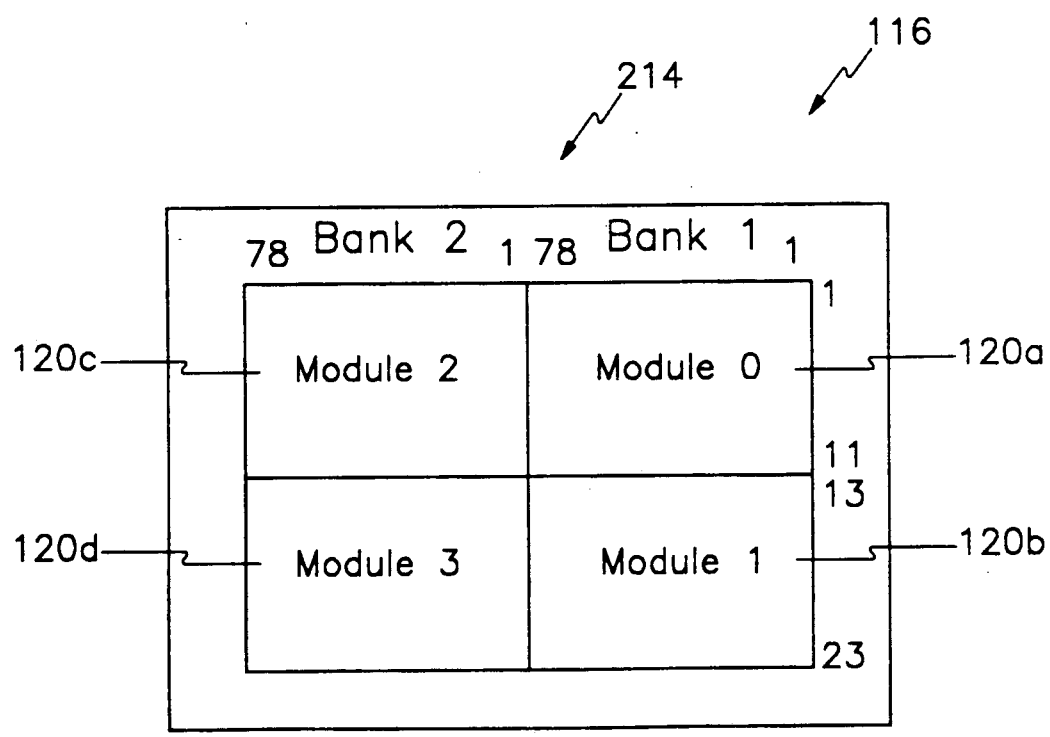
FIG. 8B illustrates the bank, row, column coordinate system used to specify the location of module interface pins in the combination of four testhead modules illustrated in FIG. 8A.

Having described the individual testhead 124 and the interfacing thereof to a circuit board using a test fixture 168 it is now necessary to describe the interaction of a plurality of testhead modules. With reference to FIG. 8A, the physical orientation of the testhead modules 120a-d comprising the testhead 116 is illustrated. The testhead modules 120a-d cooperatively form a module interface pin area 214 that includes the module interface pins provided by the MAC cards and PIN cards of each of the testhead modules 120a-d. With reference to FIG. 8B, the location of individual module interface pins within the module interface pin area 214 is specified according to a bank-row-column (BRC) coordinate system. The bank coordinate refers to the location of a module interface pin with respect to a first bank comprising testhead modules 120a and 120b and a second bank comprising testhead modules 120c and 120d. The row and column coordinates specify, in a Cartesian fashion, the location of an individual module interface pin within a particular bank. In the preferred embodiment of the present invention there are up to seventy-eight columns in each bank or module, and up to twenty-two rows in each bank with eleven rows in each module. Consequently, each testhead module provides up to 858 module interface pins; each bank provides up to 1716 module interface pins; and the testhead 116 provides 3,432 module interface pins.

With reference to FIG. 2, the high-speed link 118 allows the operation of two or more testhead modules to be coordinated when the resources of more than one circuit board are required to test a circuit board. More specifically, the high-speed link 118 allows the operation of the CPU's associated with two or more testhead modules to coordinate the execution of a test plan distributed among them using a processor synchronization signal (PSYNC) that is generated by one of the testhead modules. Preferably, the high-speed link 118 allows the CPUs associated with the two or more testhead modules to coordinate their operations to within a range of 10-50 microseconds. The high-speed link 118 is also utilized to synchronize the VPU's associated with two or more modules using a sequencer start signal (HSTART) and a reference clock (HTCLK) that are generated by one of the testhead modules. Synchronization of the VPU's makes a vector generated by more than one testhead module appear, relative to the circuit board being tested, to be from a single module. Preferably, the high-speed link 118 allows the VPUs associated with two or more modules to coordinate their operations to within a range of 1-3 nanoseconds. The high-speed link 118, preferably, utilizes ribbon cables to establish a loop or ring communication path between the testhead modules where any one testhead module communicates directly with, at most, two other testhead modules. Other configurations, such as star, tree and hypercube configurations, are also feasible. The CPUs and VPUs, associated with each testhead module, interface with the high-speed link using the previously mentioned high-speed link I/O device 146, which is connected by ribbon cables to the preceding and succeeding testhead modules in the loop.

Figure 9:
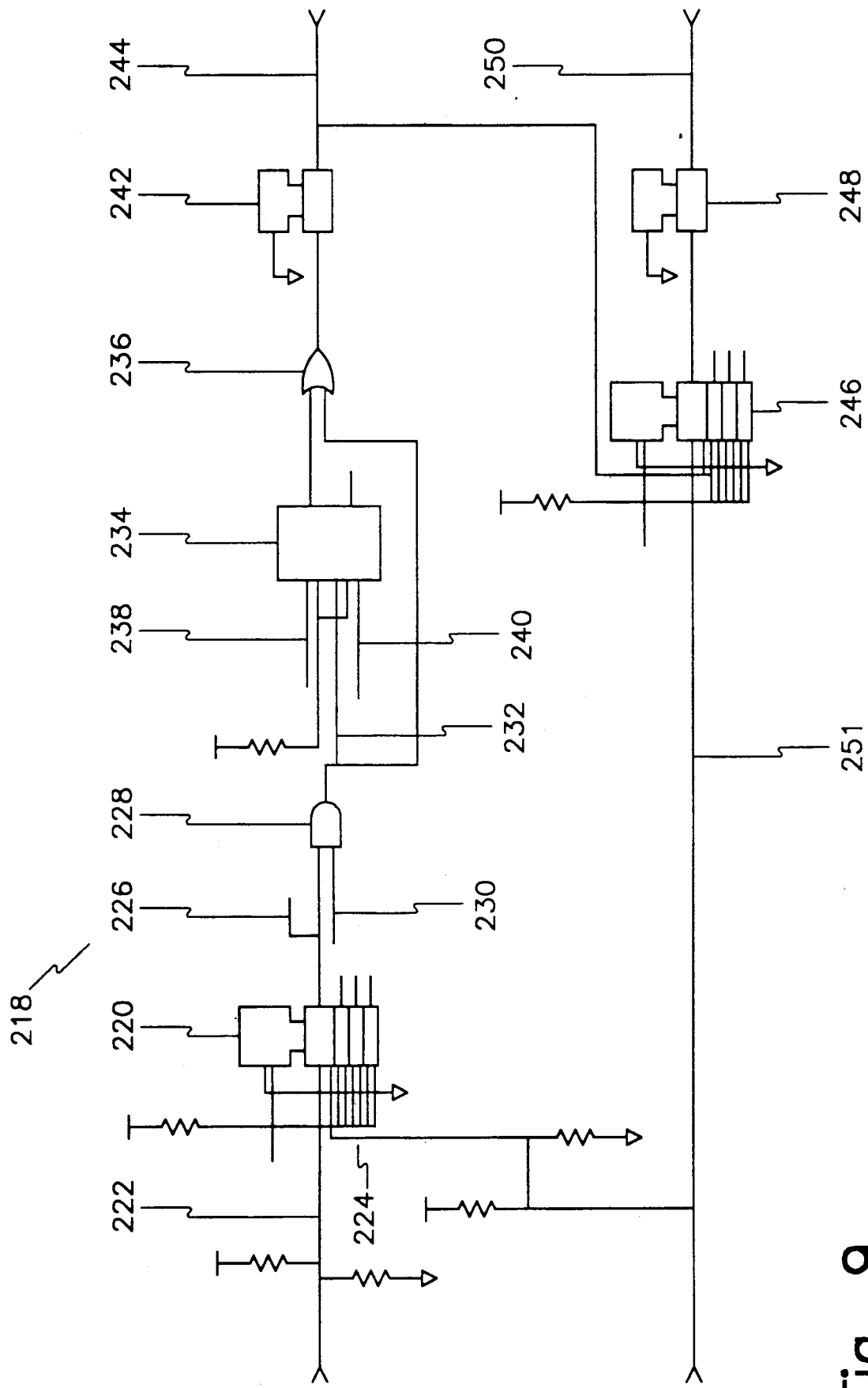
FIG. 9 is a schematic of the portion of the high-speed link contained within each module that is used to coordinate the execution of a test plan by two or more modules.

With reference to FIG. 9, the portion of the high-speed link I/O device that allows the CPU associated with the testhead module to communicate with the CPUs in adjacent testhead modules in the communication path or loop, i.e., the CPU synchronization circuitry 218, is described. The high-speed link 118, for a fully populated testhead, provides two communication paths or which the four testhead modules can be used. The five possible combinations in which the four testhead modules can be utilized are: all four testhead modules operating together or coupled (4): three testhead modules operating together, and one testhead module operating independently or in an idle state (3-1); two testhead modules operating together, and two testhead modules operating independently or in an idle state (2-1-1); all four testhead modules operating independently or in an idle state (1-1-1-1); and two pairs of testhead modules operating together (2-2). The coupled testhead modules in the (4), (3-1) and (2-1-1) combinations of testhead modules require a single communication loop. In contrast, the (2-2) combination of testhead modules requires two, independent communication loops since each pair of coupled testhead modules requires an independent communication path. The two communications loops required in a testhead having four testhead modules are formed by partitioning a single communication loop into two, independent communication loops, referred to hereinafter as the forward loop and the backward loop. In a testhead having more than four testhead modules, an independent communication path is provided for each pair of testhead modules. Preferably, a single communication path is partitioned to realize multiple, independent communication paths in this situation. For example, in a testhead having eight testhead modules, four independent communication paths are provided to accommodate the possibility of four pairs of testhead modules operating independently of one another. The four independent communications being formed by the partitioning of a single communication loop. The four independent communications paths are formed by partitioning a single communication loop. The (1-1-1-1) combination of testhead modules does not require a communication loop since each module operates independently.

The CPU synchronization circuitry 218 includes a first multiplexer (MUX) 220 which can be programmed by the CPU to output a PSYNC signal received on either the PSYNC forward in (PSYNCFI) line 222 or the PSYNC backward in (PSYNCBI) line 224. The PSYNC signal is a digital signal that can be set or reset and is used by the CPUs in the testhead modules to coordinate their operations. The output of the first MUX 220 is provided to a PSYNC interrupt (PSYNC_I) line 226 which, when the PSYNC signal is set, results in the CPU being interrupted and, hence, informed that a set PSYNC signal has been received. The signal output by the first MUX 220 is also supplied to an AND gate 228 which outputs the logical AND of the signal output by the first MUX 220 and a pass-through-enable (PTE) signal generated by the CPU on a PSYNC pass-through-enable (PSYNC_PTE) line 230. Consequently, if the first MUX 220 outputs a set PSYNC signal and the CPU associated with a testhead module reset the PTE signal, then the output of the AND gate 228 is reset. If, on the other hand, the CPU sets the PTE signal and the PSYNC signal is also set, then the output of the AND gate 228 is set.

The signal output by the AND gate is applied to the CLOCK input 232 of a D-type flip-flop 234 and an OR gate 236. The D-type flip-flop 234 includes a "D" input that is tied high or permanently-set. (The D-type flip-flop 234 is actually a J-K flip-flop with its "J" input set and its "K" input reset.) Consequently, the D-type flip-flop 234 operates such that its output signal is set whenever it is clocked, i.e., whenever the CLOCK input 232 is set. The signal output by the D-type flip-flop 234 is, like the signal output by the AND gate 228, applied to the OR gate 236. The D-type flip-flop 234 also includes a SET (preset) input 238 and a RESET (clear) input 240 for initializing and asserting the output of the flip-flop. The OR gate 236 outputs the logical OR of the output signals of the AND gate 228 and the D-type flip-flop 234. The signal output by the OR gate 236 is then applied to a first buffer 242 which passes the signal to a PSYNC forward output (PSYNCFO) line 244. A second MUX 246 can be programmed by the CPU to route the signal on the PSYNCFO line 244 through a second buffer 248 onto a PSYNC backward out (PSYNCBO) line 250 that is used in the (2-2) testhead configuration to establish a local communication loop between two adjacent testhead modules. An electrical connection 251 for use in establishing communication loops in a testhead having more than four testhead modules extends between the first MUX 220 and the second MUX 246.

The operation of the high-speed link 118 will now be described with respect to the forward loop which is, preferably, used to synchronize the operation of the CPUs in the coupled modules when the testhead is in a (4), (3-1) or (2-1-1) configuration. For any particular board test the high-speed link 118 is initially configured such that a MASTER testhead module and one or more SLAVE testhead modules are defined among the coupled testhead modules. For example, in the (3-1) configuration one of the three coupled modules is defined to be a MASTER testhead module and the other two testhead modules are defined to the be SLAVE modules for a given board test. The MASTER testhead module sets the PSYNC signal, while the SLAVE testhead modules receive and propagate the set PSYNC signal around the loop and ultimately back to the MASTER testhead module. The uncoupled modules are known as PASSIVE modules. The MASTER testhead module is defined by resetting the PTE signal in the CPU synchronization circuitry 218 associated with the MASTER testhead module. Resetting the PTE signals prevents a set PSYNC signal from propagating past the AND gate 228. The SLAVE testhead modules are defined by setting the PTE signals in the CPU synchronization circuitry located in each of the SLAVE testhead modules. Setting the PTE signals in the SLAVE testhead modules allows a set PSYNC signal received by the first MUX to be propagated through to the next testhead module in the forward loop. Specifically, the set PSYNC signal passes through the AND gate, since the PTE signal is set, and through the OR gate to the PSYNCFO line. The PASSIVE modules are defined by setting the PTE signals in the interface circuitry 218 associated with each of the passivated modules and setting the RESET (clear) input 240 of the D-type flip-flop 234. This allows a set PSYNC signal to be propagated through to the next module in the loop. For example, in the (2-1-1) the two uncoupled testhead modules are passivated so that a set PSYNC signal produced by one of the two coupled testhead modules is propagated through each of the passivated testhead modules to the other of the two coupled testhead modules. The PASSIVE testhead modules ignore the interrupt produced by the set PSYNC signal by masking the interrupt on the PSYNC_I line 226. Specifically, the CPU in a PASSIVE testhead module establishes the mask such that interrupts produced on the PSYNC_I line 226 are ignored. In essence, the mask acts as a switch that effectively uncouples the PASSIVE testhead modules from the high-speed link in the (3-1) and (2-1-1) testhead configurations. In addition, the output of the D-type flip-flop 234 in the CPU synchronization circuitry 218 of each of the testhead modules is initially reset by setting the SET input 238 and resetting the RESET input 240. Also, before a board test is conducted the first MUXs in the CPU synchronization circuitry associated with each of the testhead modules is configured to output the PSYNC signal received on the PSYNC forward in lines. Consequently, prior to the execution of a board test the MASTER, SLAVE and PASSIVE testhead modules are defined, the outputs of all of the D-type flip-flops are reset and the first MUX in each testhead module is configured to output the PSYNC signal received on the PSYNC forward in lines.

A PSYNC sequence for coordinating the operation of two or more CPUs associated with two or modules is initiated by the CPU in the MASTER testhead module asserting or setting the output of its D-type flip-flop by resetting the SET input 238 and setting the RESET input 240. The output of the MASTER testhead module's D-type flip-flop is a set PSYNC signal. The set PSYNC signal propagates through the MASTER testhead module's OR gate and buffer to the forward output line. The set PSYNC signal on the forward output line then propagates through a ribbon cable to the forward input line of a SLAVE or PASSIVE testhead module. If the set PSYNC signal is input to a PASSIVE testhead module, then it is propagated to the PSYNC forward output line, since the PTE signal is set, and input to the next testhead module in the forward loop. If, on the other hand, the set PSYNC signal is input on the PSYNC forward in line of a SLAVE testhead module, then the output of the SLAVE testhead module's CPU is interrupted thereby informing the CPU that a PSYNC sequence is being initiated. Next, the set PSYNC signal propagates through the AND gate since the PTE signal is set. The set PSYNC signal, i.e., output of the AND gate, is then applied to the CLOCK input of the D-type flip-flop and to the OR gate. The OR gate of the SLAVE testhead module propagates the set PSYNC signal through the buffer to the PSYNC forward output line of the SLAVE testhead module. In this fashion the set PSYNC signal is propagated among the coupled testhead modules in the forward loop. The output of the SLAVE testhead module's D-type flip-flop, in response to being clocked by the set PSYNC signal, is set to a logical-one.

The aforementioned process is repeated with respect to all of the PASSIVE and SLAVE testhead modules in the forward loop until the set PSYNC signal returns to the MASTER testhead module. At the MASTER testhead module, the set PSYNC signal generates an interrupt that informs the CPU that the set PSYNC signal has been successfully propagated around the forward loop. In contrast, if the set PSYNC signal does not return to the MASTER testhead module within a specified amount of time, then the MASTER testhead module's CPU informs the SPU 56, if possible, that the integrity of the high-speed link 118 has been compromised. The interrupt also informs the testhead module's CPU that the output of the D-MASTER type flip-flops in all of the SLAVE testhead modules are set. Due to the reset PTE signal, the output of the MASTER testhead module's AND gate remains reset and, hence, the set PSYNC signal is prevented from propagating around the loop a second time. Consequently, once the set PSYNC signal has been propagated from the MASTER testhead module, through any SLAVE testhead modules and any PASSIVE testhead modules, and returned to the MASTER testhead module, the outputs of all of the D-type flip-flops are set. Hence, the CPUs associated with the SLAVE testhead modules have a device for indicating to the MASTER testhead module when they are ready to execute a particular instruction or set of instructions associated with a particular board test, i.e., they can reset their D-type flip-flops.

When the MASTER testhead module is ready to continue the board test the CPU sets the SET input and resets the RESET input of its D-type flip-flop to reset the output of the flip-flop, i.e., to reset the PSYNC signal. The reset PSYNC signal propagates through the OR gate to the buffer and the PSYNC forward output line. The PSYNC forward output line, in turn, provides the reset PSYNC line to the next testhead module in the forward loop. If the next module in the forward loop is a PASSIVE module, then the reset PSYNC signal is, due to the set PTE signal and the reset output of the D-type flip-flop, propagated through to the PSYNC forward output line and onto the next module in the forward loop. When the next testhead module in the forward loop is a SLAVE testhead module the reset PSYNC signal propagates through to the OR gate where it is logically OR'd with the output of the D-type flip-flip. The output of the D-type flip-flip remains set, as established by the set PSYNC signal, until it is reset by the CPU associated with the SLAVE testhead. Hence, the output of the OR gate remains set on the PSYNC forward out line thereby maintaining the set PSYNC signal for all testhead modules in the forward loop located intermediate to the SLAVE testhead module and the MASTER testhead module. Consequently, any one SLAVE testhead module can prevent the reset PSYNC signal from reaching the MASTER testhead module by maintaining the output of its D-type flip-flop set. When the CPU associated with the SLAVE testhead module wishes to indicate that it is ready to execute or is executing the appropriate instructions or set of instructions for a particular board test, it resets the output of the D-type flip-flop. Resetting the output of the D-type flip-flop resets the PSYNC signal at the output of the OR gate. The reset PSYNC signal then propagates through the buffer and out onto the PSYNCFO line which communicates with the next testhead module in the forward loop. Once all of the SLAVE modules indicate that the proper instructions are being executed for a particular board test by resetting the output of their D-type flip-flops the reset PSYNC signal is propagated back to the MASTER testhead module where it causes an interrupt that informs the CPU that it can now execute its instruction or set of instructions for the particular board test.

The high-speed link 118 is unnecessary with respect to the (1-1-1-1) testhead configuration since none of the testhead modules are coupled. However, the CPUs associated with each of the testhead modules masks off the interrupts generated on the PSYNC_I line to prevent any stray signals being propagated around the loop from interrupting the operation of the CPUs. The CPUs can also reset the PTE signal to prevent any signals from being propagated around either the forward or backward loop.

The operation of the high-speed link 118 with respect to the synchronization of the CPUs when the testhead is in a (2-2) or dueling-dual configuration is now described with respect to a single pair of coupled testhead modules. For purposes of the following description, the individual modules in the pair are referred to as the first testhead module and the second testhead module. The other pair of coupled modules operate in an identical fashion. Initialization of the first and second testhead modules involves the designation of a MASTER and a SLAVE testhead module by, respectively, resetting and setting the PTE signals as previously described. The outputs of the D-type flip-flops associated with both the first and second testhead modules are reset by setting the SET inputs and resetting the RESET inputs of the D-type flip-flop as also previously described. Additionally, the CPUs associated with the first and second modules establish a local communication link that does not involve the communication of any signals to the other pair of testhead modules. To establish the local communication path the CPU associated with the first testhead module programs its first MUX such that it receives and outputs the PSYNC signal received on the PSYNCBI line 224. The PSYNC signal output on the first module's PSYNCFO line propagates over the ribbon cable to the PSYNCFI line of the second module. The interface circuitry of the second module, in turn, propagates the PSYNC signal through to its PSYNCFO line. However, the PSYNC signal propagated from the second module's PSYNCFO to the PSYNCFI line of a third module is ignored because the first MUX associated with the third module is programmed to ignore any PSYNC signal on its PSYNCFI line. Rather the CPU associated with the second module programs its second MUX such that the PSYNC signal is established on the PSYNCBO line. The PSYNCBO line of the second module is connected to the PSYNCBI line of the first module which has its first MUX configured such that the PSYNCBI signal is propagated on as PSYNC. Consequently, by properly programming the first and second MUXs associated with each of the testhead module pairs, two local communication paths are established. The operation of the interface circuitry once the high-speed link 118 is configured to accommodate a (2-2) testhead configuration is identical to that described with respect to the (4), (3-1) and (2-1-1) testhead configuration.

The high-speed link 118 can also be utilized to transfer the MASTER status from a first testhead module to a second (SLAVE) testhead module in order to accommodate the requirements of a particular board test. The transfer of the MASTER status is initiated by the CPU in the first testhead module resetting the SET input and setting the RESET input to set the output of its D-type flip-flop, i.e., the first module sets the PSYNC signal. The set PSYNC signal is propagated around the communication loop, as described hereinabove, until it reaches the second module. In response to the interrupt generated by the set PSYNC signal the CPU of the second testhead module establishes its MASTER status by resetting its PTE signal. The second testhead module also responds to the interrupt by using the SET and RESET inputs to reset the output of its D-type flip-flop. Since the PTE signal and the output of the D-type flip-flop in the second testhead module are reset, the output of the second module's OR gate is also reset.

While the second testhead module is in the process of responding to the interrupt and assuming MASTER status, the set PSYNC signal is propagated around the communication loop, in the manner described above, until it returns to the first testhead module where it interrupts the CPU. At this point the outputs of the D-type flip-flops associated with the first testhead module and all testhead modules in the communication loop located intermediate to the first and second testhead modules in the direction in which the PSYNC signal is being propagated around the communication path are set. The first testhead module's CPU services the interrupt by setting the PTE signal to change its status from MASTER to SLAVE. The first testhead module will now function to propagate the PSYNC signal established by the second module to the next testhead module in the loop, rather than initiate a PSYNC signal. The first testhead module's CPU also utilizes the SET and RESET inputs to reset the output of its D-type flip-flop. Consequently, since the first module's PTE signal is now set and the output of its D-type flip-flop is reset when the input PSYNC signal is reset, then the output of its reset. The reset PSYNC signal generates an interrupt in any testhead modules which are located intermediate to the first module and the second module in the direction in which the PSYNC signal is propagated around the communication loop. The interrupt is serviced in any such SLAVE testhead modules by using the SET and RESET inputs to reset the output of the D-type flip-flops.

Similarly, since the PTE signal and output of the D-type flip-flop of the second testhead module are reset the output of its OR gate is also reset, i.e., the PSYNC signal generated by second module is reset. The reset PSYNC generates an interrupt in any testhead modules that are located intermediate to the second testhead module and the first testhead module in the direction in which the PSYNC signal is propagated around the communication loop. The interrupt is serviced in any such SLAVE testhead modules by using the SET and RESET inputs to reset the output of the D-type flip-flops. When the reset PSYNC signal is propagated back to the second testhead module, the new MASTER testhead module, the interrupt is serviced to complete the MASTER status transfer. Consequently, at the end of the MASTER status transfer the first module is a SLAVE testhead module, the second module is a MASTER testhead module, and all of the D-type flip-flops are reset.

Figure 10A:
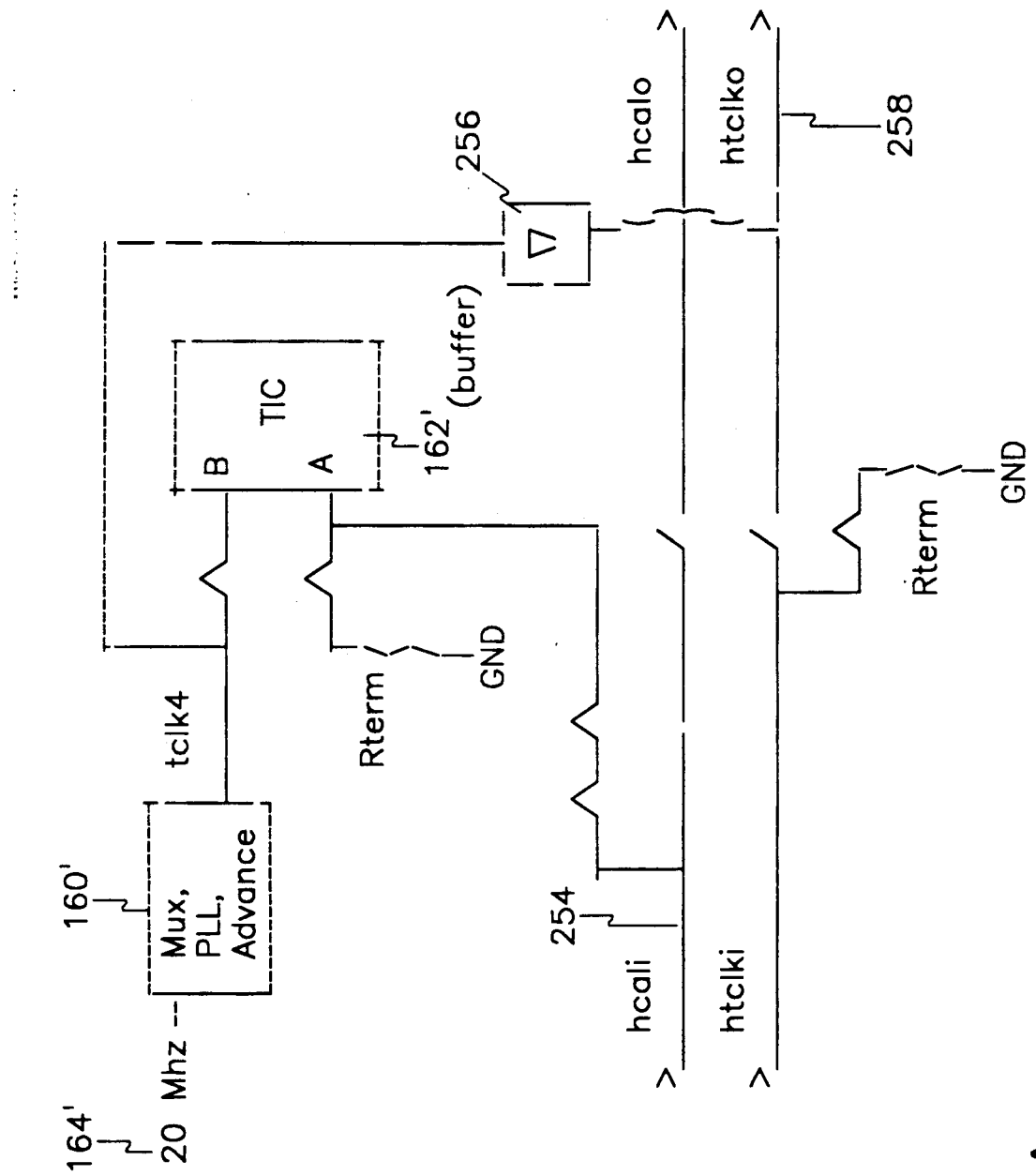
FIG. 10A illustrates the circuitry associated with a master module for calibration of the high-speed link.
Figure 10B:
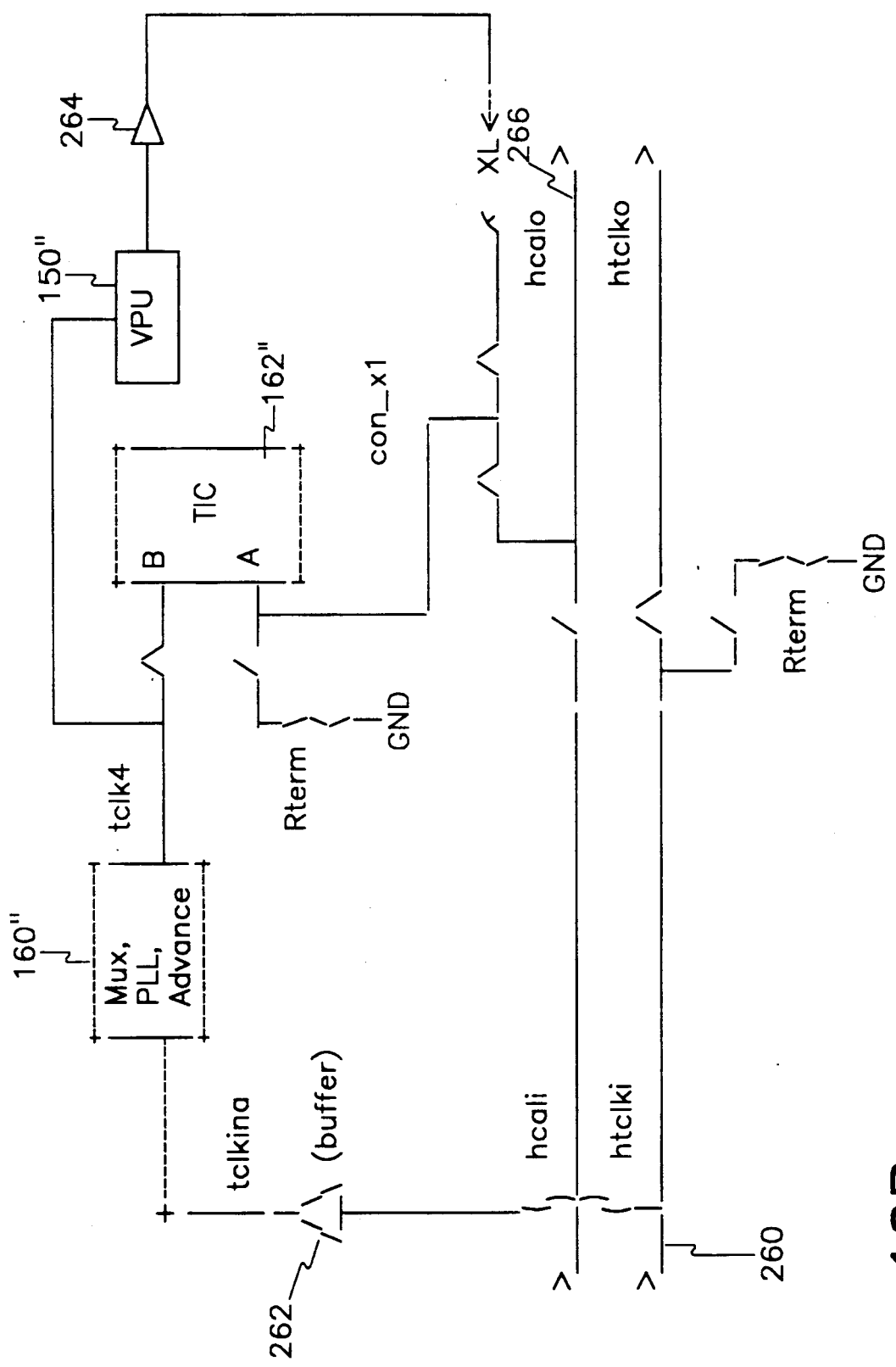
FIG. 10B illustrates the circuitry associated with an active slave module for calibration of the high-speed link.
Figure 10C:
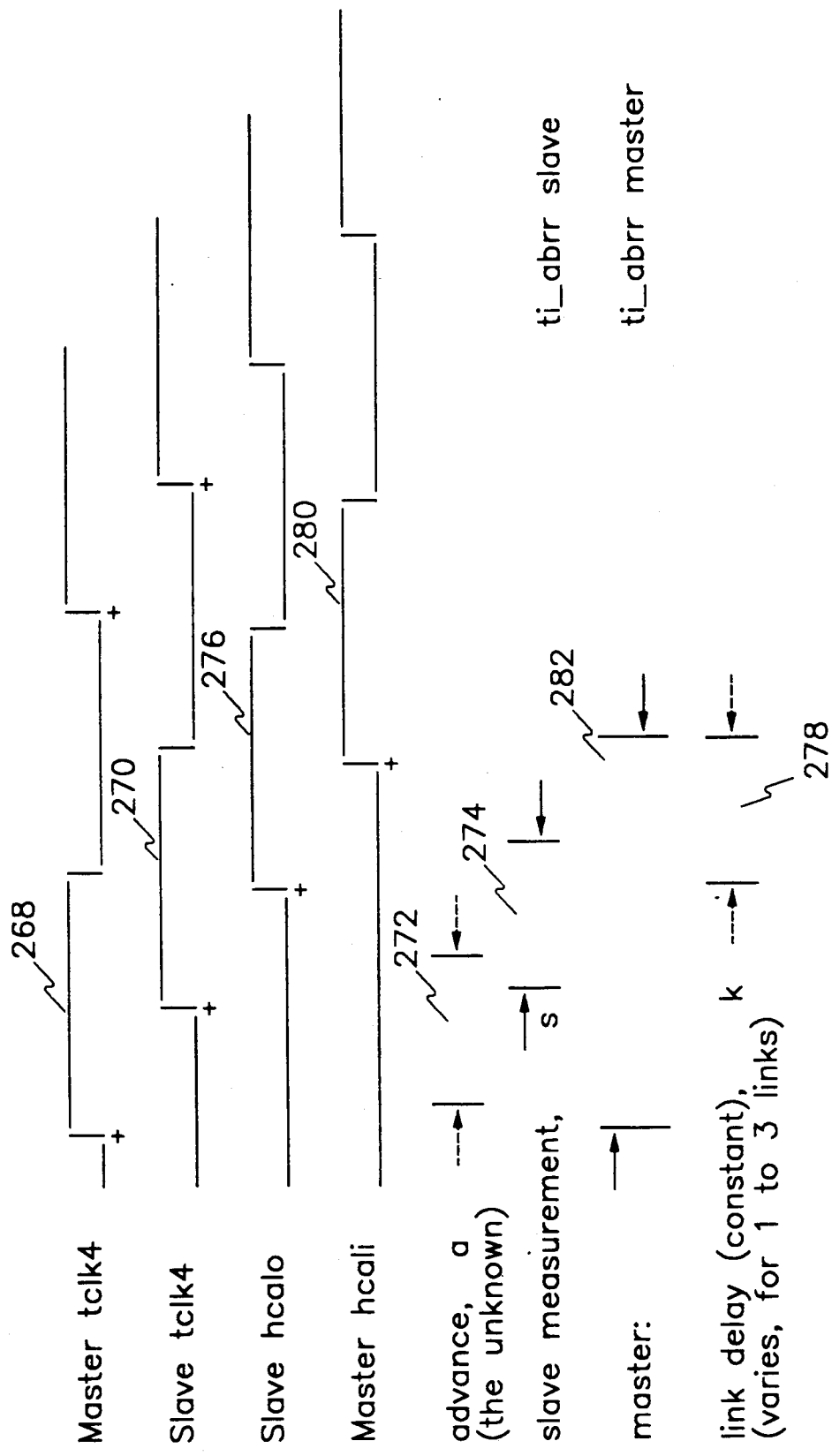
FIG. 10C is a timing diagram that illustrates the use of certain signals to determine the propagation delay between a master module and an active slave module.

With reference to FIGS. 10A–C, the portion of the high-speed link I/O device 146 associated with VPU synchronization is described. Synchronization of the VPUs associated with two or more coupled testhead modules is required so that a vector generated by the VPUs during a test that requires digital resources appears, relative to the circuit board being tested, to be from a single module. The individual VPUs generate their portion of a vector based upon the TCLK signal produced by TCLK generator resident on the module's MAC card. Consequently, to make a vector produced by two or more modules appear to be from a single module requires that the TCLK signals produced by the TCLK generators in each of the coupled testhead modules be synchronized. Specifically, it is required that the TCLK signals produced in each SLAVE testhead module be synchronized with the TCLK signal produced by the MASTER testhead module. Synchronization is achieved by propagating the TCLK signal produced by the MASTER testhead module over the high-speed link 118 to each of the SLAVE testhead modules where it is used to drive the TCLK generators in the SLAVE testhead module. However, the length of the communication path between the MASTER and SLAVE testhead modules together with buffers located along the line produce a propagation delay that must be determined so that the TCLK generators in the SLAVE testhead modules can be adjusted (calibrated) and brought into synchronization with the MASTER testhead module's TCLK. The propagation delay, as described more fully hereinafter, is essentially determined by producing a communication loop over which the MASTER testhead module's TCLK signal is propagated to a particular SLAVE testhead module and returned to the MASTER testhead module. By determining the total time it takes to propagate the TCLK signal from the MASTER testhead module to the SLAVE testhead module and back to the MASTER testhead module and determining the delay, associated with all parts of the loop except the portion between the MASTER and SLAVE testhead modules the delay can be determined. Since, as previously described, any of the coupled testhead modules can have MASTER status the propagation delays for each MASTER/SLAVE combination for a given testhead configuration must be determined. For instance, if the testhead is in a (2-1-1) configuration and the four testhead modules are referred to as modules "A", "B", "C" and "D", then there are several (2-1-1) combinations for which propagation delays must be determined. For instance, the (2-1-1) combination where modules "A" and "B" are the coupled modules and the (2-1-1) combination where modules "B" and "C" are the coupled modules. The relevant delays with respect to, for instance, the (2-1-1) combination where modules "A" and "B" are the coupled modules, are the delays when the MASTER/SLAVE relationships are "A"/"B" and "B"/"A". One delay will be defined by the buffers and cables located immediately intermediate to modules "A" and "B", while the other delay will be defined by the buffers and cables extending between the PASSIVATED modules.

The following describes the components in the MASTER and SLAVE testhead modules that are used to determine the propagation delay between the two modules so that a SLAVE testhead module's TCLK generator can be adjusted such that its TCLK signal is synchronous with the TCLK signal produced by a MASTER testhead module's TCLK generator. To differentiate the components of the two modules the MASTER testhead module's components are denoted by a prime and the SLAVE testhead module's components are denoted by a double prime. The components on the MAC card 128' of the MASTER testhead module that are used to determine the propagation delay between the MASTER testhead module and a SLAVE testhead module include the DUTCLK 164' which generates a 20 MHz signal that drives the TCLK generator 160'. The TCLK generator 160', in turn, outputs a TCLK signal that is used to drive the TCLK generator of the SLAVE testhead module. The MASTER testhead module utilizes the TIC 162' to measure the time it takes for the TCLK signal to propagate to the SLAVE testhead module of a TCLK output line associated with the high-speed link and back to the MASTER testhead module on a calibration line. A calibration input (CALI) line 254 constitutes the portion of the calibration line resident in the MASTER testhead module. An output buffer 256 is used to establish the TCLK signal produced by the TCLK generator 160' on a TCLK output (TCLKO) line 258 of the high-speed link 118.

The components on the MAC card 128'' of the SLAVE testhead module that are used to determine the propagation delay include a TCLK input (TCLKI) line 260 that receives the TCLK signal output by the MASTER testhead module on the TCLKO line 258. The TCLKI line 260 provides the TCLK signal to an input buffer 262 that, in turn, provides the TCLK signal produced by the MASTER testhead module to the TCLK generator 160''. The output buffer 256, the TCLKO line 258, the TCLKI line 260, the input buffer 262 and any ribbon cable extending between the TCLKO line 258 and the TCLKI line 260 define the unknown propagation delay between the MASTER and SLAVE testhead modules. The TCLK generator 160'' outputs a TCLK signal based upon the delayed TCLK signal received from the input buffer 262. The SLAVE testhead module also utilizes the VPU 150'' and a test pin driver 264 to simulate the generation of the portion of a vector that would be produced by the SLAVE testhead module in response to a TCLK signal during an actual test. The SLAVE testhead module further utilizes the TIC 162'' to determine the time required for the VPU 150 and the test pin driver 264 to propagate the TCLK signal generated by the TCLK generator 160''. The TCLK signal produced by the test pin driver 264 is output on a calibration output (CALO) line 266 on the high-speed link 118. The TCLK signal on the CALO line 266 propagates back to the CALI line 254 on the MASTER testhead module. The calibration line on the high-speed link 118, which includes CALO line 266 and CALI line 254, is free of any buffers. Consequently, the propagation delay attributable to the calibration line is readily determined and is a known value for all combinations of MASTER and SLAVE testhead modules in a given testhead configuration With reference to FIG. 10C, the delay or difference between the TCLK signals generated by the MASTER and SLAVE testhead modules that is attributable to the output buffer 256, the TCLKO line 258, the TCLK line on the high-speed link 118, the TCLKI line 260 and the input buffer 262 is determined by initially generating a TCLK signal 268 using the TCLK generator 160' associated with the MASTER testhead module. The TCLK signal 268 is applied to the "B" input of the TIC 162' which, upon detecting the first rising edge of the TCLK signal 268, starts a timer that measures the time it takes for the TCLK signal to travel from the MASTER testhead module to the SLAVE testhead module and return. The TCLK signal 268 is also applied to the output buffer 256 which, in turn, propagates the TCLK signal 268 out onto the TCLKO line 258. Once on the TCLKO line 258 the TCLK signal 268 is propagated over the TCLK line of the high-speed link 118 to the TCLKI line 260 of the SLAVE testhead module. The TCLK signal 268 is then, via the input buffer 262, used to drive the TCLK generator 160''. Due to the delay in propagating the TCLK signal 268 from the MASTER testhead module to the SLAVE testhead module the TCLK signal 270 produced by the TCLK generator 160'' is out of phase with the TCLK signal 268 produced by the TCLK generator 160' by an unknown delay 272. The TCLK signal 270 produced by the TCLK generator 160'' is applied to the VPU 150'' and the "B" input of the TIC 162''. The TIC 162'', upon detecting the rising edge of the TCLK signal 270 on its "B" input, begins a timer that is used to determine the time necessary for the TCLK signal 270 to propagate through the VPU 150'' and the test pin driver 264. The VPU 150'' and the test pin driver 264 inject a first delay 274 into the TCLK signal 270 that simulates the delay which would be experienced in generating a portion of a test vector. The delayed TCLK signal 276 output by the test pin driver 264 is applied to the "A" input of the TIC 162'' which, upon detecting the rising edge of the TCLK signal 276, halts the timer. Consequently, the TIC 162'' operates to determine the first delay 274 in the TCLK signal that is produced by the VPU 150'' and the test pin driver 264. The TCLK signal 276 output by the test pin driver 264 is also applied to the CALO line 266, the calibration line of the high-speed link 118 and the CALI line 254 which injects a known second delay 278. Due to the known second delay 278, a TCLK signal 280 arrives at the CALI line 254 of the MASTER testhead module. The TCLK signal received on the CALI line 254 is applied to the "A" input of the TIC 162' to halt the timer and, hence, define the time 282 necessary for the TCLK signal to propagate from the MASTER testhead module to the SLAVE testhead module and return.

At this point there is sufficient information to determine the unknown delay 272 that is attributable to the output buffer 256, the TCLKO line 258, the TCLK line on the high-speed link 118, the TCLKI line 260 and the input buffer 262. More specifically, the TCLK signal has been propagated over a loop having the following three sections: (1) a first section defined by the output buffer 256, the TCLKO line 258, the TCLK line on the high-speed link 118, the TCLKI line 260 and the input buffer 262; (2) a second section defined by the VPU 150 and the test pin driver 264; and (3) a third section defined by the CALO line 266, the calibration line on the high-speed link 118 and the CALI line 254. The propagation delay imposed on the TCLK signal by the first section of the loop is unknown. However, the propagation delays imposed on the TCLK signal due to the second and third sections of the loop are known. Further, the time necessary to propagate the TCLK signal around the entire loop is also known. Consequently, the unknown propagation delay due to the first section of the loop can be determined by subtracting the known delays attributable to the second and third sections of the loop from the total delay. Once the delay attributable to the first section is known the TCLK generator 160,, can be adjusted such that the TCLK signals used in both the MASTER and SLAVE testhead modules are in phase and, hence, can be used to generate a test vector that will appear to the circuit board under test to be from a single module.

The aforementioned process for determining the unknown propagation delays between coupled testhead modules is repeated for each MASTER/SLAVE combination for a given testhead configuration. The propagation delays are placed in a look-up table that can be accessed by the SLAVE testhead modules to adjust their TCLKs so that they are synchronous with the MASTER testhead module's TCLK. Such an adjustment would occur, for instance, every time the MASTER status is transferred from one testhead module to another testhead module.

Once the TCLKs of the coupled testhead modules are synchronized the CPU associated with the MASTER testhead module can cause a vector to be output by the coupled modules that appears to be from a single module by setting an HSTART signal that is propagated around the high-speed link 118. The VPUs in the coupled modules commence operation, i.e., outputting vectors, after the first rising edge of the TCLK signal following the setting of the HSTART signal.

Figure 11:
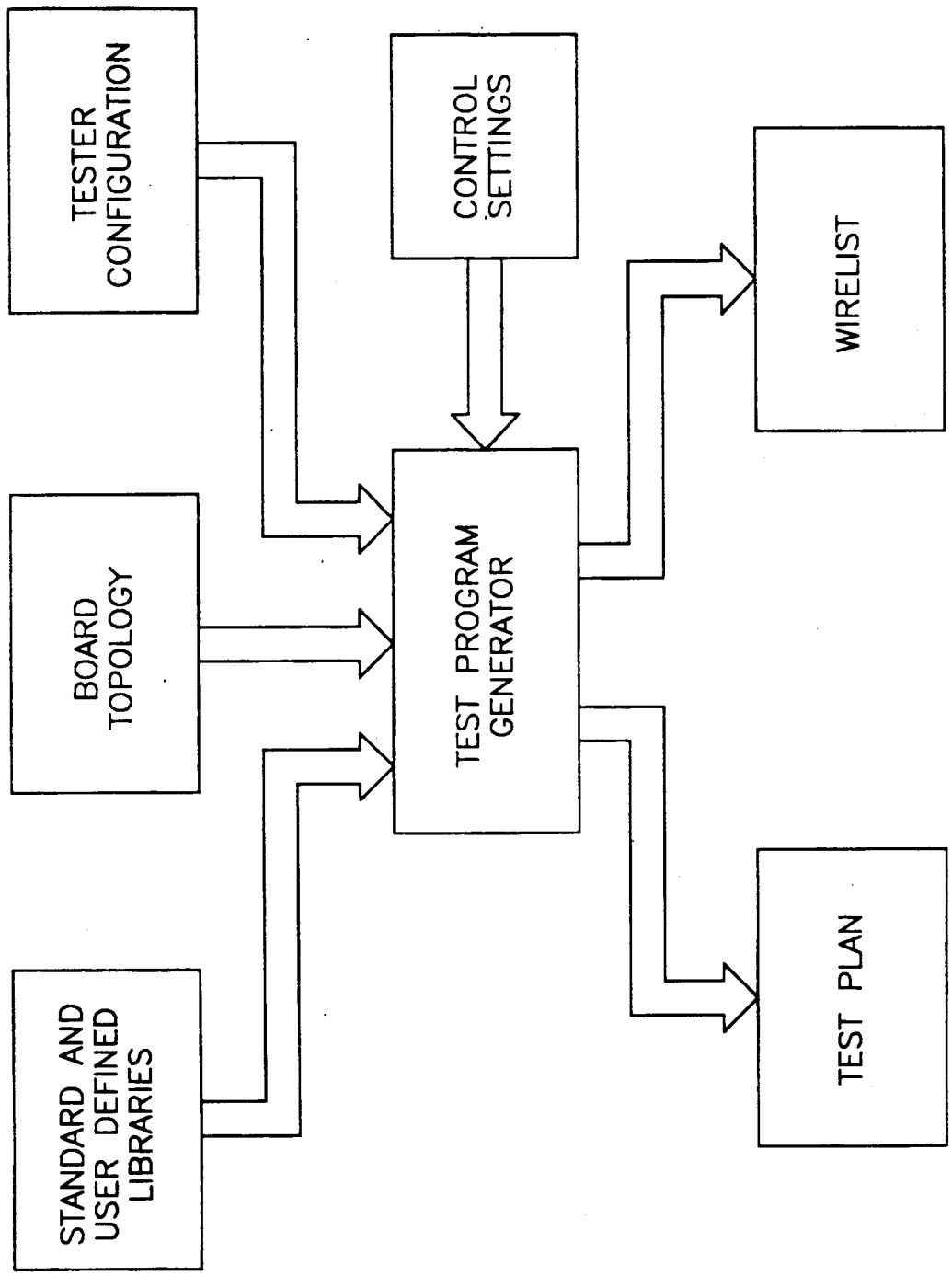
FIG. 11 is a general block diagram of the process used to generate a test plan and a wire list for a circuit board.

Having described the components of the tester 50 and their individual functions it is now necessary to describe the development and execution of a test plan by the tester 50. With reference to FIG. 11, development of a test plan for a particular circuit board involves the execution of a test program generator program by the SPU 56. The test program generator produces a test plan and a wirelist based upon the topology of the circuit board to be tested, inputs from standard and/or user defined libraries that contain tests for the various components on the circuit board, the configuration of the tester, and control settings. The topology of the circuit board, in essence, identifies the devices or circuits residing on the circuit board and the location of the nodes associated with the device or circuits. The standard and/or user defined libraries define tests for the devices or circuits on the circuit board. Generally, the tests provided by the libraries can be conceptualized as a definition of the various combinations of inputs that the device or circuit is responsive to, and the corresponding outputs. The configuration of the testhead includes both the physical and logical configurations of the testhead. The physical configuration is a definition of which modules comprise the testhead. For example, the physical configuration of testhead 116 shown in FIG. 2 includes testhead modules 120a–d. The logical configuration of the testhead specifies how the testhead is partitioned. For example, in a testhead having four testhead modules, two of the testhead modules could be dedicated to the testhead modules could be reserved for the testing of second and third circuit boards. Additionally, the physical configuration is representative of the total amount of test resources provided by the testhead and the logical configuration is a representative of how the total amount of resources, on a module by module basis, are allocated. The control settings allow the user of the tester 50 to specify acceptable tolerances and the like. The wire list produced by the test program generator defines which personality pins are to be connected to which probe pins by a wire wrap in order to establish an electrical path between a specific node on the circuit board and a module interface pin associated with a test resource. The test program generator also generates a test plan for the circuit board which, in essence, defines how the resources of the testhead are applied to the circuit board in order to test the devices and circuits.

Figure 12:
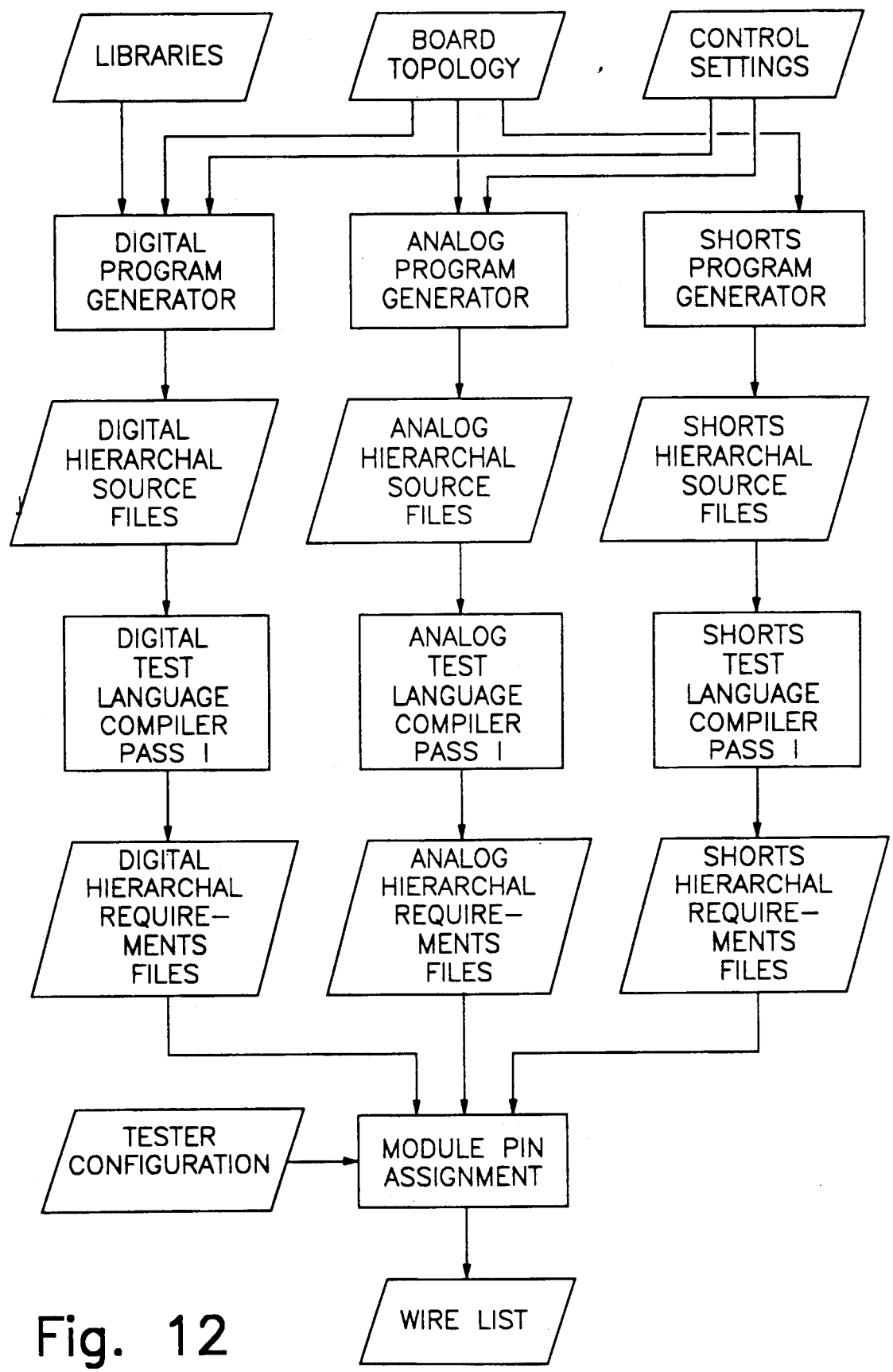
FIG. 12 is a more detailed block diagram of the process for generating the wire list that is used to construct the test fixture for interfacing a circuit board with the modular/concurrent circuit board tester.

With reference to FIG. 12, the operation of the test program generator is discussed in greater detail. The test program generator includes a digital program generator for processing digital devices or circuits, an analog program generator for processing analog devices or circuits and a shorts program generator for generating a program to determine if there are any short circuits on the circuit board. Other types of program generators are also feasible. Further, combinations of program generators can be used with devices that are both analog and digital in nature, such as analog-to-digital converters.

The digital program generator outputs or generates a digital source file based upon information obtained from the standard and/or user defined libraries and the control settings for each digital device or circuit specified in the circuit board topology. An individual digital source file specifies, in a high-level, digital test language, what test resources are necessary to test a particular digital device and what action is to be performed with the test resource. Once all of the digital source files for a circuit board have been generated by the digital program generator, a digital test language compiler makes a first pass through each of the digital source files and generates corresponding digital requirements files. An individual digital requirements file indicates the resources that are required by each node associated with the particular digital device or circuit to be tested.

The analog program generator outputs an analog source file, which takes into account the control settings, for each analog device or circuit specified in the circuit board topology. An individual analog source file specifies, in a high-level, analog test language, the test resources necessary to test an analog device residing on the circuit board and the action to be performed with the test resources. Following generation of the analog source files by the analog program generator, an analog test compiler is employed to process the analog source files and generate corresponding analog requirements files. An individual analog requirements file specifies the resources that are required by each node associated with the particular analog device or circuit to be tested.

The shorts program generator produces shorts source files, written in a high-level, shorts language, based upon the circuit board topology. An individual shorts source file indicates the test resources necessary to perform a shorts test on the circuit board and how the test resource are to be used in conducting the shorts test. Once all of the shorts source files for a circuit board have been generated by the shorts program generator, a shorts test compiler makes a first pass through the shorts source files and generates corresponding shorts requirements files. An individual shorts requirements file specifies the resources that are required by each node on the circuit board in order to perform a shorts test.

The test program generator further includes a module pin assignment (MPA) program that generates a wire list as a result of allocating the resources of the testhead based upon the requirements specified in the requirements files and the available resources as specified in the testhead configuration. The wire list defines which personality pins are to be connected to which probe pins by a wire wrap in order to establish an electrical path between a specific node on the circuit board and a module interface pin associated with a particular test resource.

With reference to FIGS. 13A-G, the MPA program is described first at a general functional level and then at a more detailed level. At the general functional level, the MPA Program includes a MAIN processing loop that is primarily responsible for executing initialization procedures and controlling the general sequence in which the resources of the testhead are assigned. The general sequence in which the testhead resources are assigned for a given configuration occurs, in the broadest sense, on a circuit board by circuit board basis. For example, if a first circuit board and a second circuit board are to be tested on a testhead having two or more modules, then the MAIN processing loop assigns the testhead test resources to the first circuit board and then to the second circuit board.

With respect to an individual circuit board, the MAIN processing loop assigns the resources of the testhead to the individual nodes according to a prioritized or ordered list of nodes. Priority in the ordered list is based upon the significance of the resources required by a particular node. For example, a node that is used in several different tests and requires several different types of resources would, most likely, be placed ahead of a node that only required a single test resource for a single test in the ordered list. With respect to a specific node, the ordered list includes an entry or entries that specify the test or tests in which the node is involved. For example, a particular node may be involved in both an analog and a digital test. With respect to each test that the node is involved in, the order list includes an entry or entries of the resources required by the node in order to conduct the test. For example, a node that is involved in an analog test may require a test resource that can provide a specific voltage to test whether a particular resistor possesses a specified resistance.

In assigning the resources of the testhead to individual nodes, the MAIN processing loop utilizes a REQUIRED module subroutine that attempts to assign the resources of the testhead such that any shared and/or legal constraints imposed on a connection are satisfied. A connection is the association of a particular node with a particular test resource during the particular test. A particular test resource is, hereinafter, also referred as a BRC (bank-row-column). A shared constraint is a requirement that the test resource needed by the node currently being processed be allocated from a particular module defined by the prior assignment of a test resource from the particular module to a previously processed node. In other words, if two connections have a shared constraint, i.e., a first node requires a first test resource in a first module and a second node requires a second test resource that is also in the same module in order to conduct the test (the shared constraint), then the REQUIRED module subroutine attempts to satisfy the shared restraint requirement. By requiring that certain specified test resources be allocated from a particular module, the MPA program restricts the signals produced by the specified resources to buses within the particular module that have similar, if not identical, performance characteristics. Consequently, the relative distortion between signals that are propagated over buses within the particular module is relatively minor. This is not the case with signals propagated over buses in two or more different modules. Hence, the shared constraint results in highly accurate measurements of the performance of the particular component. The shared constraint is also used to accommodate other hardware design considerations. A legal constraint is a restriction that two connections in a test cannot use the same test resource. If a shared or legal constraint cannot be satisfied for a connection then the REQUIRED module subroutine utilizes a BACKOUT subroutine to define the status of required module as failing with respect to the connection and to reverse all of the previous successfully assigned connections that have a shared constraint with the connection that could not be assigned. For example, if a first connection is successfully assigned, i.e., a first test resource located in a first module is assigned to a first node for a test, but a second connection that has a shared constraint with the first connection is not successfully assigned, i.e., a second test resource required by a second node in order to conduct the test could not be located in the first module, then the successful assignment for the first connection is removed since the shared constraint could not be satisfied. Upon completion, the REQUIRED module subroutine calls a FREE module subroutine in an attempt to assign any remaining connections.

The BACKOUT subroutine defines the connections that could not be assigned as failing connections and defines the required module that could not provide the needed resource as a failing module. Further, if the failing connection has a shared constraint with any connections that have been previously assigned in the required module then the BACKOUT subroutine reverses these connections. In other words, since the shared constraint could not be satisfied for all connections having the shared constraint then all such connections must be reversed and reassigned elsewhere.

The FREE module subroutine attempts to assign any unassigned connections remaining after execution of the REQUIRED module subroutine. For instance, if a shared constraint associated with a connection was not satisfied in the REQUIRED module subroutine and all of the previously successfully assigned connections with which there was a shared constraint were removed, then the FREE module subroutine attempts to reassign these connections to a free module. If the FREE module subroutine cannot locate and assign a BRC to any one of the remaining connections, then the BACKOUT subroutine is used to define the status of the free module as failing and to reverse all of the previously successfully assigned connections that have a shared constraint with the connection that could not be assigned. The FREE module subroutine repeats the aforementioned process with respect to any remaining free modules. Once all of the free modules have been examined the FREE module subroutine returns control to the MAIN processing loop.

The MAIN processing loop makes two passes through the REQUIRED and FREE module subroutines in order to exhaust all of the possibilities for successfully assigning all of the connections required with respect to a node in the ordered list of nodes. Two passes exhausts all of the possibilities since this results in all four modules of a fully populated testhead being examined to determine whether or not all of the connections associated with the node can be successfully assigned.

If all of the nodes associated with a circuit board are successfully assigned, then the MAIN processing loop proceeds to use a TIMING MASTER subroutine to assign a timing master for each digital test. The timing master is the MASTER testhead module that provides the TCLK signal that is propagated over the high-speed link 118 to the other testhead modules involved in the digital test.

If all of the connections and timing masters associated with a particular circuit board are successfully assigned, then the MAIN processing loop proceeds to process the next circuit board to be tested using the given configuration. If all of the circuit boards are successfully processed, then the MAIN processing loop utilizes an EXIT subroutine that generates the wire list for the test fixture.

If, at any point during the execution of the MPA program, an error is encountered, then an ERROR subroutine is utilized. Typical errors include determinations by one of the aforementioned routines that the resources of the testhead are insufficient for an efficient assignment, a connection cannot be assigned or a timing master cannot be assigned. The ERROR subroutine initially attempts to rectify any error by adding resources to the testhead. For instance, if two testhead modules do not provide enough resources to test a particular circuit board, then the ERROR subroutine adds PIN cards to a third testhead module in an attempt to remedy the problem. The user is informed of the need for additional test resources so that the testhead can actually be augmented. If the addition of resources to the testhead does not remedy the problem, then the ERROR subroutine generates an error report and the MPA program is exited.

The detailed operation of the MPA program is best understood by appreciating the scheme utilized in whole or in part by the MAIN, REQUIRED and FREE routines to locate and assign a test resource that provides the desired test resource to the node and satisfies any connection constraints. Initially, the MPA program looks to the old wirelist, if one exists, to provide the node with the required test resource that satisfies any connection constraints. Typically, the old wirelist is associated with an earlier version of the circuit board to which changes have been made that now require the development of a new test plan and, hence, the execution of the MPA program. Consequently, the MPA program operates to avoid repeating the allocation of resources that are defined in the old wirelist. Next, the MPA program attempts to locate and assign a single available tester resource, hereinafter referred to by its BRC, that satisfies all constraints on all connections within a specified module and provides the desired resource. In other words, the MPA program operates to maximize the utility of the available test resources within a module by locating and assigning a single BRC to the node which satisfies all constraints on all connections. Consequently, other BRCs within the module need not be assigned to the node to satisfy other requirements of the node. Furthermore, the assignment of the single BRC in such a situation requires only one wire wrap in the test fixture 168, i.e., a single wire wrap between the personality pin 186 that contacts the assigned BRC in the module and the probe pin 184 that contacts the node. If more than one such single BRC is available the MPA program operates to minimize the length of the wire wrap extending between the personality pin 186 and the probe pin 184 by opting for the single BRC that is closest to the node. By minimizing the wire length any propagation delay problems are reduced. Next, the MPA program attempts to locate and assign two or more BRCs, which require two or more wire wraps, within a module that together satisfy all constraints for all connections. Again, the MPA program operates in this situation to assign the BRCs that are closest to the node.

Before describing the operation of the MPA program in detail the following terms used in the flowcharts and the description are defined:

(1) node - point on the board under test to which the tester electronics can be connected;

(2) connection - the association of a particular tester resource with a particular node during a particular test;

(3) test - a group of connections which are active simultaneously;

(4) constraint - a restriction on the way nodes are associated with module interface pins, generally referred to as BRC's, which is imposed by the hardware;

(5) legal constraint a restriction of the general form that two connections in a test cannot use the same hardware resource within a module;

(6) shared constraint - a restriction of the form that two connections in a test must use BRC's in the same module;

(7) successful assignment - an association between a BRC and a connection that satisfies all constraints on the connection;

(8) failed module - a module in which a connection cannot be successfully assigned, i.e., there is no combination of BRC's in the module that allow a particular connection to be successfully assigned;

(9) required module for a node - a module where a connection associated with a particular node must be assigned to satisfy a shared constraint;

(10) free module for a node - any module which is not a required module with respect to any connection associated with a particular node;

(11) available BRC - a BRC or tester resource which is in the configuration and not reserved or dedicated, e.g. in an old wire list, or physically incapable of being utilized;

(12) timing master - module whose TCLK signal the other modules, if any, will synchronize to during a digital test, i.e., the MASTER testhead module;

(13) old wire list - defines the wiring of an existing test fixture that can be modified or used to test another circuit board or circuit boards rather than requiring a completely new test fixture to be constructed using the wiring list generated by the MPA program;

(14) Condition A - connections exist which can be successfully assigned in this module based on shared constraints and failed module information;

(15) Condition B - a single BRC is available which satisfies all legal constraints on all connections on the node, and provides the specified type of tester resource; and

(16) Condition C - the module is in the configuration, satisfies all legal constraints for a timing master, and has not failed as a timing master in the course of the assignment.

With continuing reference to FIGS. 13A–G, the MAIN processing loop is described in greater detail. The following description of the MAIN processing loop is based upon the initial conditions that no circuit boards have been processed by the MPA program for the existing testhead configuration and an old wire list for an existing test fixture is available. The presence of the existing test fixture and the old wire list means that a new test fixture need not be built, i.e., the existing test fixture can be modified to accommodate the new circuit board or boards. Further, the operation of the MAIN processing loop is described with respect to the situation where the testhead includes two or more modules and the testhead resources must be allocated to a first circuit board and a second circuit board.

Since no circuit boards have been processed by the MPA program, the MAIN processing loop begins by performing initialization functions with respect to the first circuit board, second circuit board and the old wire list. The MAIN processing loop also records the BRCs used by the old wire list to prevent them from being used for new assignments. The MAIN processing loop then proceeds to process the first circuit board by gathering its requirements files into a new wire list, initializing the new wire list and building an ordered list of nodes in the new wire list. Next, the MAIN processing loop attempts to use the BRCs or resources specified in the old wire list to satisfy the requirements of the nodes in the ordered list. For each successful assignment using the old wire list the MAIN processing loop updates the connection constraints for the node. Further, the MAIN processing loop transfers the connections in the old wire list to the new wire list for tests or general purpose connections that are in the old wire list, but not in the new wire list. This procedure marks the BRCs associated with the connections as assigned, and prevents them from being used for new assignments. At this point the MAIN processing loop determines whether the resources in the configuration are sufficient for a completely efficient assignment. If, the resources are insufficient to accommodate the requirements of the first circuit board, then the MAIN processing loop calls an ERROR subroutine that attempts to add resources, i.e., PIN cards, to the configuration to remedy the insufficient amount of resources. If the ERROR subroutine is successful in adding resources to the configuration, then the MAIN processing loop is re-entered and the circuit board is reprocessed according to the steps described hereinabove. Otherwise, an error message is generated and the MPA Program is exited. If, on the other hand, the resources of the configuration are sufficient for an efficient assignment, then the MAIN processing loop proceeds to process the ordered list of nodes with respect to the first circuit board.

Processing of the ordered list of nodes by the MAIN processing loop begins with the first node in the ordered list and proceeds to the last node in the ordered list in sequential order. With respect to the processing of a specific node the MAIN processing loop utilizes the REQUIRED and FREE module subroutines to locate and assign each separate resource required by the node. More specifically, with respect to each separate resource needed be the node the MAIN processing loop calls the REQUIRED module subroutine which, in turn, calls the FREE module subroutine in an attempt to locate and assign the needed resource. If the needed resource is not located during the first pass through the REQUIRED and FREE module subroutines, then the MAIN processing loop makes a second pass through the subroutines to exhaust all possibilities of locating and assigning the needed resource. The needed resource is either located and assigned during the second pass through the REQUIRED and FREE module subroutine or an error condition is encountered that requires processing by the ERROR subroutine. If the needed resource is located and assigned by either the REQUIRED or FREE module subroutines during either the first or second pass, then the MAIN processing loop attempts to locate and assign any other resources required by the first node by repeating the process described hereinabove. For example, if a node requires first and second resources the MAIN processing loop will utilize the REQUIRED and FREE module subroutines to locate and assign the first resource and then use them a second time to locate and assign the second resource. Once all of the resource requirements for the first node in the ordered list are satisfied, the MAIN processing loop repeats the aforementioned process for the remaining nodes in the ordered list.

Once the resource requirements for all of the nodes in the ordered list have been located and assigned, the MAIN processing loop proceeds to call a TIMING MASTER subroutine that assigns a timing master for each digital test. The timing master is the MASTER module whose TCLK is to be used in coordinating the actions of the VPUs during the digital test. If the TIMING MASTER then the ERROR subroutine is called for remedial action. If, on the other hand, the TIMING MASTER subroutine successfully assigns a timing master for each digital test, then the MAIN processing loop proceeds to process the second board in the same fashion as described with respect to the first circuit board. If the second circuit board is successfully processed, then the MAIN processing loop proceeds to an EXIT subroutine where a final wire list and a summary report are generated, cleanup functions are performed and the MPA program is exited.

With continuing reference to FIGS. 13B, the operation of the REQUIRED module subroutine is discussed in detail. As previously mentioned, the MAIN processing loop calls upon the REQUIRED module subroutine to locate and assign, if possible, the connections for the specified test resource required by a node. Initially, the REQUIRED module subroutine assigns any connections with respect to the specified test resource required by the node that can be successfully assigned using an existing wire, i.e., a wire in the old wire list, and updates the connection constraints. Typically, such connections are not assigned on the first pass through the REQUIRED module subroutine since all such connections should have been assigned in the MAIN processing loop. Consequently, any such connections are typically assigned on the second pass through the REQUIRED module subroutine. If there is a successful assignment using an existing wire, the constraints associated with the connection are updated.

Next, the REQUIRED module subroutine determines for each required module whether Conditions "A" and "B" are both true, i.e., connections exist which can be successfully assigned in the required module based on shared constraints and failed module information, and a single BRC is available that satisfies all legal constraints on all connections on the node together with providing the appropriate test resource. If Conditions "A" and "B" are true for a required module, then each connection satisfying Condition "A" is assigned, if possible, to the closest BRC that satisfies Condition "B". The REQUIRED module subroutine attempts to assign all of the connections associated with the node to a required module. If, however, some of the connections associated with a node must be assigned to different modules because of shared constraints, then the REQUIRED module subroutine attempts to assign as many of the connections that have shared constraints and as many of the connections that do not have shared constraints as possible to each required module as it is processed. For example, consider the following set of three connections associated with an arbitrary node "N":

connection #1 - used in Test #1;
connection #2 - used in Test #2; and
connection #3 - used in Test #3.

Further, suppose connections associated with node "L" in Tests #1 and #3 have been assigned to module "0" and these assignments generated shared constraints with connections #1 and #3 of node "N". In addition, suppose a connection associated with a node "M" in Test #2 has been previously assigned to module "1" and this assignment generated a shared constraint on connection #2 of node "N". Finally, suppose the required module currently being processed is module "0". In this situation, the test of whether conditions "A" and "B" are true is restricted to the subset of connections which satisfy Condition "A" with respect to module "0", i.e., connections #1 and #3. Providing Condition "B" is true with respect to connections #1 and #3, then the connections are assigned to the closest BRC in module "0" that satisfied Condition "B" and the constraints on the connection are updated. In certain situations a connection satisfying Condition "A" may not be able to be assigned to the closest BRC that satisfies Condition "B" because a previously assigned connection in the aforementioned subset of connections may have made Condition "B" false with respect to the connection currently being processed. A new BRC will be chosen and conditions "A" and "B" will be re-evaluated so that this are no more required modules to be processed, then the REQUIRED module subroutine proceeds onto the next step. If there are no required modules or all of the required modules have been processed then the REQUIRED module subroutine also proceeds to the next step.

Next, the REQUIRED module subroutine determines for each free module whether Conditions "A" and "B" are both true. If Conditions "A" and "B" are true for a free module, then each connection satisfying Condition "A" is assigned, if possible, to the closest BRC that satisfies Condition "B". With the exception of relating to free modules, the operation of the REQUIRED module subroutine at this step is identical to that described hereinabove with respect to the processing of the required modules. Notably, if a connection associated with, for example, node "N" is assigned during this step of the REQUIRED module subroutine there may be a shared constraint generated that transforms a free module into a required module If there are no free modules or all of the free modules have been processed then the REQUIRED module subroutine proceeds.

At this point the REQUIRED module subroutine attempts, with respect to all of the required modules now associated with the node, to assign any remaining connections needed by the node with respect to the specified resource. Initially, the REQUIRED module subroutine determines whether there are required modules to be examined. If there are no required modules to be examined, then the REQUIRED module subroutine calls the FREE module subroutine. With respect to a required module the REQUIRED module subroutine determines whether Condition "A" is true with respect to the module. In other words, the REQUIRED module subroutine tests whether there are connections in the set of remaining connections that can be assigned to the required module based upon shared constraints and failed module information. If Condition "A" is false with respect to the required module, then, if another required module exists, it is interrogated. If no other required modules exist, then the REQUIRED module subroutine proceeds to call the FREE module subroutine. On the other hand, if Condition "A" is true, then the REQUIRED module subroutine attempts to find a BRC to which some of the remaining connections can be assigned using either of two methods. In other words, if all of the connections have not been assigned with respect to a given required module and connections remain to be assigned then the REQUIRED module subroutine attempts to find BRCs in the given module that satisfy the requirements of some of the remaining connections.

The first, and preferred, method of finding a BRC to which some of the remaining connections can be assigned determined if the set of BRCs which meet legal constraints for all connections on the node is not empty. If the set is empty, then the REQUIRED module subroutine proceeds to the second method of finding a BRC. If, however, the set is not empty, then the REQUIRED module subroutine locates the closest available BRC in the set that provides the necessary test resource.

As an example of the first method consider the following set of five connections associated with an arbitrary node "N":

connection #1 - used in Test #1;
connection #2 - used in Test #2;
connection #3 - used in Test #3;
connection #4 - used in Test #4; and
connection #5 - used in Test #5.

Further, suppose the following initial conditions:
(1) the testhead configuration includes only modules "0" and "1";
(2) none of the connections can 'e assigned using an existing wire;
(3) module "0" satisfies Condition "B"
(4) a node "M" in Test #2 has been previously assigned to a BRC in module "1" thereby generating a shared constraint for connection #2 and making module "1" a required module; and
(5) previously processed nodes associated with Test #3 have been assigned all of the particular test resource resident in module "1" that are needed by connection #3 thereby producing a legal constraint on connection #3 with respect to module "1" that cannot be satisfied by any BRC in module "1".

The following sequence of events occurs in the REQUIRED module subroutine:
(a) the REQUIRED module subroutine determines that none of the connections can be assigned to an existing wire and proceeds to the next step;
(b) with respect to required module "1", the REQUIRED module subroutine determines that Conditions "A" and "B" are not both true (Condition "B" is false because the legal constraints on connection #3 cannot be satisfied in module "1") and proceeds to the next step;
(c) with respect to free module "0", the REQUIRED module subroutine determines that Conditions "A" and "B" are both true, i e., connections #1, #3, #4 and #5 satisfy Condition "A" with respect to free module "0" and Condition "B" is satisfied according to the initial conditions, proceeds to assign these connections to the closest BRC in module "0" and proceeds on to the next step;

(d) the REQUIRED module subroutine then determines that condition "A" is false for the remaining, unassigned connection #2 with respect to required module "0" and proceeds to the next step;

(e) the REQUIRED module subroutine then determines that condition "A" is true for the remaining, unassigned connection #2 with respect to module "1" and proceeds to the next step;

(f) the REQUIRED module subroutine then proceeds to use the first method discussed hereinabove to locate a BRC to which the connection can be assigned. Specifically, the REQUIRED module subroutine constructs the set of all BRCs in module "1" that satisfy all legal constraints for connection #2 and selects the closest BRC that provides the needed test resource.

The second method of finding a BRC to which some of the remaining connections can be assigned is used if the set of BRCs which meet legal constraints for all connection on the node is empty or an available BRC cannot be found using the first method. The second method computes the set of BRCs which meet legal constraints for some connection on the node. From this set of BRCs the REQUIRED module subroutine locates the closest available BRC in the set which provides the necessary test resource.

As an example of the second method consider the following set of five connections associated with an arbitrary node "N":

connection #1 - used in Test #1;
connection #2 - used in Test #2;
connection #3 - used in Test #3;
connection #4 - used in Test #4; and
connection #5 - used in Test #5.

Further, suppose the following initial conditions:

(1) the testhead configuration includes only modules "0" and "1";

(2) none of the connections can be assigned using an existing wire;

(3) a node "M" in Test #2 has been previously assigned to a BRC in module "1" thereby generating a shared constraint for connection #2 and making module "1" a required module;

(4) previously processed nodes associated with Test #3 have been assigned certain BRCs resident in module that provide the particular test resource needed by connection #3 thereby producing a legal constraint that limits connection #3 to a first set of BRCs in module "1";

(5) previously processed nodes associated with Test #4 have been assigned certain BRCs resident in module "1" that provide the particular test resource needed by connection #4 thereby producing a legal constraint that limits connection #4 to a second set of BRCs in module that include all BRCs not in the first set;

(6) previously processed nodes associated with Test #1 have been assigned certain BRCs resident in module "0" that provide the particular test resource needed by connection #1 thereby producing a legal constraint that limits connection #1 to a third set of BRCs in module "0";

(7) previously processed nodes associated with Test #5 have been assigned certain BRCs resident in module "0" that provide the particular test resource needed by connection #5 thereby producing a legal constraint that limits connection #5 to a fourth set of BRCs in module that includes all BRCs not in the third set.

The following sequence of events occurs in the REQUIRED module subroutine:

(a) The REQUIRED module subroutine determines that none of the connections can be assigned to an existing wire and proceeds to the next step;

(b) with respect to required module "1", the REQUIRED module subroutine determines that Conditions "A" and "B" are not both true, i.e., Condition "B" is false because no single BRC in module "1" can satisfy the legal constraints imposed on connections #3 and #4, and proceeds to the next step;

(c) with respect to free module "0", the REQUIRED module subroutine determines that Conditions "A" and "B" are not both true, i.e., Condition "B" is false because no single BRC in module "0" can satisfy the legal constraints imposed on connections #1 and #5, and proceeds to the next step;

(d) the REQUIRED module subroutine then determines that condition is true for all connections with respect to required module "1" and proceeds to the next step;

(e) the REQUIRED module subroutine then determines that the set of BRCs that meet all legal constraints for all of the remaining, unassigned connections (#1-#5) in module "1" is an empty set, since no single BRC in module "1" can satisfy the legal constraints of both connection #3 and connection #4, and proceeds to the next step; and (f) the REQUIRED module subroutine then computes the set of BRCs in module "1" that meet all legal constraints for some connection on the node. For instance, if the set of BRCs in module "1" that meet all legal constraints for connection #1 includes just one BRC, then connections #1, #2, #4 and #5 can be assigned to that BRC. Connection #3 cannot be assigned to the BRC because the legal constraints between connections #3 and #4 make such an assignment impossible.

If a BRC s found using either of the two aforementioned methods, then for each connection satisfying Condition "A", the REQUIRED module subroutine assigns the connection to the BRC and updates constraints for the connection. The REQUIRED module subroutine then proceeds to test Condition "A" to determine if any of the remaining connections can be assigned in the required module. If condition "A" is true, then the connection is processed as described hereinabove. If, however, Condition "A" is not true, then the REQUIRED module subroutine proceeds to determine if any required modules are still available for examination. If all of the required modules have been processed, then the REQUIRED module subroutine proceeds to call the FREE module subroutine. On the other hand, if required modules are still available, the REQUIRED module subroutine proceeds to test condition "A". If condition is true, then the REQUIRED module subroutine proceeds as described hereinabove. Otherwise, the REQUIRED module subroutine determines whether any required modules remain to be examined. If required modules remain to be examined, then the REQUIRED module subroutine proceeds as described hereinabove. Otherwise, the REQUIRED module subroutine calls the FREE module subroutine which is described more fully hereinafter.

If a BRC is not found in a required module using either of the aforementioned methods, then the REQUIRED module subroutine calls a BACKOUT subroutine.

Figure 13C:
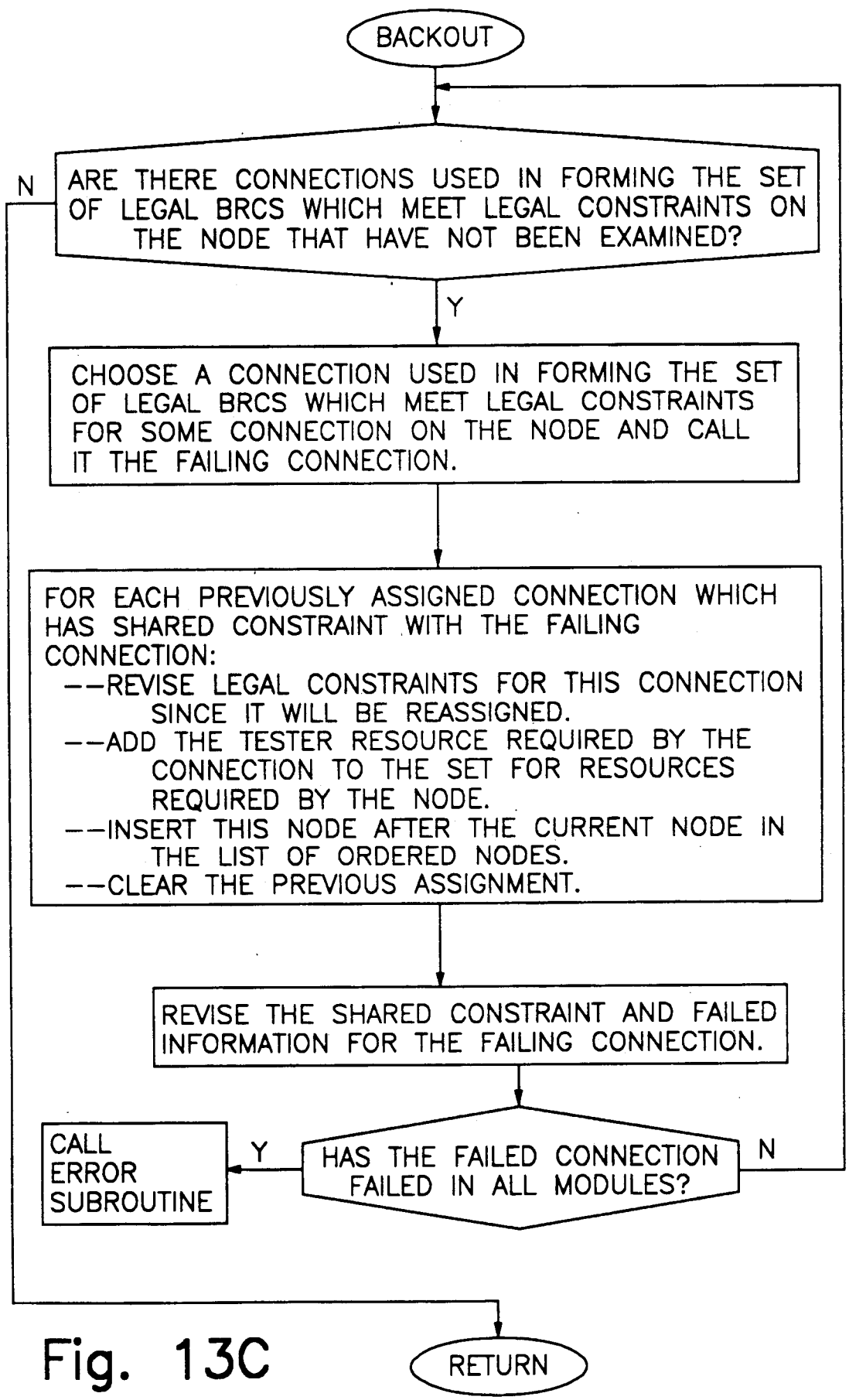
Figure 13F:
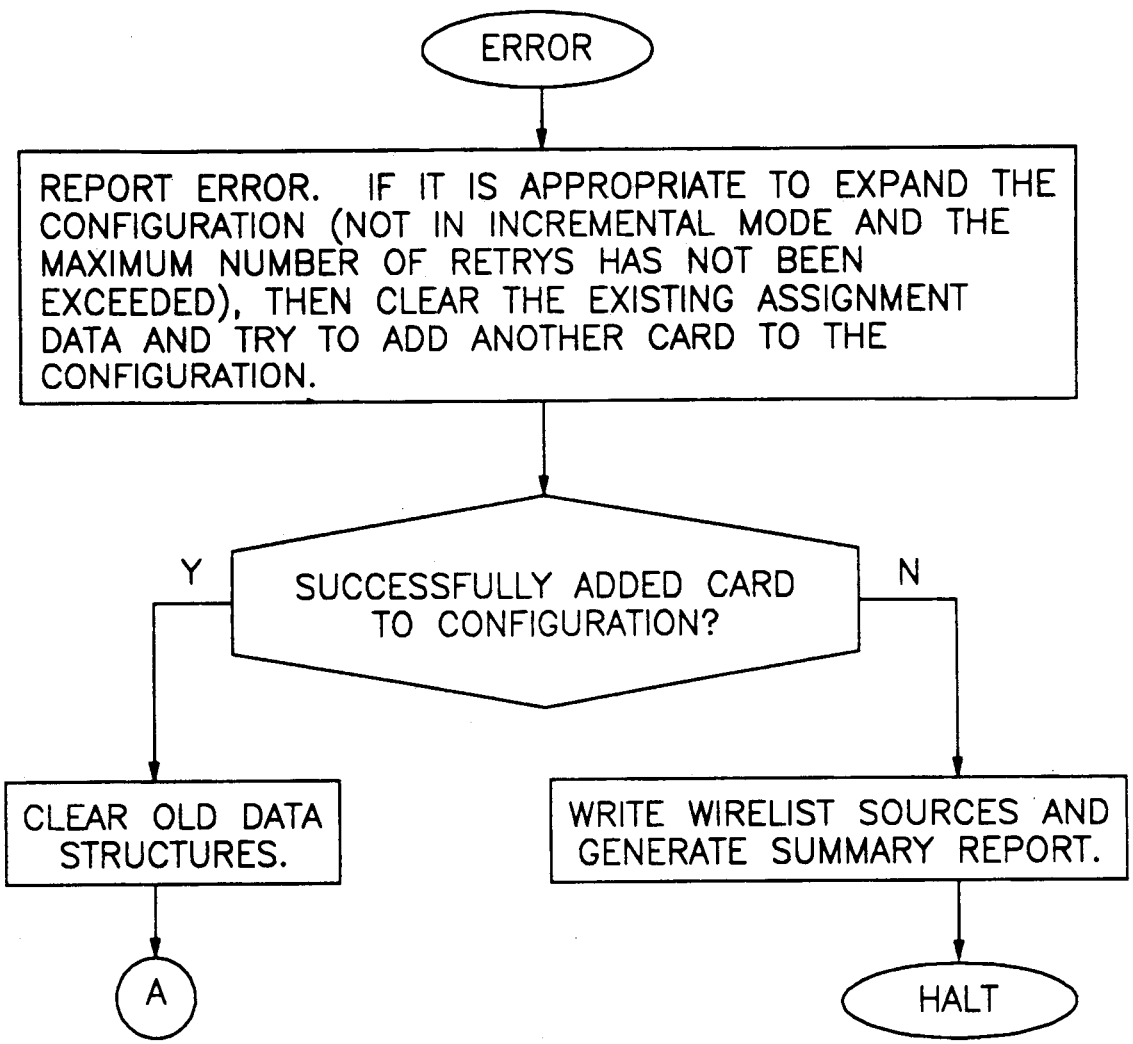
Figure 13G:
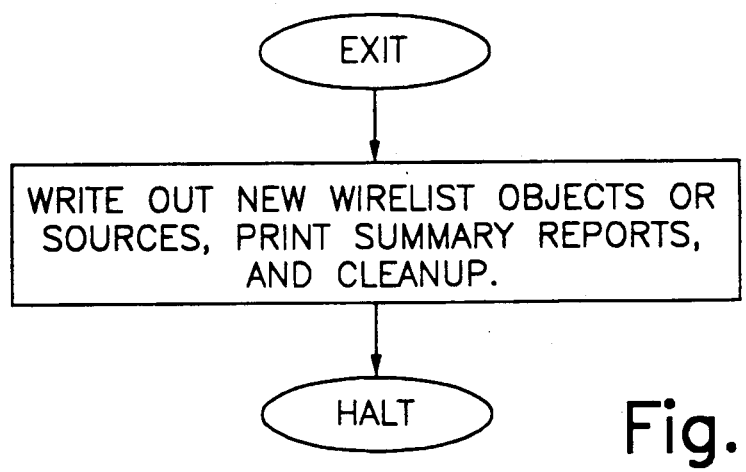

With reference to FIG. 13C, the operation of the BACKOUT subroutine is discussed in detail. Initially, the BACKOUT subroutine determines whether there are connections used in forming the set of legal BRCs that have not been examined. If the BACKOUT subroutine has been called, then there is at least one connection used in forming the set of legal BRCs that has not been examined. The BACKOUT subroutine chooses a connection used in forming the set of legal BRC's and defines it to be a failing connection. Then, for each previously assigned connection that has a shared constraint with the failing connection, the BACKOUT subroutine reverses the assignment of the connection. More specifically, the BACKOUT reverses the assignments by revising the legal constraints for each connection, adding the tester resource assigned to each connection to the set of resources required for the node, reinserting the node in the ordered of list of nodes so that it can be reprocessed and clearing the previous assignment. Further, the BACKOUT subroutine revises the shared constraint and failed information for the failing connection. The BACKOUT subroutine then determines whether the failing connection has failed in all modules. If the failing connection has failed in all modules than the ERROR subroutine is called. If, however, the failing connection has not failed in all modules, then the BACKOUT subroutine determines whether there are any connections remaining that were used to form the set of legal BRCs that have not been examined. If such connections exist then the aforementioned process is repeated. Otherwise, control returns to the point in the REQUIRED module subroutine where the Condition "A" is tested.

As an example of the operation of the BACKOUT subroutine consider the following set of two connections associated with an arbitrary node "N":

connection #1 - used in Test #1; and
connection #2 - used in Test #2.

Further, suppose the following initial conditions:

(1) the testhead configuration includes only modules "0" and "1";

(2) none of the connections can be assigned using an existing wire;

(3) a connection associated with node "L" in Test #1 has been previously assigned to a BRC in module "1" thereby generating a shared constraint for connection #1 and making module "1" a required module;

(4) a connection associated with node "M" in Test #2 has been previously assigned to a BRC in module "1" thereby generating a shared constraint for connection #2 and making module "1" a required module; and (5) it is late in the assignment process and very few unassigned BRCs remain in module "I".

The following sequence of events occurs in the REQUIRED module subroutine:

(a) the REQUIRED module subroutine determines that none of the connections can be assigned to an existing wire and proceeds to the next step;

(b) with respect to required module "1", the REQUIRED module subroutine determines that Conditions "A" and "B" are not both true, i.e., Condition "B" is false since none of the remaining BRCs satisfy all of the legal constraints on all of the connections, and proceeds to the next step;

(c) with respect to free module "0", the REQUIRED module subroutine determines that Conditions "A" and "B" are not both true, i.e., Condition "A" is false because the shared constraints on both connections #1 and #2 require that the connections be assigned to module "1", and proceeds to the next step;

(d) the REQUIRED module subroutine then determines that condition "A" is true for all connections with respect to required module "1" and proceeds to the next step;

(e) the REQUIRED module subroutine then determines that the set of BRCs that satisfy all legal constraints for all connections is not empty, but all of the BRCs have been assigned and, hence, are unavailable;

(f) the REQUIRED module subroutine then computes the set of BRCs in module i.e., all of the unassigned BRCs, that meet all legal constraints for some connection, connection #2 for instance, and proceeds to the next step;

(g) the REQUIRED module subroutine then locates the closest BRC in the set WhiCh provides the needed test resource and proceeds to the next step;

(h) the REQUIRED module subroutine then determines that a BRC has been located, assigns the connection and updates the constraints on the connection and proceeds to the next step;

(i) the REQUIRED module subroutine then determines that Condition is still true with respect to required module "1" and proceeds to the next step;

(j) the REQUIRED module subroutine then determines that an available BRC among the set of BRCs that meet all legal constraints for the remaining, unassigned connection #1 cannot be found and proceeds to the next step;

(k) the REQUIRED module subroutine then determines the set of BRCs that meet all legal constraints for the remaining, unassigned connection #1, finds that none of BRCs in the set are available, and proceeds to the next step;

(l) the REQUIRED module subroutine then determines that a BRC was not found and proceeds to call the BACKOUT subroutine.

The following sequence of events occurs in the BACKOUT subroutine:

(a) the BACKOUT subroutine defines a connection used in forming the set of BRCs that satisfy all legal constraints on some connection, i.e., connection #1, as a failing connection and proceeds to the next step;

(b) the BACKOUT subroutine then reverses previously assigned connections that have a shared constraint with the failing connection. Specifically, the BACKOUT subroutine reverses the connection associated with node "L" in Test #1 by revising the legal constraints for the connection, adding the test resources required by the connection to the set of resource required by the node, reinserts the node after the current node in the ordered list of nodes so that it can be reprocessed and clears the previous assignment. The BACKOUT subroutine then revises the shared constraint and failed module information for the failing connection and tests whether the failed connection has failed in all modules.

With continuing reference to FIG. 13D, the operation of the FREE module subroutine is discussed in detail. As previously mentioned, the REQUIRED module subroutine calls upon the FREE module subroutine to locate and assign, if possible, the connections for the test resource required by a node in the ordered list of nodes.

Initially, the FREE module subroutine assigns any connections with respect to the specified test resource required by the node that can be successfully assigned using an existing wire, i.e., a wire in the old wire list, and updates the constraints on the node. Typically such connections assigned to an existing wire as a result of the operation of the BACKOUT subroutine. For example, suppose the REQUIRED module subroutine failed to assign a connection having a shared constraint with a previously assigned connection and the BACKOUT subroutine was employed to remove the previously assigned connection. In this situation, the BRC associated with an existing wire in another non-required module is now available for assignment in the FREE module subroutine If there is a successful assignment using an existing wire, the constraints associated with the connection are updated and the FREE module subroutine proceeds to the next step.

The operation of the remainder of the FREE module subroutine, with two exceptions, is identical to the corresponding portion of the REQUIRED module subroutine. The first exception is that the FREE module subroutine operates on free modules, rather than required modules. The second except on is that the FREE module subroutine returns control to the MAIN processing loop upon completing the processing of all of the free modules. The remainder of the FREE module subroutine attempts, in free modules which satisfy Condition "A", to locate BRCs that can be assigned to some of the remaining connections. If a BRC cannot be located then the FREE module subroutine utilizes the BACKOUT subroutine whose operation has been previously described.

With reference to FIG. 13E, the TIMING MASTER subroutine is discussed in greater detail. Initially, the TIMING MASTER subroutine proceeds to find the first test in the wire list that uses digital tester resources and that does not already have a timing master determined by the connection assignments. In certain situations, the timing master is defined during the assignment of connections by the REQUIRED module and FREE module subroutines. Normally, however, the timing master is determined by the TIMING MASTER subroutine. Once a test is located that uses digital resources the TIMING MASTER subroutine proceeds to determine whether or not the test is in the old wire list.

If the test is not in the old wirelist, then the TIMING MASTER subroutine proceeds, as more fully described hereinafter, to locate and assign a timing master. If, however, the test is in the old wire list, then the TIMING MASTER subroutine determines whether or not the timing master in the old wire list, hereinafter referred to as the old timing master, satisfies Condition "C" which requires that the module be in the configuration, satisfy all legal constraints for a timing master, and has not failed as a timing master in the course of assignment. If the old timing master does not satisfy Condition "C", then the module is marked as failed and the TIMING MASTER subroutine proceeds to determine whether or not all modules have failed to satisfy Condition "C" If all modules have failed to satisfy Condition "C", then the TIMING MASTER subroutine calls the ERROR subroutine. If all modules have not failed, then, as described more fully hereinafter, the TIMING MASTER subroutine proceeds to determine whether or not there are more modules which can be assigned as timing masters. If, however, the old timing master does satisfy Condition "C", then the module that was the old timing master is assigned as the timing master for the test and the TIMING MASTER subroutine proceeds as described hereinafter.

At this point the following three previously mentioned paths converge: (1) the test was not in the old wirelist; (2) the test was in the old wirelist, the old timing master did not satisfy Condition "C" and all modules have not failed to satisfy Condition "C"; and (3) the test was in the old wirelist, the old timing master satisfies Condition "C" and the old timing master has been assigned as the timing master for the test. With respect to the first and second paths, the TIMING MASTER subroutine proceeds to determine whether a selected module, among the one or more modules that have not been tested with respect to Condition "C", satisfies Condition "C". If the selected module does not satisfy Condition "C", then it is marked as failed. The TIMING MASTER subroutine then proceeds to determine whether or not all of the modules have failed to satisfy Condition "C". If all of the modules have failed Condition "C", then the ERROR subroutine is called, otherwise the TIMING MASTER subroutine proceeds as described more fully hereinafter. However, if the module being examined does satisfy Condition "C", then the timing master for the test is assigned to the module and the TIMING MASTER subroutine proceeds as described more fully hereinafter.

At this point the following three paths converge: (4) previously mentioned path (3); (5) a selected module has failed Condition "C", but Condition "C" has not been failed by all modules; and (6) a selected module has satisfied Condition "C" and has been assigned as the timing master for the test. Since the fourth and sixth paths have resulted in a timing master being assigned, the TIMING MASTER subroutine proceeds to repeat the aforementioned process for the next test in the wirelist. With respect to the fifth path, the TIMING MASTER subroutine proceeds to determine whether any of the remaining modules that have not been tested with respect to Condition "C" satisfy Condition "C" If a module is found to satisfy Condition "C", then it is assigned and the TIMING MASTER subroutine proceeds to the next test in the wirelist. If none of the remaining modules satisfy Condition "C", then the TIMING MASTER subroutine proceeds to call the ERROR subroutine.

Once all of the tests in the wirelist that require timing masters have been processed, the TIMING MASTER subroutine outputs a report on the wire usage for the circuit board and performs cleanup duties. The TIMING MASTER subroutine then returns control to the MAIN processing loop which proceeds to process the ordered list of nodes associated with the second circuit board.

The ERROR subroutine is attained under the following conditions: (1) the configuration is not big enough for a completely efficient assignment; (2) a resource needed by a node for a particular test, i.e., a connection, cannot be located in any of the modules; or (3) all modules have failed as timing masters for a particular test. The ERROR subroutine processes these errors by first determining whether it is appropriate to expand the configuration. If the appropriate response to the error condition is to expand the configuration, then the ERROR subroutine clears any assignments which have occurred up to this point and attempts to add the resources of one or more PIN cards to the definition provided to the MPA program of the resources in the testhead. By adding resources to the definition of the resources actually in the testhead the MPA program can, if the PIN card is successfully added, proceed to generate a wirelist even though the PIN card or cards are not, at this point, actually resident in the testhead.

Next, the ERROR subroutine determines whether or not the resources provided by the additional PIN card or cards were successfully added to the configuration. If the resources of the PIN card or cards were not successfully added, then the ERROR subroutine writes the wirelist sources, generates a summary report and causes the MPA program to be exited. However, if the PIN card or cards were successfully added, then data structures are cleared and the control returns to the MAIN processing loop where the entire configuration is reprocessed. It is necessary to reprocess the entire configuration since the added resources may improve certain assignments that were undesirable, although adequate.

Figure 14:
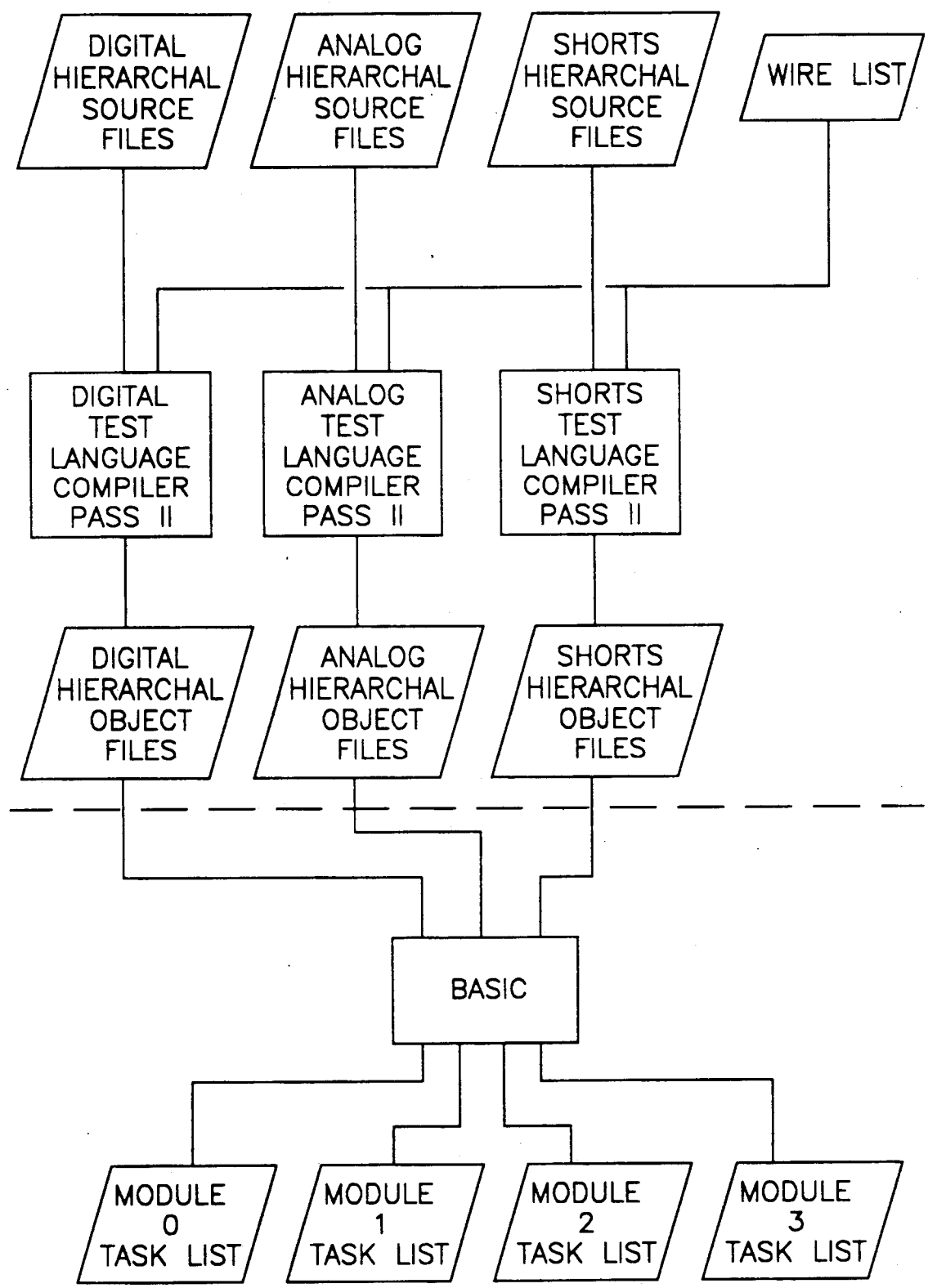
FIG. 14 is a flow chart that illustrates the development of a test plan, and in particular the development of the portions of a test plan that are to be downloaded to each module when more than one module is required to test components or devices on a circuit board.

With reference to FIG. 14, the wire list generated by the MPA program together with the digital source files are input to the digital test language compiler a second time to generate digital object files for each digital device or circuit on the circuit board. A digital object file contains the code to be executed within a testhead module or modules in carrying out the digital test defined in the standard and/or user defined libraries for the particular digital device. The code specifies how the specific test resource allocated by the MPA program is to be used in carrying out a digital test. Similarly, the analog source files and the wire list are input to the analog test compiler to generate executable object files for each analog device or circuit on the circuit board. Also similarly, the shorts test language compiler generates shorts object files based upon the wire list generated by the MPA program and the shorts source files.

The test plan, as produced by the compilers, contains PSYNC instructions which, when executed by the CPUs associated with the testhead modules, result in the high-speed link 118 being used to coordinate the operation of the MASTER and SLAVE testhead module's CPUs. The test plan also includes HSTART instructions that, when executed by the CPUs associated with the testhead modules, result in the high-speed link 118 being used to coordinate the operation of the MASTER and SLAVE testhead module's VPUs. In addition, the test plan includes instructions for transferring the MASTER status among modules in a communication loop. The transfer of MASTER status, as previously discussed, also implies that the appropriate adjustments are made to the TCLK signals in the SLAVE testhead modules as specified in the look-up table.

At this point the testplan is ready to be executed. However, before the testplan can be executed the high-speed link 118 must be configured to accommodate the physical/logical configuration of the testhead 116. For instance, if the testplan is for a (2-2) testhead configuration, then the high-speed link 118 must be configured such that the appropriate forward and backward communication paths are established. Furthermore, the look-up table containing the propagation delays for the physical/logical testhead configuration must be downloaded to the testhead modules 120a-d so that if MASTER status is transferred between two or more testhead modules during the testing of a circuit board the TCLKs associated with the testhead modules can be adjusted accordingly. In addition, a circuit board must be mounted on the test fixture 168. If employed, the automatic board handler 86 can, under the direction of the SPU 56, load the circuit board.

Figure 15:
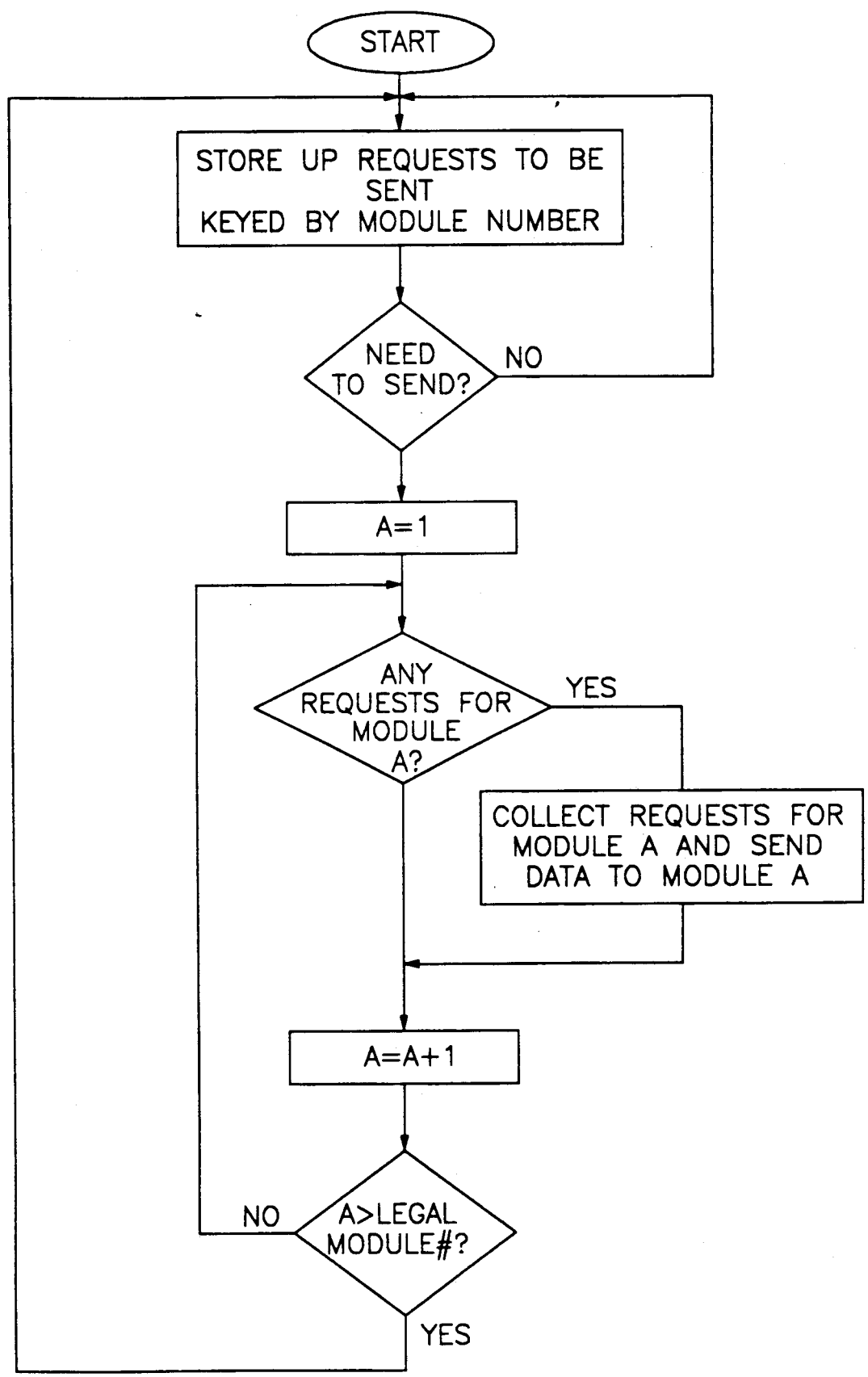
FIG. 15 is a more detailed flow chart of the BASIC program illustrated in FIG. 14.

With reference to FIGS. 14–15, the execution of the testplan involves a BASIC routine that builds a task list for each of the testhead modules from the object files. The task list includes one or more requests that specify what actions are to be taken by the particular testhead module. Each request includes an op-code and, possibly, data. With reference to FIG. 15, the requests to test a circuit board are indexed by module number and stored. The indexing and storing of requests continues until a point is reached at which the requests must be sent to the module or modules in the testhead. At this point the BASIC routine determines if any requests have been indexed and stored for the first testhead module. If any such requests exist, then the requests are collected and downloaded to the first testhead module using the general purpose I/O bus 104, CAP card 100 and parallel buses 120a-d. The BASIC routine then proceeds to download any indexed and stored requests for the other testhead modules. Once all of the testhead modules have been serviced, the BASIC routine returns to indexing and storing requests until it is again necessary to download the requests to the testhead modules according to the aforementioned process.

Upon reaching the testhead module a request is processed by an interpreter that is run by the resident CPU. The interpreter processes PSYNC requests, HSTART and change of MASTER status requests and, in so doing, uses the high-speed link 118 to achieve CPU synchronization, VPU synchronization and transfer MASTER status, respectively.

The foregoing description of the invention has been presented for purposes of illustration and description. Further, the description is not intended to limit the invention to the form disclosed therein. Consequently, variations and modifications commensurate with the above teachings, and the skill or knowledge in the relevant art are within the scope of the present invention. For instance, a test plan could be permanently established in the testhead modules using ROM devices. In such a tester the need for communicating the test plan from the controller to the testhead would be eliminated. The preferred embodiment described hereinabove is further intended to explain the best mode known of practicing the invention and to enable others skilled in the art to utilize the invention in various embodiments and with the various modifications required by their particular applications or uses of the invention. It is intended that the appended claims be construed to include alternative embodiments to the extend permitted by the prior art.

What is claimed is:

1. An apparatus for testing a circuit board according to a first test plan comprised of one or more instructions, the circuit board having a topology and nodes, comprising:

a testhead for interfacing with the nodes of the circuit board, said testhead including a plurality of modules for use in testing the circuit board, each module of said plurality of modules including a defined quantity of resources that does not exceed a defined maximum quantity of resources, said defined quantity of resources including one or more first means for use in communicating with the nodes on the circuit board, a processor for executing at least one of the instructions of the first test plan to produce address information, and second means for communicating address information between said processor and at least one of said first means for use in communicating with the nodes, wherein the processor associated with one of said plurality of modules is substantially identical to at least one of the processor associated with another one of said plurality of modules and each module is capable of being used independently of any other module to test a circuit board; and first means for coordinating the execution of the first test plan by at least two of said processors when said defined quantities of resources of more than one module of said plurality of modules are required for the testing of the circuit board.

2. An apparatus for testing a circuit board, the circuit board having a topology and nodes, comprising:

a testhead for interfacing with the nodes of the circuit board, said testhead including a plurality of modules, each module of said plurality of modules including defined quantities of resources and a processor for use in testing the circuit board; and first means for coordinating the execution of a first test plan by at least two of said processor when said defined quantities of resources of more than one module of said plurality of modules are required for the testing of the circuit board;

wherein each modules of said plurality of modules includes a separate and independent cooling means.

3. An apparatus, as claimed in claim 1, wherein:
said processor includes a central processing unit.

4. An apparatus, as claimed in claim 1, wherein:
said processor includes a vector processing unit.

5. An apparatus, as claimed in claim 1, wherein:
said first means for coordinating forms a ring communication path between two or more modules of said plurality of modules.

6. An apparatus, as claimed in claim 1, wherein:
said first means for coordinating forms a communication path wherein any one module of said plurality of modules communicates directly with at least one other module of said plurality of modules and at most two other modules of said plurality of modules.

7. An apparatus, as claimed in claim 5, wherein:
each module of said plurality of modules includes switch means for selectively connecting to said communication path formed by said first means for coordinating.

8. An apparatus, as claimed in claim 7, wherein:
at least two modules of said plurality of modules are selectively connected to said communication path to test a first circuit board.

9. An apparatus, as claimed in claim 7, wherein:
at least two modules of said plurality of modules are selectively connected to said communication path to test a first circuit board and at least one module of said plurality of modules is selectively disconnected from said communication path to test a second circuit board.

10. An apparatus, as claimed in claim 7, wherein:
each module of said plurality of modules is selectively disconnected from said communication path, wherein at least one module of said plurality of modules is used to test a first circuit board.

11. An apparatus, as claimed in claim 1, further comprising:

second means for coordinating the execution of a second test plan by at least two of said processors when said defined quantities of resources of more than one module of said plurality of modules are required to test the circuit board, said first means for coordinating allowing a first group of at least two modules of said plurality of modules to execute a first test plan to test a first circuit board and said second means for coordinating allowing a second group of at least two modules of said plurality of modules to execute a second test plan to test a second circuit board.

12. An apparatus, as claimed in claim 1, further comprising:

means, responsive to the topology of the circuit board and said defined quantities of resources associated with said plurality of modules, for generating the test plan, said means for generating including means for determining whether said defined quantities of resources of more than one module of said plurality of modules is needed to test the circuit board.

13. An apparatus, as claimed in claim 12, further comprising:

means for establishing independent communication between said means for generating and each module of said plurality of modules.

14. An apparatus, as claimed in claim 13, wherein:
a first portion of said first test plan is communicated to a first module of said plurality of modules and a second portion of said first test plan is communicated to a second module of said plurality of modules using said means for establishing independent communication.

15. An apparatus, as claimed in claim 13, wherein:
said first test plan is communicated to one module of said plurality of modules.

16. An apparatus, as claimed in claim 13, further comprising:

means for monitoring the results of the execution of the first test plan by at least one module of said plurality of modules.

17. An apparatus, as claimed in claim 1, wherein:
each module of said plurality of modules includes a separate and independent power means.

18. An apparatus, as claimed in claim 1, wherein:
each module of said plurality of modules includes a separate and independent device-under-test DC power supply for use in testing the circuit board.

19. An apparatus, as claimed in claim 1, wherein:
said first means for coordinating includes means for determining and compensating for any propagation delay between one module of said plurality of modules and another module of said plurality of modules.

20. An apparatus, as claimed in claim 1, wherein:
said first means for coordinating includes means for preventing the execution of a first portion of the test plan by said processor of a first module of said plurality of modules before the execution of a second portion of the test plan by said processor of a second module of said plurality of modules.

21. An apparatus for concurrently testing a first circuit board according to a first test plan comprised of a first set of instructions and a second circuit board according to a second test plan comprised of a second set of instructions, the first and second circuit boards each having a topology and nodes, comprising:

a testhead for interfacing with the nodes of the first and second circuit boards, said testhead including a plurality of modules for use in testing the first and second circuit boards, each module of said plurality of modules including a defined quantity of resources that does not exceed a defined maximum quantity of resources, said defined quantity of resources including one or more first means for use in communicating with the nodes of the circuit board, a processor for executing at least one of the instructions of one of the first and second test plans to produce address information, and second means for communicating address information between said processor and at least one of said first means for use in communicating with the nodes, wherein the processor associated with one of said plurality of modules is substantially identical to at least one of the processors associated with another one of said plurality of modules and each module is capable of being used independently of any other module to test a circuit board;

first means for coordinating the execution of the first test plan to test the first circuit board using more than one of said processors when said defined quantities of resources of more than one module of said plurality of modules are required for testing the first circuit board; and second means for coordinating the execution of the second test plan to test the second circuit board using more than one of said processors when said defined quantities of resources of more than one module of said plurality of modules are required for testing the second circuit board.

22. An apparatus, as claimed in claim 21, wherein:
said first means for coordinating and said second means for coordinating each forming a loop communication path between two or more modules of said plurality of modules.

23. An apparatus for testing a circuit board according to a test plan comprised of one or more instructions, the circuit board having a topology and nodes, comprising:

a testhead for interfacing with the nodes of the circuit board, said testhead including a plurality of modules for use in testing the circuit board, each module of said plurality of modules including a defined quantity of resources that does not exceed a defined maximum quantity of resources, said defined quantity of resources including one or more first means for use in communicating with the nodes on the circuit board, a processor for executing at least one of the instructions of the test plan to produce address information, and second means for communicating address information between said processor and at least one of said first means for use in communicating with the nodes, wherein the processor associated with one of said plurality of modules is substantially identical to at least one of the processors associated with another one of said plurality of modules and each module is capable of being used independently of any other module to test a circuit board;

first means for coordinating the execution of the test plan by at least two of said processor when said defined quantities of resources of more than one module of said plurality of modules are required for the testing of the circuit board; and second means for switching to selectively connect each module of said plurality of modules to said first means, wherein at least two of said processors are connected to said first means to test the circuit board.

24. An apparatus, as claimed in claim 23, wherein:
said first means for coordinating forms a loop communication path between two or more modules of said plurality of modules.

25. An apparatus for concurrently testing a first circuit board according to a first test plan comprised of a first set of instructions and a second circuit board according to a second test plan comprised of a second set of instructions, the first and second circuit boards each having a topology and nodes, comprising:

a testhead for interfacing with the nodes of the first and second circuit boards, said testhead including a plurality of modules for use in testing the first and second circuit boards, each module of said plurality of modules including a defined quantity of resources that does not exceed a defined maximum quantity of resources, said defined quantity of resources including one or more first means for use in communicating with the nodes on the circuit board, a processor for executing at least one of the instructions of one of the first and second test plans to produce address information, and second means for communicating address information between said processor and at least one of said first means for use in communicating with the nodes, wherein the processor associated with one of said plurality of modules is substantially identical to at least one of the processors associated with another one of said plurality of modules and each module is capable of being used independently of any other module to test a circuit board;

first means for coordinating the execution of the first test plan to test the first circuit board using more than one of said processors when said defined quantities of resources of more than one module of said plurality of modules are required for testing the first circuit board; and second means for switching to selectively connect each module of said plurality of modules to said first means, wherein at least two of said processors are connected to said first means to test the first circuit board and at least one processor is disconnected from said first means to test the second circuit board.

26. An apparatus, as claimed in claim 25, wherein:
said first means for coordinating forms a loop communication path between two or more modules of said plurality of modules.

27. An apparatus for concurrently testing a first circuit board according to a first test plan comprised of a first set of instructions and a second circuit board according to a second test plan comprised of a second set of instructions, the first and second circuit boards each having a topology and nodes, comprising:

a testhead for interfacing with the nodes of the first and second circuit boards, said testhead including a plurality of modules for use in testing the first and second circuit boards, each module of said plurality of modules including a defined quantity of resources that does not exceed a defined maximum quantity of resources including one or more first means for use in communicating with the nodes on the circuit board, a processor for executing at least one of the instructions of one of the first and second test plans to produce address information, and second means for communicating address information between said processor and at least one of said first means for use in communicating with the nodes, wherein the processor associated with one of said plurality of modules is substantially identical to at least one of the processors associated with another one of said plurality of modules and each module is capable of being used independently of any other module to test a circuit board;

first means for coordinating the execution of a test plan to test a circuit board using more than one of said processors when said defined quantities of resources of more than one module of said plurality of modules are required for testing the circuit board; and second means for switching to selectively connect each module of said plurality of modules to said first means, wherein each module of said plurality of modules is disconnected from said first means and a first module of said plurality of modules is used to test the first circuit board and a second module of said plurality of modules is used to test the second circuit board.

28. An apparatus for concurrently testing a first circuit board according to a first test plan comprised of a first set of instructions and a second circuit board according to a second test plan comprised of a second set of instructions, the first and second circuit boards each having a topology and nodes, comprising:

a testhead for interfacing with the nodes of the first and second circuit boards, said testhead including a plurality of modules for use in testing the first and second circuit boards, each module of said plurality of modules including a defined quantity of resources that does not exceed a defined maximum quantity of resources, said defined quantity of resources including one or more first means for use in communicating with the nodes on the circuit board, a processor for executing at least one of the instructions of one of the first and second test plans to produce address information, and second means for communicating address information between said processor and at least one of said first means for use in communicating with the nodes, wherein the processor associated with one of said plurality of modules is substantially identical to at least one of the processors associated with another one of said plurality of modules and each module is capable of being used independently of any other module to test a circuit board;

first means for coordinating the execution of the first test plan to test the first circuit board using more than one of said processors when said defined quantities of resources of more than one module of said plurality of modules are required for testing the first circuit board;

second means for coordinating the execution of the second test plan to test the second circuit board using more than one of said processors when said defined quantities of resources of more than one module of said plurality of modules are required for testing the circuit board, and third means for switching to selectively connect each module of said plurality of modules to one of said first means for coordinating and said second means for coordinating, wherein at least two modules of said plurality of modules are connected to said first means for coordinating to test the first circuit board and at least two other modules of said plurality of modules are connected to said second means for coordinating to test the second circuit board.

29. An apparatus, as claimed in claim 28, wherein:

said first means for coordinating and said second means for coordinating each form a loop communication path between two or more modules of said plurality of modules.

30. An apparatus for testing a circuit board according to a test plan comprised of one or more instructions, the circuit board having a topology and nodes, comprising:

a testhead for interfacing with the nodes of the circuit board, said testhead including a plurality of modules for use in testing the circuit board, each module of said plurality of modules including a defined quantity of resources that does not exceed a defined maximum quantity of resources, said defined quantity of resources including one or more first means for use in communicating with the nodes on the circuit board, a processor for executing at least one of the instructions of the test plan to produce address information, and second means for communicating address information between said processor and at least one of said first means for use in communicating with the nodes, wherein the processor associated with one of said plurality of modules is substantially identical to at least one of the processors associated with another one of said plurality of modules and each module is capable of being used independently of any other module to test a circuit board;

first means, responsive to the topology of the circuit board and said defined quantities of resources of said testhead, for generating the test plan, said first means for generating including means for determining whether said defined quantities of resources of more than one module of said plurality of modules is needed to test the circuit board; and second means for coordinating the execution of the test plan by at least two of said processors when said defined quantities of resources of more than one module of said plurality of modules are required for the testing of the circuit board.

31. An apparatus for testing a circuit board according to a test plan comprised of one or more instructions, the circuit board having a topology and nodes, comprising:

a testhead for interfacing with the nodes of the circuit board, said testhead including a plurality of modules for use in testing the circuit board, each module of said plurality of modules including a defined quantity of resources that does not exceed a defined maximum quantity of resources, said defined quantity of resources including one or more first means for use in communicating with the nodes on the circuit board, a processor for executing at least one of the instructions of the test plan to produce address information, and second means for communicating address information between said processor and at east one of said first means for use in communicating with the nodes, wherein the processor associated with one of said plurality of modules is substantially identical to at least one of the processors associated with another one of said plurality of modules and each module is capable of being used independently of any other module to test a circuit board;

first means, responsive to the topology of the circuit board and to said defined quantities of resources of said testhead, for generating the test plan, said first means including means for determining whether said defined quantities of resources of more than one module of said plurality of modules are required to test the circuit board;

second means, responsive to said first means, for coordinating the execution of the test plan to test the circuit board using more than one of said processors when said defined quantities of resources of more than one module of said plurality of modules are required; and third means for switching to selectively connect one or more modules of said plurality of modules to said second means, wherein at least two modules of said plurality of modules are connected to said second means to test the circuit board.

32. An apparatus, as claimed in claim 31, wherein:

said second means for coordinating forms a ring communication path between two or more modules of said plurality of modules.

33. An apparatus for concurrently testing a first circuit board according to a first test plan comprised of a first set of instructions and a second circuit board according to a second test plan comprised of a second set of instructions, the first and second circuit boards each having a topology and nodes, comprising:

a testhead for interfacing with the nodes of the first and second circuit boards, said testhead including a plurality of modules for use in testing the first and second circuit boards, each module of said plurality of modules including a defined quantity of resources that does not exceed a defined maximum quantity of resources, said defined quantity of resources including one or more first means for use in communicating with the nodes on the circuit board, a processor for executing at least one of the instructions of one of the first and second test plans to produce address information, and second means for communicating address information between said processor and at least one of said first means for use in communicating with the nodes, wherein the processor associated with one of said plurality of modules is substantially identical to at least one of the processors associated with another one of said plurality of modules and each module is capable of being used independently of any other module to test a circuit board;

first means, responsive to the topology of a circuit board and to said defined quantities of resources of said testhead, for generating a test plan, said first means including means for determining whether said defined quantities of resources of more than one module of said plurality of modules are required to test the circuit board;

second means, responsive to said first means, for coordinating the execution of a test plan to test a circuit board using more than one of said processors when said defined quantities of resources of more than one module of said plurality of modules are required; and third means for switching to selectively connect one or more modules of said plurality of modules to said second means, wherein at least two of said processors are connected to said second means to test the first circuit board and at least one processor is disconnected from said second means to test the second circuit board.

34. An apparatus, as claimed in claim 33, wherein:

said second means for coordinating forms a ring communication path between two or more modules of said plurality of modules.

35. An apparatus for concurrently testing a first circuit board according to a first test plan comprised of a first set of instructions and a second circuit board according to a second test plan comprised of a second set of instructions, the first and second circuit boards each having a topology and nodes, comprising:

a testhead for interfacing with the nodes of the first and second circuit boards, said testhead including a plurality of modules for use in testing the first and second circuit boards, each module of said plurality of modules including a defined quantity of resources that does not exceed a defined maximum quantity of resources, said defined quantity of resources including one or more first means for use in communicating with the nodes on the circuit board, a processor for executing at least one of the instructions of one of the first and second test plans to produce address information, and second means for communicating address information between said processor and at least one of said first means for use in communicating with the nodes, wherein the processor associated with one of said plurality of modules is substantially identical to at least one of the processors associated with another one of said plurality of modules and each module is capable of being used independently of any other module to test a circuit board;

first means, responsive to the topology of a circuit board and to said defined quantities of resources of said testhead, for generating a test plan, said first means including means for determining whether said defined quantities of resources of more than one module of said plurality of modules are required to test the circuit board;

second means, responsive to said first means, for coordinating the execution of a test plan to test a circuit board using more than one of said processors when said defined quantities of resources of more than one module of said plurality of modules are required; and third means for switching to selectively connect one or more modules of said plurality of modules to said second means, wherein each module of said plurality of modules is disconnected from said second means and a first module of said plurality of modules is used to test the first circuit board and a second module of said plurality of modules is used to test the second circuit board.

36. An apparatus for concurrently testing a first circuit board according to a first test plan comprised of a first set of instructions and a second circuit board according to a second test plan comprised of a second set of instructions, the first and second circuit boards each having a topology and nodes, comprising:

a testhead for interfacing with the nodes of the first and second circuit boards, said testhead including a plurality of modules for use in testing the first and second circuit boards, each module of said plurality of modules including a defined quantity of resources that does not exceed a defined maximum quantity of resources, said defined quantity of resources including one or more first means for use in communicating with the nodes on the circuit board, a processor for executing at least one of the instructions of one of the first and second test plans to produce address information, and second means for communicating address information between said processor and at least one of said first means for use in communicating with the nodes, wherein the processor associated with one of said plurality of modules is substantially identical to at least one of the processors associated with another one of said plurality of modules and each module is capable of being used independently of any other module to test a circuit board;

first means, responsive to the topology of a circuit board and to said defined quantities of resources of said testhead, for generating a test plan, said first means including means for determining whether said defined quantities of resources of more than one module of said plurality of modules are required to test the circuit board;

second means for coordinating the execution of the first test plan to test the first circuit board using more than one of said processors when said defined quantities of resources of more than one module of said plurality of modules are required for testing the first circuit board;

third means for coordinating the concurrent execution of the second test plan to test the second circuit board using more than one of said processors when said defined quantities of resources of more than one module of said plurality of modules are required for testing the circuit board; and fourth means for switching to selectively connect each module of said plurality of modules to one of said second means for coordinating and said third means for coordinating, wherein at least two modules of said plurality of modules are connected to said second means for coordinating to test the first circuit board and at least two other modules of said plurality of modules are connected to said third means for coordinating to test the second circuit board.

37. An apparatus, as claimed in claim 36, wherein:
said second means for coordinating and said third means for coordinating each form a loop communication path between two or more modules of said plurality of modules.

38. An apparatus for testing a circuit board, the circuit board having a topology and nodes, comprising:
a testhead for interfacing with the nodes of the circuit board, said testhead including a plurality of modules, each of said modules comprising:
defined quantities of resources for use in testing the circuit board,
an independent processor for use in executing a test plan,
a separate and independent power means,
a separate and independent cooling means, and
a separate and independent device-under-test DC power supply;
means for coordinating the execution of the test plan by at least two of said processors when the testing of the circuit board requires greater quantities of resources than are provided by one module of said plurality of modules, said means for coordinating including a loop communication path between at least two modules of said plurality of modules;
means for switching to selectively connect each module of said plurality of modules to said loop communication path;
a controller including means for generating the test plan, said means for generating includes means for determining whether said defined quantities of resources of more than one module of said plurality of modules is required to test the circuit board, said means for generating the test plan being responsive to the topology of the circuit board, said quantities of defined resources and a test library, wherein the topology defines the location of devices on the circuit board, the test library defines the timing relationships of the devices, and said quantities of defined resources includes physical and logical configurations of said testhead, said physical configuration defines the number and positional relationship of said plurality of modules and said logical relationship defines a subset of said plurality of modules that are dedicated to the execution of the test plan;
multiplexing means for independently communicating with each module of said plurality of modules wherein said multiplexing means transmits at least one of the following: the test plan to one of said plurality of modules and portions of the test plan to each module of said subset of said plurality of modules; and
means for monitoring the results of the execution of said test plan by at least one of said plurality of modules using said multiplexing means.

39. An apparatus for testing a circuit board, the circuit board having a topology and nodes, comprising:
a testhead for interfacing with the nodes of the circuit board, said testhead including a first module having a first vector processing unit and a second module having a second vector processing unit, said first and second vector processing units being used to conduct digital tests on the circuit board; and
means for coordinating the execution of a digital test among said first and second vector processing units, said means for coordinating including a first path between said first and second vector processing units for propagating a coordination signal, said first path having an unknown propagation delay, said means for coordinating further including a second path between said first and second vector processing units, said second path having a known propagation delay, said means for coordinating including means for determining a total time necessary for said coordination signal to propagate from said first vector processing unit to said second vector processing unit over said first path and return to said first vector processing unit from said second vector processing unit over said second path, means for adjusting the operation of said second vector processing unit using said known propagation delay and said total time such that said second vector processing unit is substantially synchronized with said first vector processing unit.

40. An apparatus for testing a circuit board according to a test plan comprised of one or more instructions, the circuit board having a topology and nodes, comprising:
a testhead for interfacing with the nodes of the circuit board, said testhead including a first module and a second module, each of said first and second modules including a defined quantity of resources that does not exceed a defined maximum quantity of resources, said defined quantity of resources including one or more first means for use in communicating with the nodes on the circuit board, a CPU for executing a portion of the test plan to produce address information, and second means for communicating address information between said CPU and at least one of said first means for use in communicating with the nodes, wherein the CpU associated with said first module is substantially identical to the CPU associated with said second module, said first module and said second module each being capable of being used independently of the other module to test a circuit board, and said CPU associated with said first module being used to execute a first portion of the test plan and the CPU associated with said second module being used to execute a second portion of the test plan; and means for coordinating the execution of said first and second test portions of the test by said CPUs, said means for coordinating including means for placing each CPU at a known point from which execution of said first and second test portions can be coordinated and means for preventing the CPU associated with said first module from executing said first test portion before the CPU associated with said second module begins executing said second test portion.

41. A method for testing a circuit board according to a first test plan comprised of one or more instructions, the circuit board having a topology and nodes, comprising:

providing a testhead for interfacing with the nodes of the circuit board, said testhead including a plurality of modules for use in testing the circuit board, each module of said plurality of modules including a defined quantity of resources that does not exceed a defined maximum quantity of resources, said defined quantity of resources including one or more first means for use in communicating with the nodes on the circuit board, a processor for executing at least one of the instructions of the first test plan to produce address information, and second means for communicating address information between said processor and at least one of said first means for use in communicating with the nodes, wherein the processor associated with one of said plurality of modules is substantially identical to at least one of the processors associated with another one of said plurality of modules and each module is capable of being used independently of any other module to test a circuit board; and coordinating the execution of the first test plan by at least two of said processors when said defined quantities of resources of more than one module of said plurality of modules are required for the testing of the circuit board.

42. A method, as claimed in claim 41, wherein:
said step of coordinating includes forming a ring communication path between two or more modules of said plurality of modules.

43. A method, as claimed in claim 41, wherein:
said step of coordinating includes forming a communication path wherein any one module of said plurality of modules communicates directly with at least one other module of said plurality of modules and at most two other modules of said plurality of modules.

44. A method, as claimed in claim 42, wherein:
said step of coordinating includes selectively connecting two or more modules of said plurality of modules to said communication path to test a first circuit board.

45. A method, as claimed in claim 42, wherein:
said step of coordinating includes selectively connecting at least two modules of said plurality of modules to said communication path to test a first circuit board and selectively disconnecting at least one module of said plurality of modules from said communication path to test a second circuit board.

46. A method, as claimed in claim 42, wherein:
said step of coordinating includes selectively disconnecting each module of said plurality of modules from said communication path, wherein at least one module of said plurality of modules is used to test a first circuit board.

47. A method, as claimed in claim 41, further comprising:
coordinating the execution of a second test plan by at least two of said processors when said defined quantities of resources of more than one module of said plurality of modules are required to test the circuit board, said first test plan being used to test a first circuit board and said second test plan being used to test a second circuit board.

48. A method, as claimed in claim 41, further comprising:
generating said test plan for the circuit board using the topology of the circuit board and said defined quantities of resources associated with said plurality of modules, said step of generating including determining whether said defined quantities of resources of more than one module of said plurality of modules is needed to test the circuit board.

49. A method, as claimed in claim 48, further comprising:
independently communicating a first portion of said first test plan to a first module of said plurality of modules and a second portion of said first test plan to a second module of said plurality of modules.

50. A method, as claimed in claim 48, further comprising:
communicating said test plan to one module of said plurality of modules.

51. A method, as claimed in claim 41, further including:
monitoring the results of the execution of the first test plan by at least one module of said plurality of modules.

52. A method, as claimed in claim 41, wherein:
said step of providing a testhead includes providing each module of said plurality of modules with a separate and independent power means.

53. A method for testing a circuit board, the circuit board having a topology and nodes, comprising:
providing a testhead for interfacing with the nodes of the circuit board, said testhead including a plurality of modules, each module of said plurality of modules including defined quantities of resources and a processor for use in testing the circuit board; and
coordinating the execution of a first test plan by at least two of said processors when said defined quantities of resources of more than one module of said plurality of modules are required for the testing of the circuit board;
wherein said step of providing a testhead includes providing each module of said plurality of modules with a separate and independent cooling means.

54. A method, as claimed in claim 41, wherein:
said step of providing a testhead includes providing each module of said plurality of modules with a separate and independent device-under-test DC power supply for use in testing the circuit board.

55. A method, as claimed in claim 41, wherein:
said step of coordinating includes determining and compensating for any propagation delay between one module of said plurality of modules and another module of said plurality of modules.

56. A method, as claimed in claim 41, wherein:
said step of coordinating includes preventing the execution of a first portion of said first test plan by said processor of a first module of said plurality of modules before the execution of a second portion of said first test plan by said processor of a second module of said plurality of modules.

57. A method for concurrently testing a first circuit board according to a first test plan comprised of a first set of instructions and a second circuit board according to a second test plan comprised of a second set of instructions, the first and second circuit boards each having a topology and nodes, comprising:
providing a testhead for interfacing with the nodes of the first and second circuit boards, said testhead including a plurality of modules for use in testing the first and second circuit boards, each module of said plurality of modules including a defined quantity of resources that does not exceed a defined maximum quantity of resources, said defined quantity of resources including one or more first means for use in communicating with the nodes on the circuit board, a processor for executing at least one of the instructions of one of the first and second test plans to produce address information, and second means for communicating address information between said processor and at least one of said first means for use in communicating with the nodes, wherein the processor and at least one of said first means for use in communicating with the nodes, wherein the processor associated with one of said plurality of modules is substantially identical to at least one of the processors associated with another one of said plurality of modules and each modules is capable of being used independently of any other module to test a circuit board;
coordinating the execution of the first test plan to test the first circuit board using more than one of said processors when said defined quantities of resources of more than one module of said plurality of modules are required for testing the first circuit board; and
coordinating the execution of the second test plan to test the second circuit board using more than one of said processors when said defined quantities of resources of more than one module of said plurality of modules are required for testing the second circuit board.

58. A method, as claimed in claim 57, wherein:
said step of coordinating the execution of a first test plan includes forming a loop communication path between two or more modules of said plurality of modules and said step of coordinating the execution of a second test plan includes forming a loop communication path between two or more modules of said plurality of modules.

59. A method for testing a circuit board according to a test plan comprised of one or more instructions, the circuit board having a topology and nodes, comprising:
providing a testhead for interfacing with the nodes of the first circuit boards, said testhead including a plurality of modules for use in testing the circuit board, each module of said plurality of modules including a defined quantity of resources that does not exceed a defined maximum quantity of resources, said defined quantity of resources including one or more first means for use in communicating with the nodes on the circuit board, a processor for executing at least one of the instructions of the test plan to produce address information, and second means for communicating address information between said processor and at least one of said first means for use in communicating with the nodes, wherein the processor associated with one of said plurality of modules is substantially identical to at least one of the processors associated with another one of said plurality of modules and each modules is capable of being used independently of any other module to test a circuit board;
providing means for coordinating the execution of the test plan by at least two of said processors when said defined quantities of resources of more than one module of said plurality of modules are required for the testing of the circuit board; and
selectively connecting at least two of said processors to said means for coordinating to test the first circuit board.

60. A method, as claimed in claim 59, wherein:
said step of providing means for coordinating includes forming a loop communication path between two or more modules of said plurality of modules.

61. A method for concurrently testing a first circuit board according to a first test plan comprised of a first set of instructions and a second circuit board according to a second test plan comprised of a second set of instructions, the first and second circuit boards each having a topology and nodes, comprising:
providing a testhead for interfacing with the nodes of the first and second circuit boards, said testhead including a plurality of modules for use in testing the first and second circuit boards, each module of said plurality of modules including a defined quantity of resources that does not exceed a defined maximum quantity of resources, said defined quantity of resources including one or more first means for use in communicating with the nodes on the circuit board, a processor for executing at least one of the instructions of one of the first and second test plans to produce address information, and second means for communicating address information between said processor and at least one of said first means for use in communicating with the nodes, wherein the processor and at least one of said first means for use in communicating with the nodes, wherein the processor associated with one of said plurality of modules is substantially identical to at least one of the processors associated with another one of said plurality of modules and each modules is capable of being used independently of any other module to test a circuit board;
providing means for coordinating the execution of the first test plan to test the first circuit board using more than one of said processors when said defined quantities of resources of more than one module of said plurality of modules are required for testing the first circuit board; and
selectively connecting at least two of said processors to said means for coordinating to test the first circuit board and selectively disconnecting at least one of said processors from said means for coordinating to test the second circuit board.

62. A method, as claimed in claim 61 wherein:

said step of providing means for coordinating including forming a loop communication path between two or more modules of said plurality of modules.

63. A method for concurrently testing a first circuit board according to a first test plan comprised of a first set of instructions and a second circuit board according to a second test plan comprised of a second set of instructions, the first and second circuit boards each having a topology and nodes, comprising:
providing a testhead for interfacing with the nodes of the first and second circuit boards, said testhead including a plurality of modules for use in testing the first and second circuit boards, each module of said plurality of modules including a defined quantity of resources that does not exceed a defined maximum quantity of resources, said defined quantity of resources including one or more first means for use in communicating with the nodes on the circuit board, a processor for executing at least one of the instructions of one of the first and second test plans to produce address information, and second means for communicating address information between said processor and at least one of said first means for use in communicating with the nodes, wherein the processor associated with one of said plurality of modules is substantially identical to at least one of the processors associated with another one of said plurality of modules and each modules is capable of being used independently of any other module to test a circuit board;
providing means for coordinating the execution of a test plan to test a circuit board using more than one of said processors when said defined quantities of resources of more than one module of said plurality of modules are required for testing the circuit board; and
selectively disconnecting each module of said plurality of modules from said means for coordinating and using a first module of said plurality of modules to test the first circuit board and a second module of said plurality of modules to test the second circuit board.

64. A method for concurrently testing a first circuit board according to a first test plan comprised of a first set of instructions and a second circuit board according to a second test plan comprised of a second set of instructions, the first and second circuit boards each having a topology and nodes, comprising:
providing a testhead for interfacing with the nodes of the first and second circuit boards, said testhead including a plurality of modules for use in testing the first and second circuit boards, each module of said plurality of modules including a defined quantity of resources that does not exceed a defined maximum quantity of resources, said defined quantity of resources including one or more first means for use in communicating with the nodes on the circuit board, a processor for executing at least one of the instructions of one of the first and second test plans to produce address information, and second means for communicating address information between said processor and at least one of said first means for use in communicating with the nodes, wherein the processor associated with one of said plurality of modules is substantially identical to at least one of the processors associated with another one of said plurality of modules and each modules is capable of being used independently of any other module to test a circuit board;
providing means for coordinating the execution of the first test plan to test a circuit board using more than one of said processors when said defined quantities of resources of more than one module of said plurality of modules are required for testing the first circuit board;
providing means for coordinating the execution of the the second test plan to test the second circuit board using more than one of said processors when said defined quantities of resources of more than one module of said plurality of modules are required for testing the circuit board, and
selectively connecting at least two modules of said plurality of modules to said first means for coordinating to test the first circuit board and selectively connecting at least two modules of said plurality of modules to said second means for coordinating to test the second circuit board.

65. A method, as claimed in claim 64, wherein:
said step of providing means for coordinating includes forming a first loop communication path between two or more module of said plurality of modules and forming a second loop communication path between two or more other modules of said plurality of modules.

66. A method for testing a circuit board according to a test plan comprised of one or more instructions, the circuit board having a topology and nodes, comprising:
providing a testhead for interfacing with the nodes of the circuit board, said testhead including a plurality of modules for use in testing the circuit board, each module of said plurality of modules including a defined quantity of resources that does not exceed a defined maximum quantity of resources, said defined quantity of resources including one or more first means for use in communicating with the nodes on the circuit board, a processor for executing at least one of the instructions of one of the test plan to produce address information, and second means for communicating address information between said processor and at least one of said first means for use in communicating with the nodes, wherein the processor associated with one of said plurality of modules is substantially identical to at least one of the processors associated with another one of said plurality of modules and each modules is capable of being used independently of any other module to test a circuit board;
generating the test plan using the topology of the circuit board and said defined quantities of resources of said testhead, said step of generating including determining whether said defined quantities of resources of more than one module of said plurality of modules is needed to test the circuit board; and
coordinating the execution of said test plan by at least two of said processors when said defined quantities of resources of more than one module of said plurality of modules are required for the testing of the circuit board.

67. A method for testing a circuit board according to a test plan comprised of one or more instructions, the circuit board having a topology and nodes, comprising:
providing a testhead for interfacing with the nodes of the circuit board, said testhead including a plurality of modules for use in testing the circuit board, each module of said plurality of modules including a defined quantity of resources that does not exceed a defined maximum quantity of resources, said defined quantity of resources including one or more first means for use in communicating with the nodes on the circuit board, a processor for executing at least one of the instructions of one of the test plan to produce address information, and second means for communicating address information between said processor and at least one of said first means for use in communicating with the nodes, wherein the processor associated with one of said plurality of modules is substantially identical to at least one of the processors associated with another one of said plurality of modules and each modules is capable of being used independently of any other module to test a circuit board;

generating the test plan using the topology of the circuit board and said defined quantities of resources of said testhead, said step of generating including determining whether said defined quantities of resources of more than one module of said plurality of modules are required to test the circuit board; and providing means for coordinating the execution of the test plan to test the circuit board using more than one of said processors when said defined quantities of resources of more than one module of said plurality of modules are required; and selectively connecting at least two modules of said plurality of modules to said means for coordinating to test the circuit board.

68. A method, as claimed in claim 67, wherein:
said step of providing means for coordinating includes forming a ring communication path between two or more modules of said plurality of modules.

69. A method for concurrently testing a first circuit board according to a first test plan comprised of a first set of instructions and a second circuit board according to a second test plan comprised of a second set of instructions, the first and second circuit boards each having a topology and nodes, comprising:

providing a testhead for interfacing with the nodes of the first and second circuit boards, said testhead including a plurality of modules for use in testing the first and second circuit boards, each module of said plurality of modules including a defined quantity of resources that does not exceed a defined maximum quantity of resources, said defined quantity of resources including one or more first means for use in communicating with the nodes on the circuit board, a processor for executing at least one of the instructions of one of the first and second test plans to produce address information, and second means for communicating address information between said processor and at least one of said first means for use in communicating with the nodes, wherein the processor associated with one of said plurality of modules is substantially identical to at least one of the processors associated with another one of said plurality of modules and each modules is capable of being used independently of any other module to test a circuit board;

generating the test plan using the topology of a circuit board and said defined quantities of resources of said testhead, said step of generating including determining whether said defined quantities of resources of more than one module of said plurality of modules are required to test the circuit board; and providing means for coordinating the execution of a test plan to test a circuit board using more than one of said processors when said defined quantities of resources of more than one module of said plurality of modules are required; and selectively connecting at least two modules of said processors to said means for coordinating to test the first circuit board and selectively disconnecting at least one processor from said means for coordinating to test the second board.

70. A method, as claimed in claim 69, wherein:
said step of providing means for coordinating includes forming a ring communication path between two or more modules of said plurality of modules.

71. A method for concurrently testing a first circuit board according to a first test plan comprised of a first set of instructions and a second circuit board according to a second test plan comprised of a second set of instructions, the first and second circuit boards each having a topology and nodes, comprising:

providing a testhead for interfacing with the nodes of the first and second circuit boards, said testhead including a plurality of modules for use in testing the first and second circuit boards, each module of said plurality of modules including a defined quantity of resources that does not exceed a defined maximum quantity of resources, said defined quantity of resources including one or more first means for use in communicating with the nodes on the circuit board, a processor for executing at least one of the instructions of one of the first and second test plans to produce address information, and second means for communicating address information between said processor and at least one of said first means for use in communicating with the nodes, wherein the processor associated with one of said plurality of modules is substantially identical to at least one of the processors associated with another one of said plurality of modules and each modules is capable of being used independently of any other module to test a circuit board;

generating the test plan using the topology of a circuit board and said defined quantities of resources of said testhead, said step of generating a test plan including determining whether said defined quantities of resources of more than one module of said plurality of modules are required to test the circuit board;

providing means for coordinating the execution of a test plan to test a circuit board using more than one of said processors when said defined quantities of resources of more than one module of said plurality of modules are required; and selectively disconnecting each module of said plurality of modules from said means for coordinating, wherein a first module of plurality of modules is used to test the first circuit board and a second module of said plurality of modules is used to test the second circuit board.

72. A method for concurrently testing a first circuit board according to a first test plan comprised of a first set of instructions and a second circuit board according to a second test plan comprised of a second set of instructions, the first and second circuit boards each having a topology and nodes, comprising:

providing a testhead for interfacing with the nodes of the first and second circuit boards, said testhead including a plurality of modules for use in testing the first and second circuit boards, each module of said plurality of modules including a defined quantity of resources that does not exceed a defined maximum quantity of resources, said defined quantity of resources including one or more first means for use in communicating with the nodes on the circuit board, a processor for executing at least one of the instructions of one of the first and second test plans to produce address information, and second means for communicating address information between said processor and at least one of said first means for use in communicating with the nodes, wherein the processor associated with one of said plurality of modules is substantially identical to at least one of the processors associated with another one of said plurality of modules and each modules is capable of being used independently of any other module to test a circuit board;

generating a test plan using the topology of a circuit board and said defined quantities of resources of said testhead, said step of generating a test plan including determining whether said defined quantities of resources of more than one module of said plurality of modules are required to test the circuit board;

providing first means for coordinating the execution of the first test plan to test the first circuit board using more than one of said processors when said defined quantities of resources of more than one module of said plurality of modules are required for testing the first circuit board;

providing second means for coordinating the execution of the second test plan to test the second circuit board using more than one of said processors when said defined quantities of resources of more than one module of said plurality of modules are required for testing the circuit board; and selectively connecting at least two modules of said plurality of modules to said first means for coordinating to test the first circuit board and selectively connecting at least two modules of said plurality of modules to said second means for coordinating to test the second circuit board.

73. A method, as claimed in claim 72, wherein:
said step of providing means for coordinating a first test plan includes forming a loop communication path between two or more modules of said plurality of modules and said step of providing second means for coordinating a second test plan including forming a loop communication path between two or more modules of said plurality of modules.

74. A method for testing a circuit board, the circuit board having a topology and nodes, comprising:
providing a testhead for interfacing with the nodes of the circuit board, said testhead including a plurality of modules, each of said modules comprising:
defined quantities of resources for use in testing the circuit board,
an independent processor for use in executing a test plan,
a separate and independent power means,
a separate and independent cooling means, and
a separate and independent device-under-test DC power supply;

coordinating the execution of the test plan by at least two of said processors when the testing of the circuit board requires greater quantities of resources than are provided by one module of said plurality of modules, said step of coordinating including forming a loop communication path between at least two modules of said plurality of modules;

selectively connecting at least two modules of said plurality of modules to said loop communication path;

generating a test plan, said step of generating a test plane includes determining whether said defined quantities of resources of more than one module of said plurality of modules is required to test the circuit board, said means for generating the test plan being responsive to the topology of the circuit board, said quantities of defined resources and a test library, wherein the topology defines the location of devices on the circuit board, the test library defines the timing relationships of the devices, and said quantities of defined resources includes physical and logical configurations of said testhead, said physical configuration defines the number and positional relationship of said plurality of modules and said logical relationship defines a subset of said plurality of modules that are dedicated to the execution of the test plan;

independently communicating one of the following: said test plan to one of said plurality of modules and portions of said test plan to each module of said subset of said plurality of modules; and monitoring the results of the execution of said test plan by at least one of said plurality of modules.

75. A method for testing a circuit board, the circuit board having a topology and nodes, comprising:
providing a testhead for interfacing with the nodes of the circuit board, said testhead including a first module having a first vector processing unit and a second module having a second vector processing units being used to conduct digital tests on the circuit board; and coordinating the execution of a digital test among said first and second vector processing units, said step of coordinating including propagating a coordination signal over a first path between said first and second vector processing units, said first path having an unknown propagation delay, and over a second path between said first and second vector processing units, said second path having a known propagation delay, said step of coordinating further including determining a total time necessary for said coordination signal to propagate from said first vector processing unit to said second vector processing unit over said first path and return to said first vector processing unit from said second vector processing unit over said second path, said step of coordinating further including adjusting the operation of said second vector processing unit using said known propagation delay and said total time such that said second vector processing unit is substantially synchronized with said first vector processing unit.

76. A method for testing a circuit board according to a test plan comprised of one or more instructions, the circuit board having a topology and nodes, comprising:
providing a testhead for interfacing with the nodes of the circuit board, said testhead including a first module and a second module, each of said first and second modules including a defined quantity of resources that does not exceed a defined maximum quantity of resources, said defined quantity of resources including one or more first means for use in communicating with the nodes on the circuit board, a CPU for executing a portion of the test plan to produce address information, and second means for communicating address information between said CPU and at least one of said first means for use in communicating with the nodes, wherein the CPU associated with said first module is substantially identical to at CPU associated with said second module, said first module and said second module each being capable of being used independently of the other module to test a circuit board, and said CPU associated with said first module being used to execute a first portion of the test plan and the CPU associated with said second module being used to execute a second portion of the test plan; and coordinating the execution of said first and second test portions of the test by said CPUs, said step of coordinating including placing each CPU at a known point from which execution of said first and second test portions can be coordinated and preventing the CPU associated with said first module from executing said first test portion before the CpU associated with said second module begins executing said second test portion.

* * * * *